(12) United States Patent
Josell et al.

(10) Patent No.: US 10,889,908 B2
(45) Date of Patent: Jan. 12, 2021

(54) SUPERCONFORMAL FILLING COMPOSITION AND SUPERCONFORMALLY FILLING A RECESSED FEATURE OF AN ARTICLE

(71) Applicant: Government of the United States of America, as Represented by the Secretary of Commerce, Gaithersburg, MD (US)

(72) Inventors: Daniel Josell, N. Potomac, MD (US); Thomas P. Moffat, Gaithersburg, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 154 days.

(21) Appl. No.: 16/043,358

(22) Filed: Jul. 24, 2018

(65) Prior Publication Data
US 2019/0093248 A1      Mar. 28, 2019

Related U.S. Application Data

(63) Continuation-in-part of application No. 15/489,089, filed on Apr. 17, 2017, which is a continuation-in-part
(Continued)

(51) Int. Cl.
*C25D 3/48*     (2006.01)
*C25D 5/10*     (2006.01)
(Continued)

(52) U.S. Cl.
CPC ............... *C25D 3/48* (2013.01); *C25D 3/562* (2013.01); *C25D 3/62* (2013.01); *C25D 5/02* (2013.01);
(Continued)

(58) Field of Classification Search
CPC ........... C25D 3/48; C25D 3/362; C25D 3/62; C25D 7/00; C25D 7/123; C25D 5/02;
(Continued)

(56) References Cited

U.S. PATENT DOCUMENTS

2004/0065225 A1* 4/2004 Ruebel ..................... C25D 3/62
106/1.18
2005/0092616 A1* 5/2005 Hu ............................ C25D 3/02
205/266

* cited by examiner

*Primary Examiner* — Louis J Rufo
(74) *Attorney, Agent, or Firm* — Office of Chief Counsel for National Institute of Standards and Technology

(57) ABSTRACT

Superconformally filling a recessed feature includes: contacting the recessed feature with superconformal filling composition that includes: $Au(SO_3)_2^{3-}$ anions; $SO_3^{2-}$ anions; and $Bi^{3+}$ cations; convectively transporting $Au(SO_3)_2^{3-}$ and $Bi^{3+}$ to the bottom member of the recessed feature; subjecting the recessed feature to an electrical current to superconformally deposit gold from the $Au(SO_3)_2^{3-}$ on the bottom member relative to the sidewall and the field, the electrical current providing a cathodic voltage; and increasing the electrical current subjected to the field and the recessed feature to maintain the cathodic voltage between −0.85 V and −1.00 V relative to the SSE during superconformally depositing gold on the substrate to superconformally fill the recessed feature of the article with gold as a superconformal filling of gold, the superconformal filling being void-free and seam-free.

27 Claims, 56 Drawing Sheets

Related U.S. Application Data of application No. 15/146,888, filed on May 4, 2016, which is a continuation-in-part of application No. 14/012,830, filed on Aug. 28, 2013, now Pat. No. 9,580,828, said application No. 15/489,089 is a continuation-in-part of application No. 14/812,134, filed on Jul. 29, 2015.

(60) Provisional application No. 62/165,360, filed on May 22, 2015, provisional application No. 61/701,818, filed on Sep. 17, 2012, provisional application No. 62/194,320, filed on Jul. 20, 2015.

(51) Int. Cl.
*H01M 4/88* (2006.01)
*C25D 5/04* (2006.01)
*C25D 5/18* (2006.01)
*C25D 7/12* (2006.01)
*C25D 5/02* (2006.01)
*C25D 3/62* (2006.01)
*C25D 3/56* (2006.01)
*C25D 7/00* (2006.01)
*H01L 21/288* (2006.01)
*H01L 21/768* (2006.01)

(52) U.S. Cl.
CPC ............... *C25D 5/04* (2013.01); *C25D 5/10* (2013.01); *C25D 5/18* (2013.01); *C25D 7/00* (2013.01); *C25D 7/123* (2013.01); *H01L 21/2885* (2013.01); *H01L 21/76879* (2013.01); *H01L 21/76898* (2013.01); *H01M 4/8853* (2013.01)

(58) Field of Classification Search
CPC .... C25D 5/18; C25D 5/04; C25D 5/10; H01L 21/76898; H01L 21/76879; H01L 21/2885; H01M 4/8853
See application file for complete search history.

Filling ratio = $\frac{B}{S}$    Step coverage = $\frac{S}{F}$    Bottom coverage = $\frac{B}{F}$ (A)

(B)

SUPERCONFORMAL FILLING COMPOSITION AND SUPERCONFORMALLY FILLING A RECESSED FEATURE OF AN ARTICLE

CROSS REFERENCE TO RELATED APPLICATIONS

The application is a continuation in part of U.S. patent application Ser. No. 15/489,089, filed Apr. 17, 2017, which is a continuation in part of U.S. patent application Ser. No. 15/146,888, filed May 4, 2016, the disclosure of each of which is incorporated herein by reference in its entirety. U.S. patent application Ser. No. 15/146,888 claims priority to U.S. Provisional Patent Application No. 62/165,360, filed May 22, 2015, and is a continuation in part of U.S. patent application Ser. No. 14/012,830, filed Aug. 28, 2013, which claims priority to U.S. Provisional Patent Application No. 61/701,818, filed Feb. 28, 2017, the disclosure of each of which is incorporated herein by reference in its entirety. U.S. patent application Ser. No. 15/489,089 also is a continuation in part of U.S. patent application Ser. No. 14/812,134, filed Jul. 29, 2015, which claims priority to U.S. Provisional Patent Application No. 62/194,320, filed Jul. 20, 2015, the disclosure of each of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov; reference Ser. No. 16/043,358.

BRIEF DESCRIPTION

Disclosed is a process for superconformally filling a recessed feature of an article with gold, the process comprising: providing the article comprising: a substrate; a field disposed on the substrate; the recessed feature disposed on the substrate and surrounded by the field, the recessed feature comprising: a bottom member; a sidewall that separates the bottom member from the field, the recessed feature having an aspect ratio of a depth to a width from 0.5 to 100 before superconformally filling the recessed feature, the aspect ratio increasing during superconformally filling the recessed feature; and an overlayer disposed on the article such that the field and the recessed feature are fully metallized for contact with a superconformal filling composition; contacting the field and the recessed feature with the superconformal filling composition in an absence of cyanide and lead, the superconformal filling composition having a near-neutral pH and comprising: a plurality of $Au(SO_3)_2^{3-}$ anions as a source of gold for superconformally depositing gold in the recessed feature; a plurality of $SO_3^{2-}$ anions; and a plurality of $Bi^{3+}$ cations as a brightener and an accelerator for superconformally depositing gold in the recessed feature; convectively transporting the $Au(SO_3)_2^{3-}$ anions and the $Bi^{3+}$ cations to the bottom member by actively moving the substrate relative to the superconformal filling composition; subjecting the field and the recessed feature to an electrical current to superconformally deposit gold from the $Au(SO_3)_2^{3-}$ anions on the bottom member relative to the sidewall and the field, the electrical current providing a cathodic voltage ($V_{SSE}$) between −0.85 V and −1.00 V relative to a saturated sulfate electrode (SSE), and a first deposition ratio of a first deposition rate of gold on the bottom member relative to a second deposition rate of gold on the sidewall being from 1.5 to $10^6$; and increasing the electrical current subjected to the field and the recessed feature to maintain the $V_{SSE}$ between −0.85 V and −1.00 V relative to the SSE during superconformally depositing gold on the substrate to superconformally fill the recessed feature of the article with gold as a superconformal filling comprising gold, the superconformal filling being void-free and seam-free, such that in a presence of the superconformal filling composition: passivation of the field and the recessed feature occurs at the $V_{SSE}$ greater than −0.85 V relative to the SSE, sub-conformal deposition of gold occurs at the $V_{SSE}$ less than −1 V relative to the SSE, and superconformal deposition of gold occurs at the $V_{SSE}$ between −0.85 V and −1.00 V relative to the SSE.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
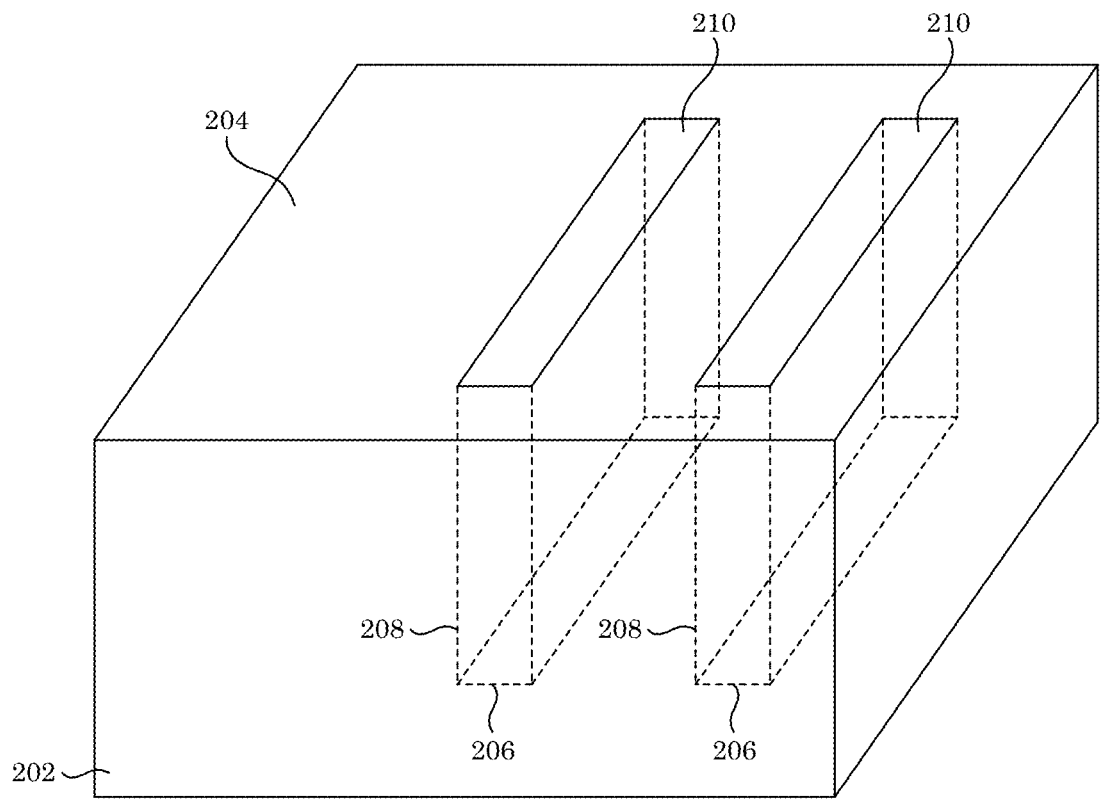
FIG. 1 shows a perspective view of an article that includes a superconformal filling.
Figure 2:
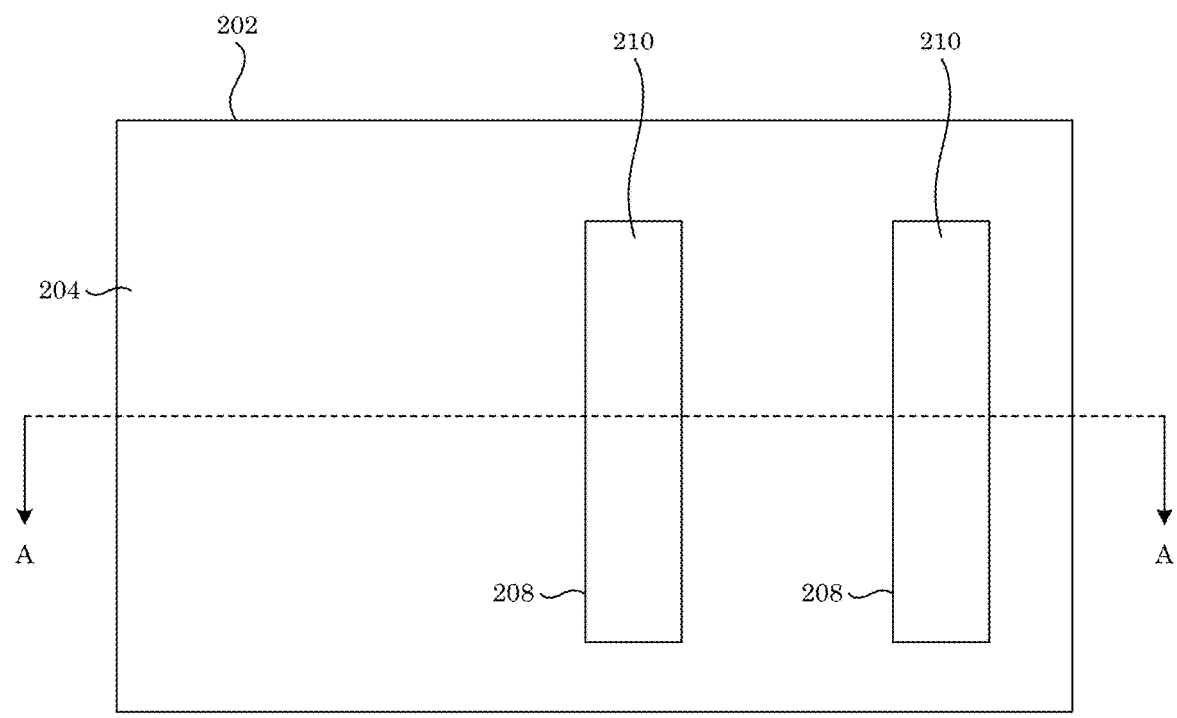
FIG. 2 shows a plan view a top view of the article shown in FIG. 1.
Figure 3:
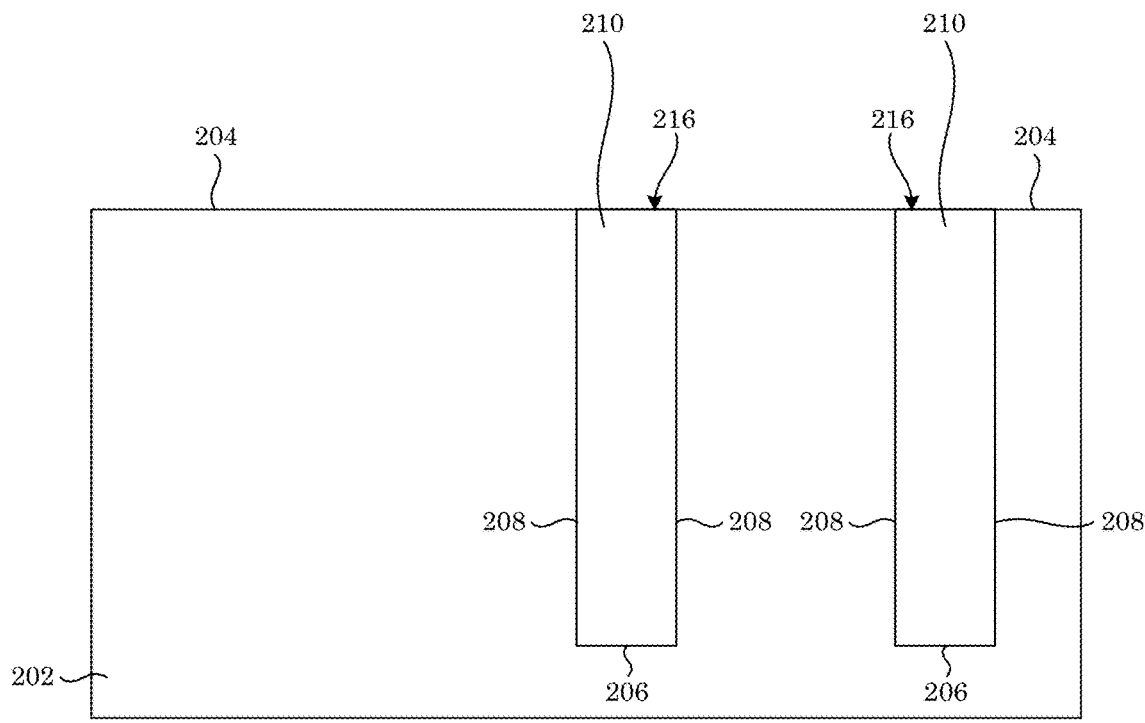
FIG. 3 shows a cross-section along line A-A of the article shown in FIG. 1.
Figure 4:
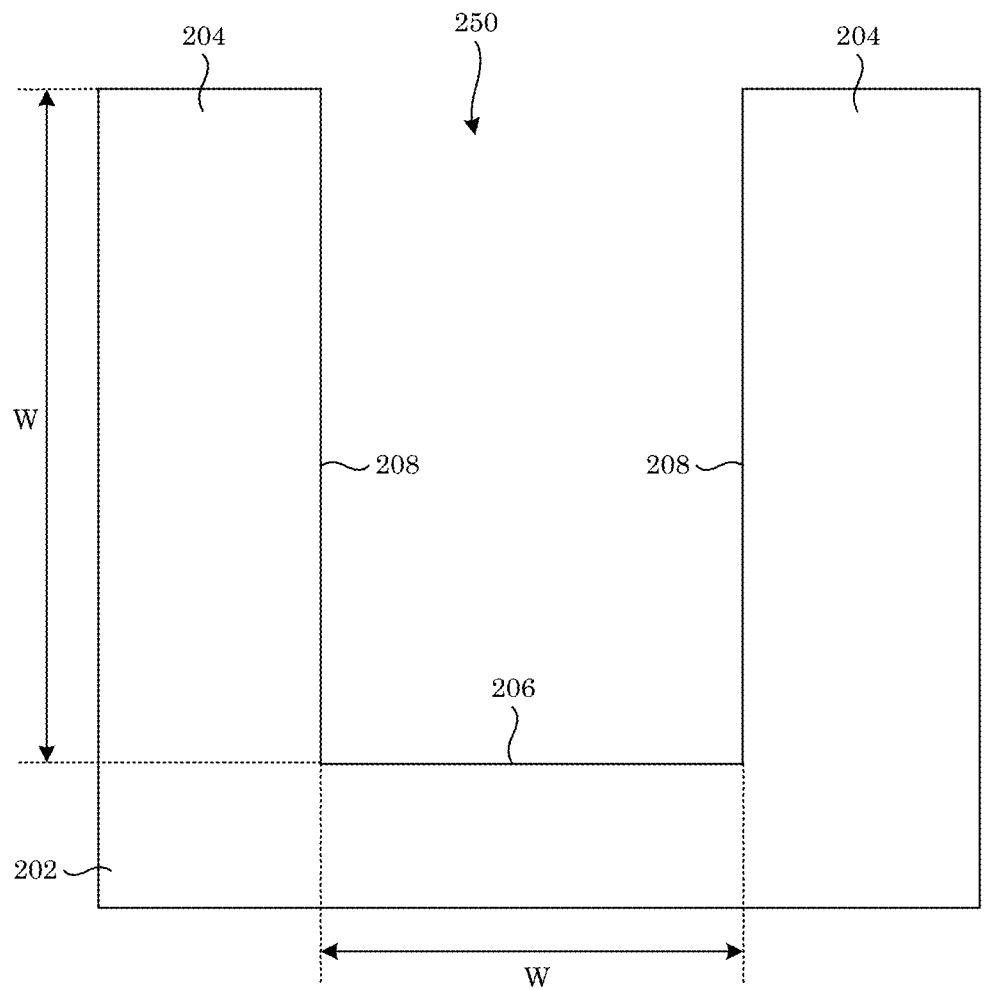
FIG. 4 shows a cross-section view of a substrate that includes a field and a recessed feature.
Figure 5:
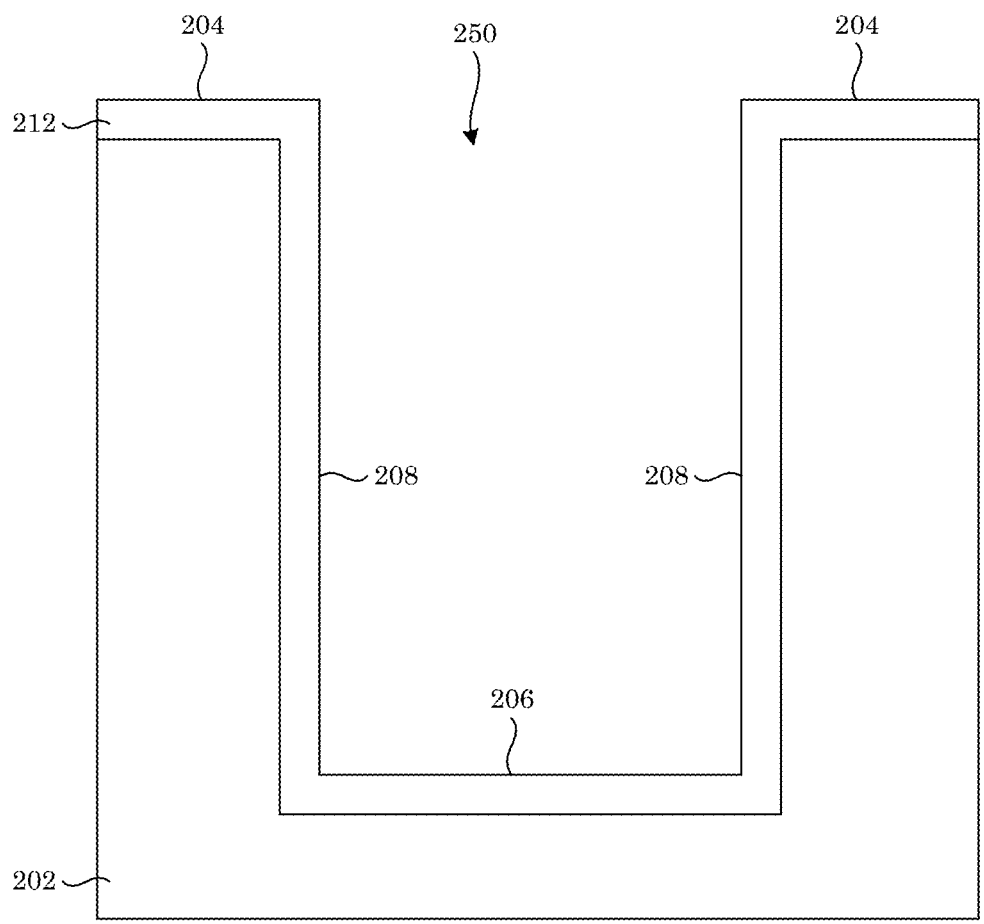
FIG. 5 shows an overlayer disposed on the substrate shown in FIG. 4.
Figure 6:
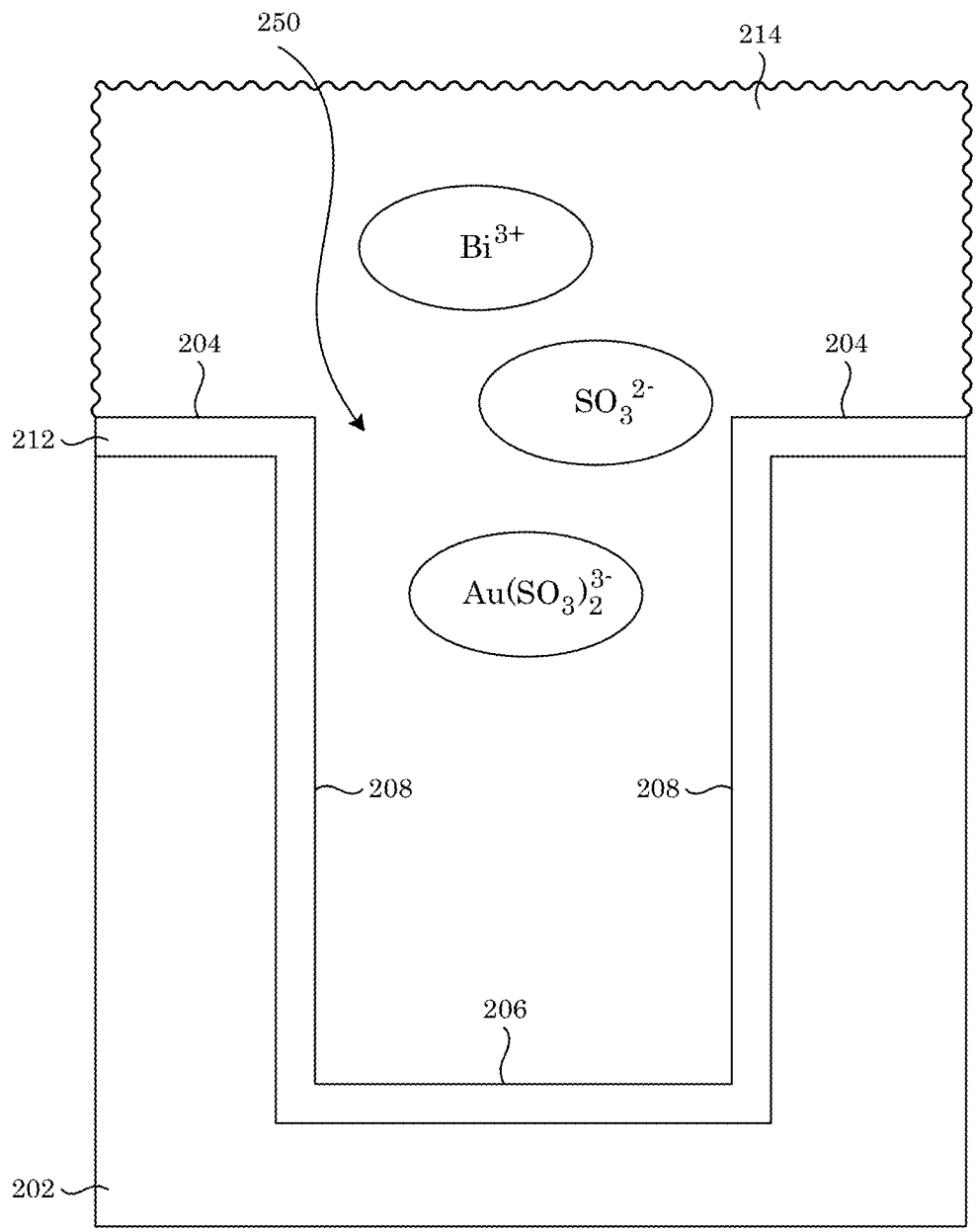
FIG. 6 shows a superconformal filling composition in contact with the overlayer shown in FIG. 5.

A detailed description of one or more embodiments is presented herein by way of exemplification and not limitation.

It has been discovered that a process for superconformally filling a recessed feature of an article with gold unexpectedly fills trenches and vias with a gold superconformal filling from a superconformal filling composition. Beneficially, the superconformal filling can be an interconnect in microelectronics. In an aspect, the process fills the recessed feature from a bottom with the superconformal filling that is seam-free and void-free. Gold is deposited almost exclusively within the recessed feature such that little deposition occurs on the field relative to the bottom to minimize waste and reduce time spent on postdeposition processing. Surprisingly, the superconformal filling composition is an electrolyte that forms the superconformal filling in an absence of a lead additive or a polymer additive and is non-cyanide and nearly neutral. Superconformal deposition of gold can be performed at room temperature.

In an embodiment, with reference to FIG. 1, FIG. 2, FIG. 3, and FIG. 7, article 200 includes substrate 200 substrate 202; field 204 disposed on substrate 202; recessed feature 250 disposed on substrate 202 and surrounded by field 204; and overlayer 212 disposed on article 200 such that field 204 and recessed feature 250 are fully metallized for contact with superconformal filling composition 214. Recessed feature 250 includes bottom member 206 and sidewall 208 that separates bottom member 206 from field 204. Superconformal filling 210 has exposed surface 216 disposed distal to bottom member 206.

In an embodiment, with reference to FIG. 4, FIG. 5, FIG. 6, FIG. 7, FIG. 8, and FIG. 9, a process for superconformally filling recessed feature 250 of article 200 with gold includes: contacting field 204 and recessed feature 250 with superconformal filling composition 214 in an absence of cyanide, lead, thallium, or a combination thereof; convectively transporting $Au(SO_3)_2^{3-}$ anions and $Bi^{3+}$ cations from superconformal filling composition 214 to bottom member 260 by actively moving substrate 202 relative to superconformal filling composition 214; subjecting field 204 and recessed feature 250 to an electrical current to superconformally deposit gold from the $Au(SO_3)_2^{3-}$ anions on bottom member 206 relative to sidewall 208 and field 204, the electrical current providing a cathodic voltage ($V_{SSE}$) between −0.85 V and −1.00 V relative to a saturated sulfate electrode (SSE), and a first deposition ratio of a first deposition rate of gold on bottom member 206 relative to a second deposition rate of gold on sidewall 208 being from 1.5 to 106; and increasing the electrical current subjected to field 204 and recessed feature 250 to maintain the $V_{SSE}$ between −0.85 V and −1.00 V relative to the SSE during superconformally depositing gold on substrate 202 to superconformally fill recessed feature 250 of article 200 with gold as superconformal filling 210 including gold. Superconformal filling 210 is void-free and seam-free. It is contemplated that, in a presence of superconformal filling composition 250: passivation of field 204 and recessed feature 250 occurs at the $V_{SSE}$ greater than −0.85 V relative to the SSE, sub-conformal deposition of gold occurs at the $V_{SSE}$ less than −1 V relative to the SSE, and superconformal deposition of gold occurs at the $V_{SSE}$ between −0.85 V and −1.00 V relative to the SSE. It should be appreciated that, according to the process thus far, that superconformal deposition of gold occurs since the $V_{SSE}$ is maintained between −0.85 V and −1.00 V relative to the SSE. The electrical current can be provided in a continuous ramp that is linear (e.g., solid curve in panel A of FIG. 8) or nonlinear, provided in a plurality of steps (e.g., dashed curve in panel A of FIG. 8), or a combination thereof. Without wishing to be bound by theory, it is believed that although electrical current increases from $I_{Low}$ to $I_{High}$, voltage is maintained from first voltage V1 to second voltage V2 because time-dependent adsorption or electrochemical transformation of adsorbed bismuth-containing compounds (e.g., oxo-complexes, sulfite complexes, hydroxide complexes) accelerate Au deposition.

The process also can include disposing overlayer 212 on article 200 such that field 204 and recessed feature 250 are fully metallized for contact with superconformal filling composition 214. Disposing overlayer 212 on article 200 can include evaporation, sputter deposition, chemical vapor deposition, or atomic layer deposition. In an embodiment, disposing overlayer 212 includes sputter deposition of a layer of titanium followed by a layer of gold.

In the process, contacting field 204 and recessed feature 250 with superconformal filling composition 214 can include transferring a wafer patterned with recessed features into the superconformal filling composition.

In the process, convectively transporting $Au(SO_3)_2^{3-}$ anions and $Bi^{3+}$ cations from superconformal filling composition 214 to bottom member 260 includes actively moving substrate 202 relative to superconformal filling composition 214. Actively moving substrate 202 relative to superconformal filling composition 214 can include displacing superconformal filling composition 214 across bottom member 206, exposed surface 216, sidewall 208, or field 204. Displacing can include rotating substrate 202, bubbling a gas (e.g., argon, nitrogen, carbon dioxide, and the like) through superconformal filling composition 214, stirring superconformal filling composition 214, heating superconformal filling composition 214 or substrate 202, recirculating superconformal filling composition 214, and the like. In an embodiment, actively moving includes rotating the patterned wafer using equipment for rotating disk electrodes to which the patterned wafer is attached and suspended within the superconformal filling composition. In an embodiment, actively moving substrate 202 relative to the superconformal filling composition includes rotating substrate 202 at a rotation rate from 0 revolutions per minute (rpm) to 2000 rpm, specifically at rotation rates from 100 rpm to 1600 rpm. The rotation rate can be variable or fixed.

The process can include changing a rate of superconformal deposition of gold or changing from superconformally depositing gold to conformally or sub-conformally depositing gold. Here, it is contemplated that the process includes changing the rotation rate from a first rotation rate to a second rotation rate during superconformally depositing gold. The first rate can be, e.g., from 1200 rpm to 3000 rpm, specifically 1600 rpm, and the second rate can be from 400 rpm to 100 rpm, specifically 100 rpm.

In the process, subjecting field 204 and recessed feature 250 to an electrical current can include attaching the specimen a Pt holder that is rotating with a contact to a potentiostat that applies current (or potential).

Figure 7:
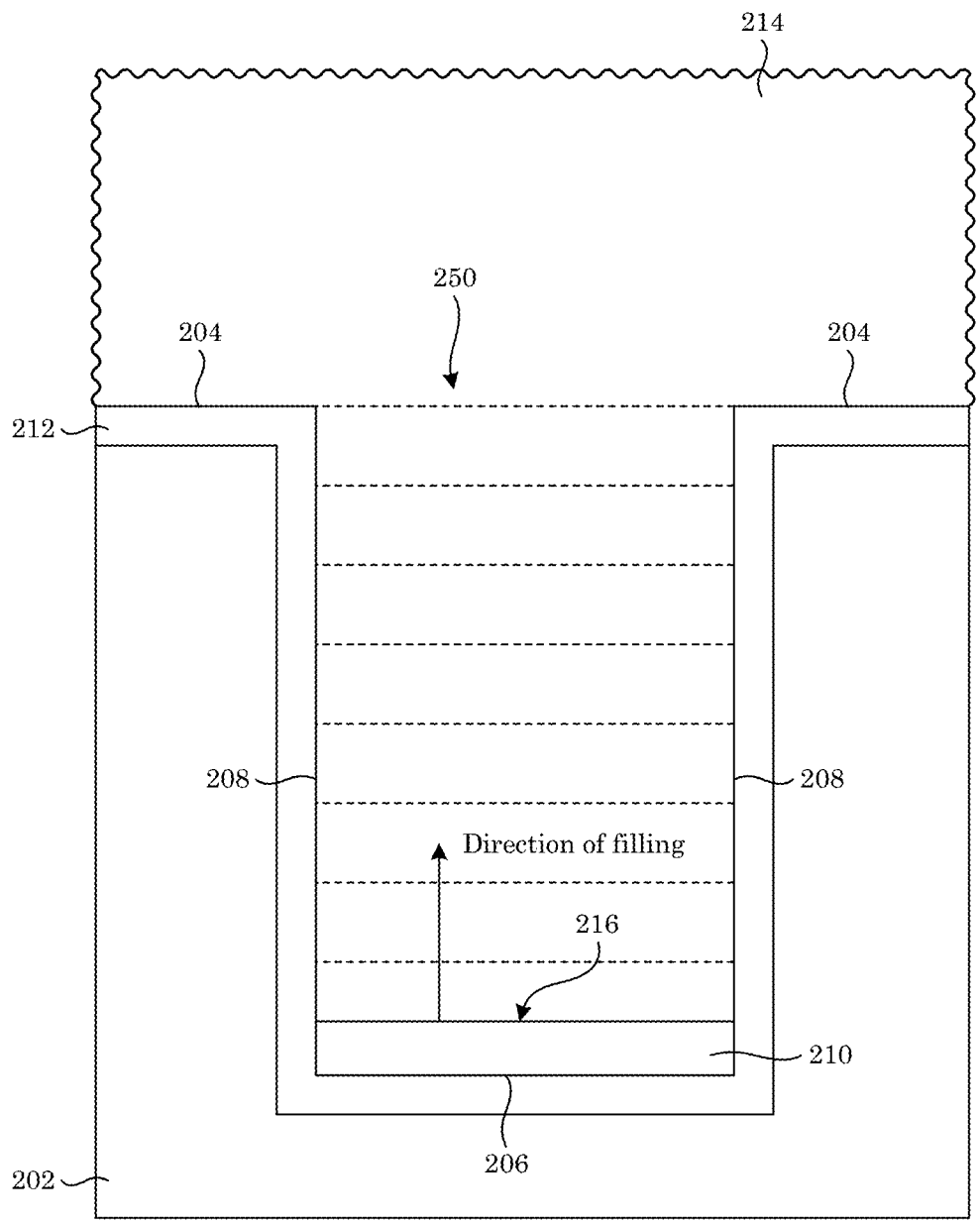
FIG. 7 shows growth of a superconformal filling in the recessed feature of the substrate shown in FIG. 5 from the superconformal filling composition to make an article, wherein the aspect ratio decreases during superconformally filling the recessed feature.
Figure 8:
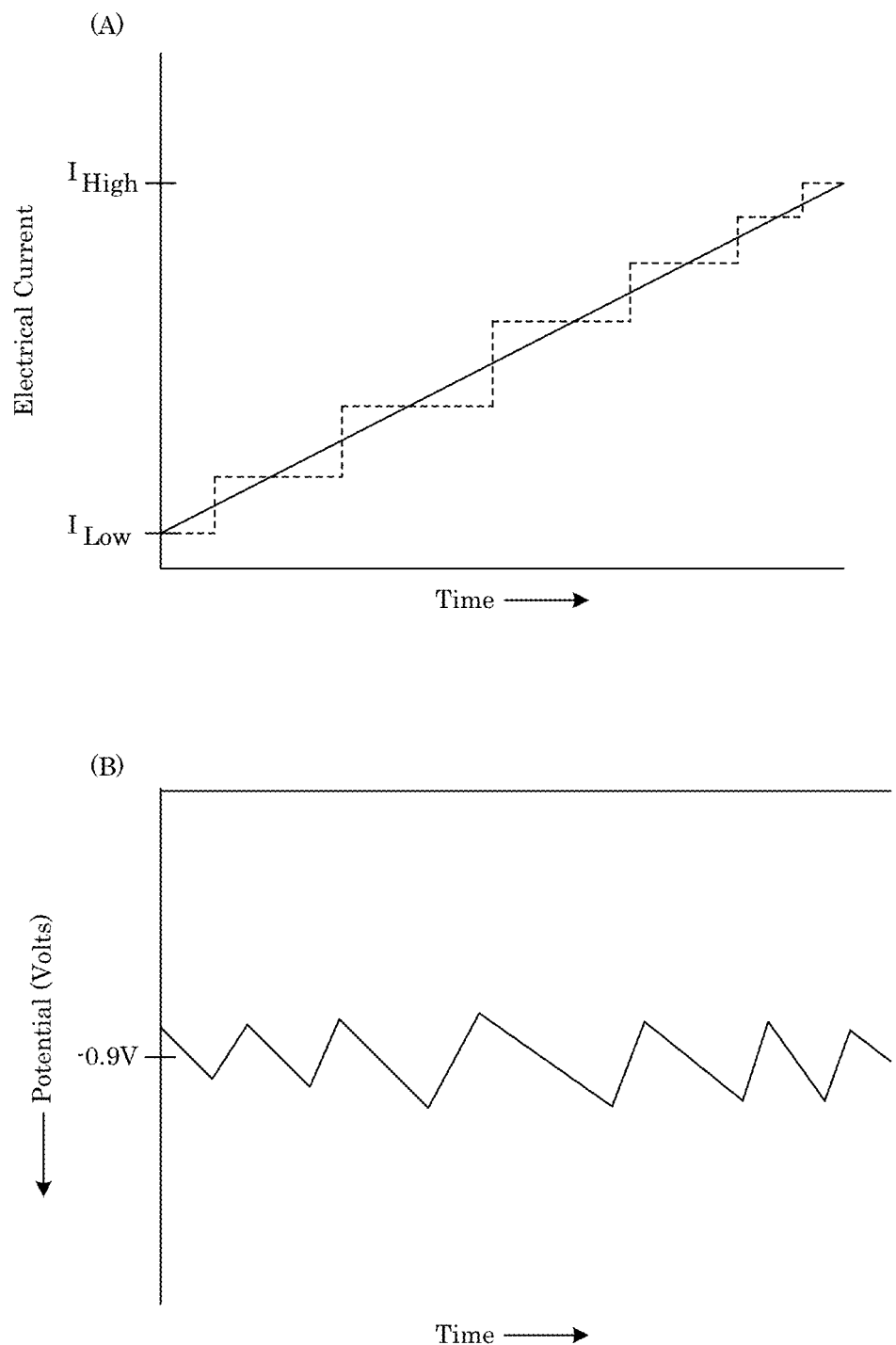
FIG. 8 shows (panel A) a graph of electrical current versus time and (panel B) a graph of voltage versus time for making an article by growth of a superconformal filling.

In the process, increasing the electrical current subjected to field 204 and recessed feature 250 to maintain the $V_{SSE}$ between −0.85 V and −1.00 V relative to the SSE can include stepping or ramping the potential or current to maintain the potential in the range −0.85 V and −1.00 V relative to the SSE. As shown in FIG. 7, growth proceeds from bottom member 206 in a direction of filling toward field 204. Here, with reference to FIG. 8, the electrical current can be subjected to overlayer 212 from low electrical current $I_{Low}$ to high electrical current $I_{High}$ to maintain the potential at field 204 and bottom member 206 from first voltage V1 to second voltage V2, wherein V1 is greater than or equal to V2, and V1 and V2 are between −0.85 V and −1.00 V relative to the SSE. In an embodiment, increasing the electrical current includes increasing the current through a series of steps of discrete and equal size at intervals that maintain potential in the specified interval.

According to an embodiment, the $V_{SSE}$ is maintained between −0.85 V and −1.00 V relative to the SSE until recessed feature 250 is completely filled with superconformal filling 210. In an embodiment, the VSSE is maintained between −0.85 V and −1.00 V relative to the SSE until recessed feature 250 is partially filled with the aspect ratio being less than or equal to 0.5; and thereafter the process includes changing a deposition condition to fill recessed feature 250 sub-conformally, conformally, or a combination of at least one of the foregoing non-superconformal filling regimes (i.e., sub-conformally filling or conformally filling).

Substrate 202 can include a material such as silicon, silicon dioxide, germanium, or a compound semiconductor such as silicon nitride, gallium nitride. Such materials can be used for applications in electrodepositing gold on substrates for microelectronics or jewelry. In an embodiment, substrate 202 is a semiconductor, e.g., silicon. Substrate 202 can be multi-layered such a first layer is disposed on a second layer. The first layer can be, e.g., a semiconductor, and the second layer, e.g., can be a high-K dielectric such as a nitride of the material of the first layer, e.g., silicon nitride. It is contemplated that field 204 and recessed feature 250 including sidewall 208 and bottom member 206 are fully metallized to be electrically conductive for electrodeposition of gold thereon through superconformally depositing gold.

Overlayer 212 provides full metallization of field 204 and recessed feature 250. Overlayer 212 can include a material such as gold, platinum, iridium, nickel, titanium, tantalum. Such materials can be used for adhesion to the substrate or wetting of the superconformal filling composition and superconformal filling. In an embodiment, overlayer 212 is a transition metal, e.g., Ti, Ta, or a combination thereof. A thickness of overlayer 212 can be from 1 nm to 1 μm, specifically from 10 nm to 100 nm or specifically from 100 nm to 1 μm. It is contemplated that in some embodiments overlayer 212 is an electrically conductive composite such as an electrically conductive polymer or an electrically conductive glass. Exemplary electrically conductive composites include indium tin oxide and the like.

Substrate 202 has recessed feature 250 that includes bottom member 206 and sidewall 208. Recessed feature 250 can a trench, via, or another feature in which an electrical interconnect (here, superconformal filling 210) is formed. A shape of recessed feature as viewed from field 204 toward bottom member 206 can be via, trench, or a combination thereof. Before superconformally filling recessed feature 250, recessed feature 250 can have an aspect ratio of depth D to width W from 0.5 to 100, specifically from 1 to 20, wherein the aspect ratio increases during superconformally filling recessed feature 250. A size of width W can be from 10 nm to 50 µm, specifically from 1 m to 10 µm. A size of depth D can be from 100 nm to 50 µm, specifically from 0.5 µm to 5 µm.

Superconformal filling 210 is void-free and seam-free. It is contemplated that, in a presence of superconformal filling composition 250, passivation of field 204 and recessed feature 250 occurs at $V_{SSE}$ greater than −0.85 V relative to the SSE. Further in a presence of superconformal filling composition 250, sub-conformal deposition of gold occurs at the $V_{SSE}$ less than −1 V relative to the SSE, and superconformal deposition of gold occurs at the $V_{SSE}$ between −0.85 V and −1.00 V relative to the SSE. Accordingly, superconformal deposition of gold occurs when $V_{SSE}$ is maintained between −0.85 V and −1.00 V relative to the SSE.

Figure 9:
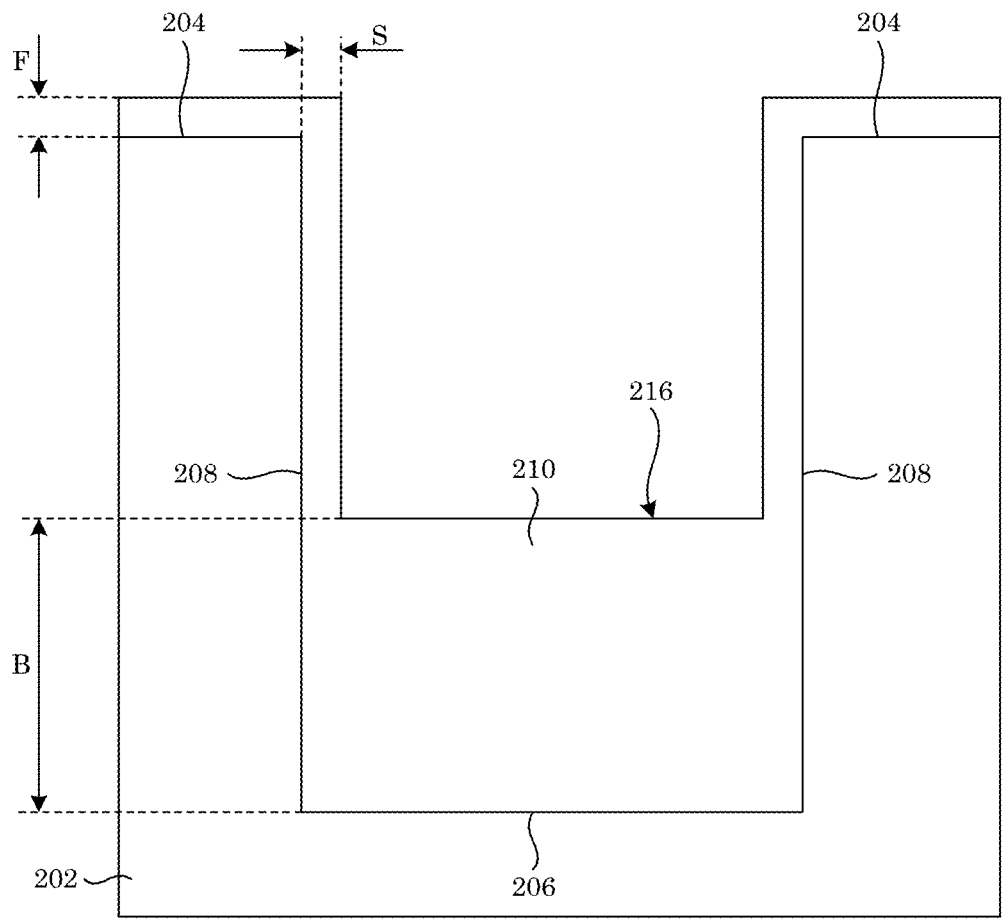
FIG. 9 shows an article that includes a superconformal filling disposed on a field and a recessed feature of the article.

With reference to FIG. 9, an amount of superconformal filling 210 superconformally deposited on bottom member 206 relative to sidewall 208 is a filling ratio given by thickness B of superconformal filling 210 disposed on bottom member 206 relative to thickness S of superconformal filling 210 disposed on sidewall 208, i.e. B/S, that can be from 2 to 1000, specifically from 2 to 100. An amount of superconformal filling 210 superconformally deposited on bottom member 206 relative to field 204 is a bottom coverage given by thickness B relative to thickness F of superconformal filling 210 disposed on field 204, i.e. B/F, that can be from 2 to 1000, specifically from 2 to 100.

Superconformal filling 210 includes gold or an alloy of gold. Exemplary alloys include gold-cobalt, and gold-nickel. Elements in the alloy can be provided in superconformal filling composition 214. A purity of superconformal filling 210 can be from 98 at % Au to 100 at % Au, specifically based on the elements in the superconformal filling. An alloying element or contaminant can be present in super conformal filling 210 in an amount from 0 at % to 2 at %, based on the elements in the superconformal filling. Exemplary alloying elements are Co and Ni and exemplary contaminants include Na, Pb, Tl, Bi and the like.

Advantageously, and unexpectedly, superconformal filling 210 is crystalline, dense, void-free, and seam-free of the macroscale, microscale, and nanoscale. In an embodiment, superconformal filling 210 is completely crystalline and is not amorphous. Crystalline domains of superconformal filling 210 include face centered cubic gold. Voids and seams include voids and seams along the centerline of the feature as well as pores within grains, and along grain boundaries, and the like, which are absent in superconformal filling 210 using an electron microscope at magnifications up to 100,000. As used here in, "macroscale" refers to dimensions that are of size 100 µm to 1 mm. As used here in, "microscale" refers to 0.1 µm to 100 µm. As used here in, "nanoscale" refers to 1 nm to 0.1 µm. In this regard, superconformal filling 210 is shiny and planar at exposed surface 216 on a submicron level with a brightness of superconformal filling 210 occurring in an absence of dendrites on exposed surface 216. It will be appreciated that electrochemical growth of surface deposits under certain conditions provides conformal fillings, sub-conformal fillings, or superconformal fillings (not superconformal filling 210) that have dendrites projecting away from the surface of the such filling. The dendrites are made of metal and decrease the brightness of such fillings such that such fillings are not as shiny superconformal filling 210 that lacks dendrites on exposed surface 216.

Figure 10:
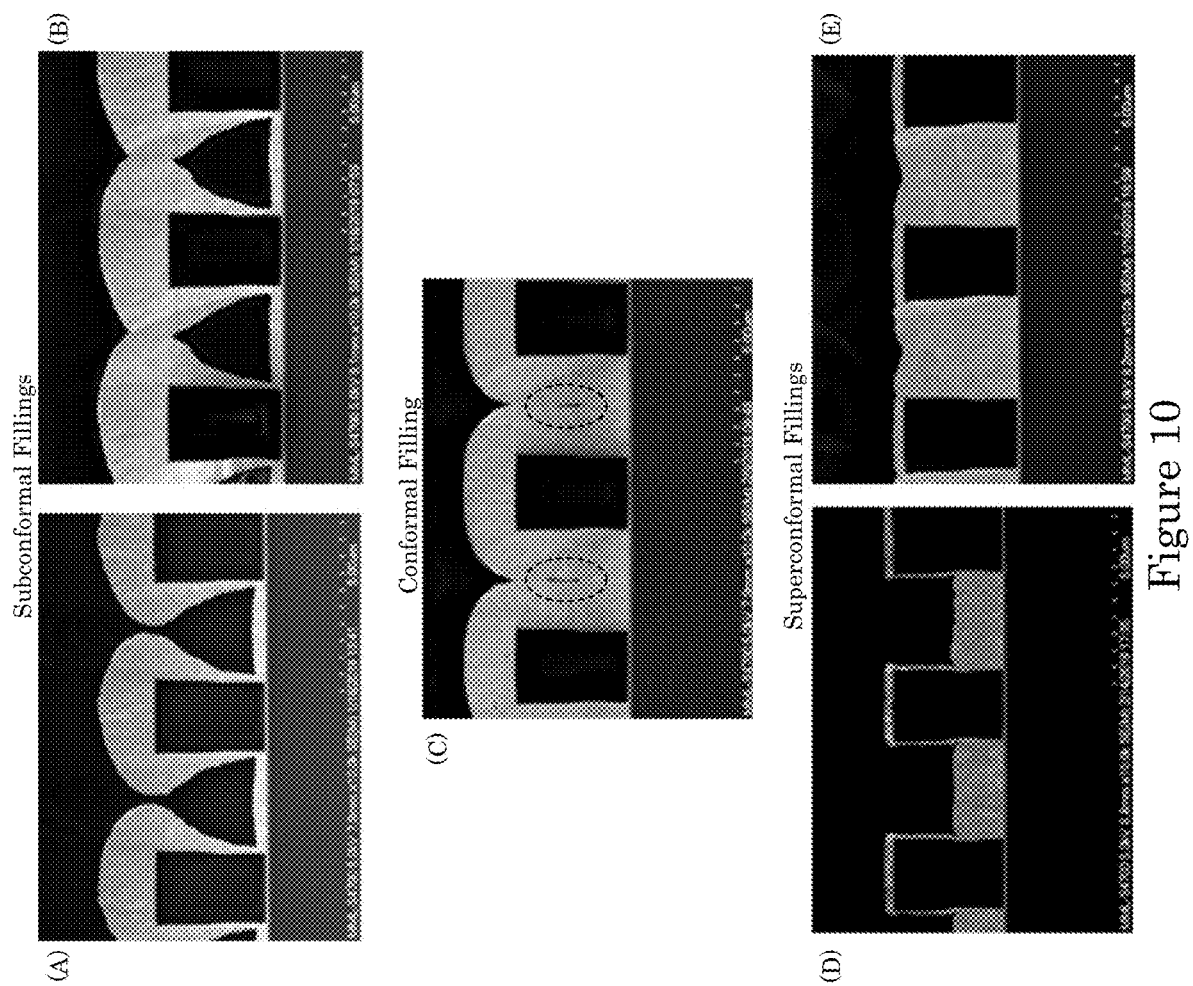
FIG. 10 shows (panels A and B) sub-conformal fillings, (panel C) a conformal filling; and (panels D and E) superconformal fillings.

FIG. 10 shows types of fillings that can be deposited on a substrate. Sub-conformal fillings are shown in panels A and B of FIG. 10. A conformal filling as shown in panel C of FIG. 10. Superconformal fillings 210 are shown in panels D and E of FIG. 10. It should be appreciated that sub-conformal fillings have thicker deposits closer to the feature entrance (i.e., top) with deposit thickness decreasing farther down (i.e., within) the feature. Further, conformal fillings have essentially uniform deposit thickness over the entire surface of the deposit. Moreover, superconformal fillings 210 thinner deposits closer to the feature entrance (i.e., top) with deposit thickness increasing monotonically farther down (i.e., within) the feature. Panel D and panel E of FIG. 10 show the progression of superconformal filling where deposition is specifically bottom-up, i.e., an essentially planar deposit on the bottom surface.

Superconformal filling composition 214 forms superconformal filling 210 on bottom member 206 and has a near-neutral pH. As used herein, near-neutral pH" refers to a pH that is from 5 to 10, with the lower value provided by instability of the superconformal filling composition. In an embodiment, the near-neutral pH of the superconformal filling composition is from 6.5 to 9. Moreover, superconformal filling composition 214 includes a plurality of $Au(SO_3)_2^{3-}$ anions as a source of gold for superconformally depositing gold in recessed feature 250; a plurality of $SO_3^{2-}$ anions; and a plurality of $Bi^{3+}$ cations as a brightener and an accelerator for superconformally depositing gold in recessed feature 250. The $Au(SO_3)_2^{3-}$ anions can be provided by a compound that includes the $Au(SO_3)_2^{3-}$ anions such as $Na_3Au(SO_3)_2$. The $Au(SO_3)_2^{3-}$ anions can be present in superconformal filling composition 214 in an amount from 5 millimolar (mM) to 350 mM, specifically from 40 mM to 80 mM. The $SO_3^{2-}$ anions can be provided by a compound that includes the $SO_3^{2-}$ anions such as $K_2SO_3$, $Na_2SO_3$, or a combination thereof. The $SO_3^{2-}$ anions can be present in superconformal filling composition 214 in an amount from 0.1 molar (M) to 1 M, specifically from 0.6 M to 0.7 M. It is contemplated that a source of the $Au(SO_3)_2^{3-}$ anions and the $SO_3^{2-}$ anions are independent. Moreover, the concentration of $SO_3^{2-}$ anions is independent from the concentration of $Au(SO_3)_2^{3-}$ anions in that the $SO_3^{2-}$ anions are not part of the $Au(SO_3)_2^{3-}$ anions present in superconformal filling composition 214. The $Bi^{3+}$ cations can be provided by a compound that includes the $Bi^{3+}$ cations such as bismuth sulfate or bismuth oxide or may be added through electrochemical dissolution from a Bi metal source. The $Bi^{3+}$ cations can be present in superconformal filling composition 214 in an amount from 1 micromolar (mmM or µM) to 50 mmM, specifically from 2 µM to 20 µM. Without wishing to be bound by theory, it is believed that in the process for superconformally filling, the superconformal deposition of gold is catalyzed by Bi or its complexes adsorbed on the surface from the $Bi^{3+}$ cations.

Superconformal filling composition 214 can include an additive. Exemplary additives include hardeners, such as As and Sb, surfactants or deposition suppressing additives. In an embodiment, superconformal filling composition 214 includes Bi in the absence of additive.

According to an embodiment, superconformal filling composition 214 consists essentially of $Au(SO_3)_2^{3-}$ anions, $SO_3^{2-}$ anions, $Bi^{3+}$ cations in an aqueous liquid.

In an embodiment, contacting field 204 and recessed feature 250 with superconformal filling composition 214 and obtaining bottom-up gold deposition occurs in an absence of thallium. In an embodiment, contacting field 204 and recessed feature 250 with superconformal filling composition 214 and obtaining bottom-up gold deposition occurs in an absence of lead. In an embodiment, contacting field 204 and recessed feature 250 with superconformal filling composition 214 and obtaining bottom-up gold deposition occurs in an absence of a suppressor.

In the process, the electrical current provides a cathodic voltage ($V_{SSE}$) between −0.85 V and −1.00 V relative to a saturated sulfate electrode (SSE), specifically from −0.85 V to −0.95 V. In an embodiment, the $V_{SSE}$ is −0.90 V. In an embodiment, the electrical current changes from 0.1 mA/cm$^2$ to 10 mA/cm$^2$, to maintain $V_{SSE}$ from −0.85 V to −1.00 V.

With $V_{SSE}$ between −0.85 V and −1.00 V, a first deposition ratio of a first deposition rate of gold on bottom member 206 relative to a second deposition rate of gold on sidewall 208 can be from 2 to 1000 In an embodiment, a deposition ratio of a thickness of gold deposited on field 204 to a thickness of gold deposited on bottom member 206 is from 1:20 to 1:100.

According to an embodiment, superconformally filling recessed feature 250 is bottom-up filling. In an embodiment, field 204 is passivated during bottom-up filling. In a particular embodiment, the bottom-up filling is uniform over the entirety of bottom member 206.

Article 200 and the process for superconformally filling recessed feature 250 with gold has numerous beneficial uses, including defect-free Au metallizations in recessed geometries. In an embodiment, a process for making an electronic device with article 200 includes, includes: the superconformal deposition process described herein followed by chemical mechanical planarization to remove the electrically conductive overlayer leaving gold superconformal filling as electrically isolated wires and vias disposed in the substrate.

Moreover, the process and superconformal filling 210 have numerous advantageous and beneficial properties. In an aspect, the process yields defect-free metal features for electrical conduction. The superconformal nature of the process yields reduced metal deposition on the field that decreases process cost, including reduced Au consumption in the superconformal filling composition as well as time and cost required to remove Au from the field.

The process and superconformal filling 210 unexpectedly enables strictly bottom-up superconformal filling of recessed features as well as more general superconformal filling of recessed features, selectable using processing parameters including concentrations, convectively transporting, potential, or adjusting temperature.

The articles and processes herein are illustrated further by the following Examples, which are non-limiting.

EXAMPLES

Example. Bottom-Up Filling of Damascene Trenches with Gold in a Sulfite Electrolyte In this Example, superconformally depositing Au is demonstrated in a $Na_3Au(SO_3)_2$—$Na_2SO_3$ based superconformal filling composition electrolyte using underpotential deposited (upd) Bi to catalyze the reduction of $Au(SO_3)_2^{3-}$. Micromolar additions of $Bi^{3+}$ to the electrolyte give rise to acceleration of the Au deposition rate as evidenced by hysteretic voltammetry and rising chronoamperometric transients that convolve the diffusion, adsorption kinetics and coverage isotherm of the upd Bi catalyst. Void-free bottom-up filling of Damascene trenches using potential, as well as current, control is demonstrated for different $Bi^{3+}$ concentrations. The bottom-up filling is accompanied under certain conditions by near-passivation of the field, resulting in deposition that resembles through-mask plating in the recessed features. The observed behavior is discussed in the context of previously described mechanisms for superconformal electrodeposition.

Superconformal film growth through additive-based electrodeposition underlies successful implementation of Cu in state-of-the-art multilevel interconnect metallization for the silicon based semiconductor industry. Gold metallization for compound semiconductors and related optoelectronics enabling interconnect networks of arbitrary design and complex architecture involve Au Damascene processes and electroplating chemistries like those that provide void-free filling of recessed surface features for fabrication of Cu interconnects. Several Au-additive systems have been shown to provide such feature filling. Void-free superfill of Damascene features in accord with the Curvature Enhanced Accelerator Coverage (CEAC) mechanism has been achieved using under potential deposited (upd) Pb as a surfactant catalyst for Au deposition from $KAu(CN)_2$ electrolytes. However, both electrolyte toxicity and the aggressive nature of the alkaline electrolyte towards photoresist materials are serious shortcomings of the system. Micromolar concentrations of Pb added to $Na_3Au(SO_3)_2$+$Na_2SO_3$ electrolyte also yield Au superfill of Damascene features through the CEAC mechanism. However, Restrictions On Hazardous Substances (ROHS) precludes use of Pb at even these extremely low concentrations. The addition of mercaptopropane sulfonic acid (MPS) to a commercial $Na_3Au(SO_3)_2$+$Na_2SO_3$ with a pH buffer and $Tl^+$ as a "grain refiner" enables superconformal deposition consistent with leveling through an incorporation-derived gradient of suppressor concentration, indicated by electroanalytical measurements to be the MPS. Additive incorporation in the Au deposit explicit in the mechanism is a concern with this approach, as is the use of Tl, again due to ROHS. A different suppressor, polyethyleneimine, exhibiting sharply defined suppression breakdown in a sulfite electrolyte manifest as S-shaped negative differential resistance (S-NDR) during voltammetry, yields superconformal Au filling that is entirely localized within recessed through silicon vias (TSV). However, the deposits contain nanoscale porosity due to additive incorporation that is part of the filling mechanism.

The coinage metals Au, Ag and Cu can be deposited superconformally using electrolyte-additive systems containing accelerators that enable the CEAC mechanism of superfill. In these systems, decrease of surface area during growth on concave surfaces increases the coverage of adsorbed accelerator. The CEAC mechanism thus yields accelerated filling of recessed (i.e., concave) features through positive feedback. Examples include the alkaline cyanide and near-neutral sulfite Au electrolytes noted previously, Cu sulfate electrolytes and Ag cyanide electrolytes. Feature filling models based on the CEAC mechanism accurately predict the observed superconformal feature filling. CEAC-based models also predict observed surface smoothing and stabilization of surface planarity derived through the same mechanism.

Near-neutral sulfite electrolytes are environmentally and practically superior to cyanide. They do suffer from disproportionation, $SO_2$ formation, or dithionnite-based decomposition in acidic media. However, their instability can be mediated using additives such as ethylenediamine or electrolyte modification, i.e., thiosulfate, enabling operation to pH values as low as 4.0. Sulfite plating baths, like cyanide, can exhibit constrained kinetics that are at least partly associated with the formation of inhibiting species on the surface. For superconformal deposition through the CEAC mechanism, this native inhibition can be lifted by the addition of Pb, Tl, Bi, or Sb, yielding depolarization in voltammetry so that these additives are classified as accelerators of the Au deposition. When optimized, their addition permits fabrication of bright Au films.

The utility of upd Bi as a surfactant catalyst for superconformal Au deposition in sub-micrometer trenches is explored in the $Na_3Au(SO_3)_2+Na_2SO_3$ electrolyte. Voltammetry and chronoamperometry on a rotating disk electrode (RDE) provide data that assist in understanding the observed feature filling behavior.

Experimental Details

The Au deposition used an industrial sodium gold sulfite source ($Na_3Au(SO_3)_2$) containing 2 troy ounces of Au per liter, equivalent to 0.32 mol/L, that was diluted to one-fourth its original concentration using 18 MΩ·cm water. Deposition studies were conducted in a cell containing 40 mL of the 0.080 mol/L $Na_3Au(SO_3)_2$ with and without 0.64 mol/L of $Na_2SO_3$ supporting electrolyte. Bismuth was introduced by anodic dissolution of 99.999% pure Bi, the stated concentrations assuming 100% efficiency and a $Bi^{3+}$ state. The electrolyte pH was 9.5, as determined using a pH sensor calibrated to buffer solutions of pH 7.0 and pH 10.0. Cyclic voltammometry and chronoamperometry were performed on Au coated rotating disk electrode (RDE) of 1.0 cm diameter Ag, polished to 1200 grit SiC paper, and current densities were obtained from the measured current using its nominal area. The electrolyte was sparged with argon before the cyclic voltammetry to reduce the amount of dissolved oxygen. Feature filling was studied using 3 mm×11 mm fragments of patterned wafers having a 0.2 μm thick Au seed in the field and a lesser amount on the side walls and bottoms of the patterned trenches and vias. The patterned substrates were rotated about one end from a Pt spindle during deposition, like a helicopter blade (the patterned surface facing upwards) to give definition to the metal ion and additive transport. Based on the ≈1 cm distance between the rotational axis and the imaged features, a 200π rad/min (100 rpm) rotation rate corresponds to an estimated 10 cm/s flow rate over the surface. The electrolyte was at room temperature (≈23° C.) during deposition. A saturated $Hg/Hg_2SO_4$/saturated $K_2SO_4$ reference electrode (SSE), connected to the working electrode compartment via a fritted bridge filled with saturated solution of potassium sulfate, was used for all experiments. The platinum counter electrode was held in a frit-separated cell immersed within the main cell.

Electrochemical Measurements on Planar Substrates

Figure 11:
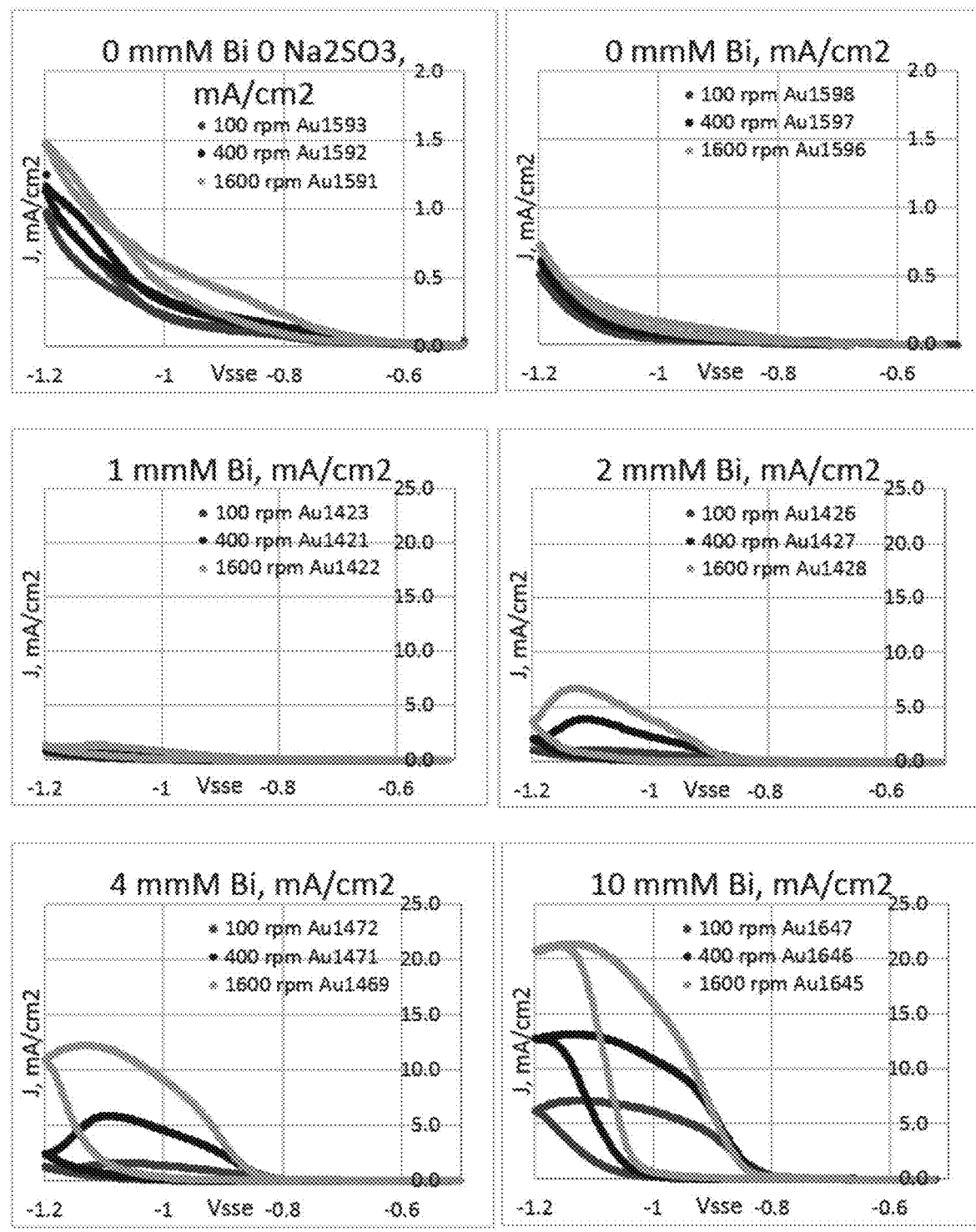
FIG. 11 shows cyclic voltammograms in an electrolyte including (upper left panel) 80 mmol/L $Na_3Au(SO_3)_2$ and an electrolyte including 80 mmol/L $Na_3Au(SO_3)_2$+0.64 mol/L $Na_2SO_3$ with 0 μmol/L to 10 μmol/L $Bi^{3+}$ obtained at indicated rotating disc electrode (RDE) rotation rates. The applied potential was cycled from −0.5 V at 2 mV/s. $Bi^{3+}$ accelerates Au deposition. Deposition is at room temperature, and potentials are relative to a saturated sulfate electrode (SSE)

Cyclic voltammetry in electrolyte containing different $Bi^{3+}$ concentrations is shown in FIG. 11. With only the 0.08 mol/L $Na_3Au(SO_3)_2$ in solution, the RDE finished with a darker surface from roughening that is presumed to underlie the increased current. Addition of the 0.64 mol/L $Na_2SO_3$ suppresses the Au deposition, at less negative potentials. For additive-free electrolytes a slight hysteresis is apparent. Introduction of the $Bi^{3+}$ introduces substantial hysteresis, with deposition rate increased over the range of potentials negative of approximately −0.85 V. The acceleration is such that current increases even as the scan direction reverses at the switching potential of −1.2 V, yielding negative differential resistance (NDR). Smoothing of the RDE surface at the end of the higher current density scans indicates the hysteresis is due to accelerated Au deposition. There is a 50%-100% increase of current density negative of −1.0 V on the negative-going scan, and negative of −0.9 V on the positive-going scan, with each 4× increase of rotation rate for all the nonzero Bi concentrations. With the highest Bi concentration (10 μmol/L**), the deposition rate at slightly more positive potentials is independent of rotation rate. The increase of current density with both increasing $Bi^{3+}$ concentration and higher RDE rotation rate (transport) is consistent with accumulating upd Bi disrupting the native inhibition that is limiting reduction of the $Au(SO_3)_2^{3-}$.

Figure 12:
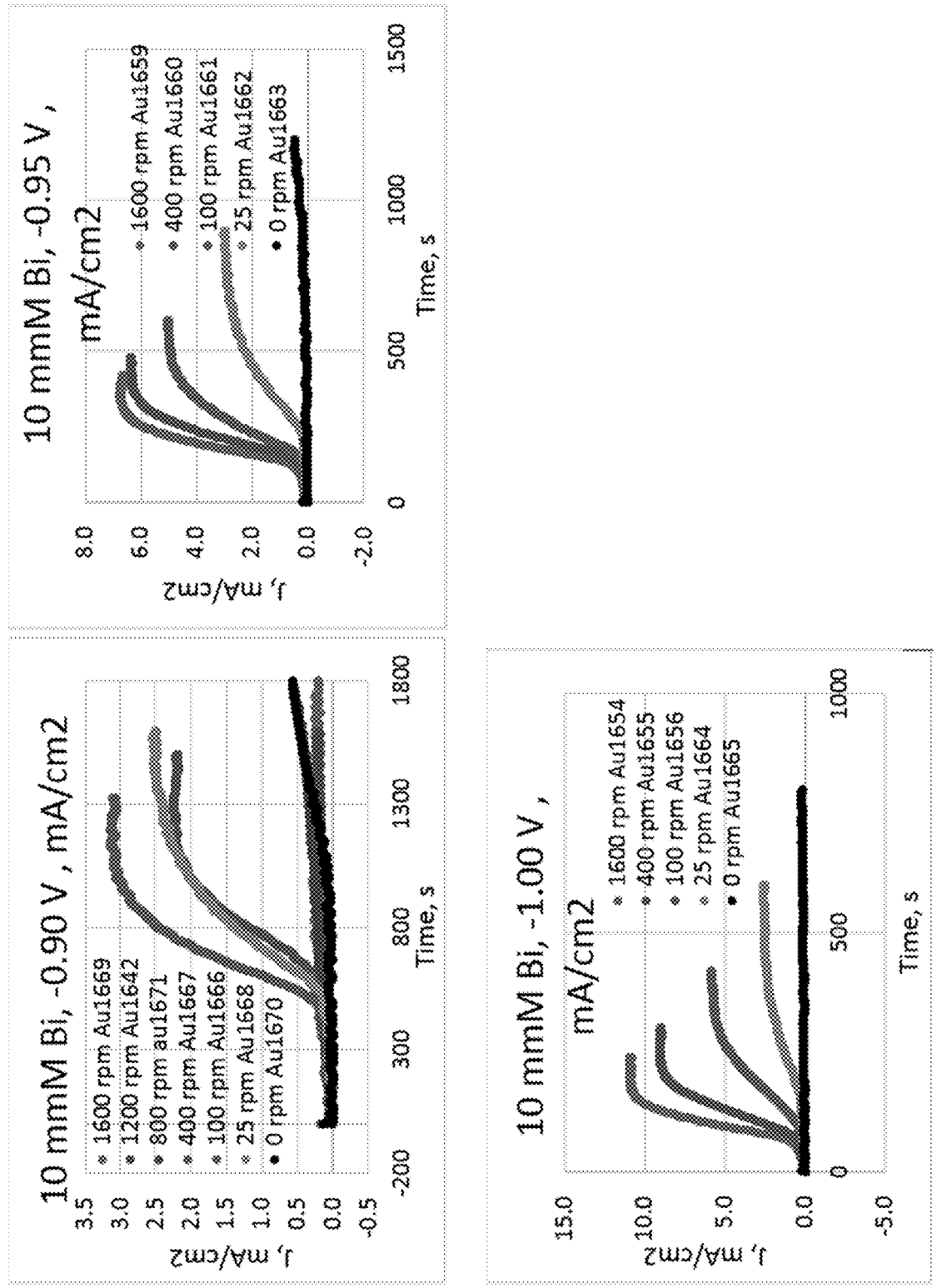
FIG. 12 shows chronoamperometric transients in electrolytes containing stated μmol/L $Bi^{3+}$ concentrations and RDE rotation rates. At more negative potentials, rising transients occur in presence of $Bi^{3+}$, wherein a timescale decreases more at higher rotation rates. At the least negative potential, the RDE remains passivated under stagnant conditions and at the highest RDE rotation rate.

FIG. 12 shows chronoamperometric transients for additive concentrations at deposition potentials just negative of the ≈−0.85 V value where increased current density is observed in the presence of Bi (FIG. 11). The plots capture the impact of RDE rotation rate for each condition examined. The RDE surface was smoother after deposition in electrolyte containing Bi so increasing currents reflect increased deposition rates rather than surface areas. The transients at the more negative potentials of −1.0 V and −0.95 V exhibit faster rise time and higher plateau current density at higher rotation rates, both suggestive of faster and higher coverage with accelerating Bi adsorbate. The 100 s to 400 s time scales of the transients are consistent with the presence of hysteresis in the voltammetry, the cycles from −0.8 V to −1.2 V and back to −0.8 V shown in FIG. 11 taking 400 s. The plateau values are somewhat lower than the current densities at the corresponding potentials on the return scans in the appropriate voltammograms. In contrast, the transients at −0.90 V and RDE rotation rates from 25 rpm to 400 rpm exhibit an extended period of fully passivated deposition prior to activation while passivation extends beyond 1200 s at higher rotation rate and under stagnant conditions.

Current density approaches an asymptotic value more rapidly with higher $Bi^{3+}$ concentration and at more negative potential. The dependence on concentration is not surprising as it is consistent with either transport or interface kinetics limited adsorption of the dilute $Bi^{3+}$ from the electrolyte. The dependence on potential suggests a change in the kinetics of adsorption or rearrangement of the surface. The current density of the plateau increases with potential and with $Bi^{3+}$ concentration. Analogous behavior was noted in the voltammetry and suggests an increase of the saturation adsorbate coverage with increase of the $Bi^{3+}$ concentration; higher concentration would otherwise shorten the time to saturation without affecting the saturation current density. Without wishing to be bound by theory, it is believed that consumption of the adsorbed Bi occurs during Au deposition and concentration-dependent equilibrium coverage.

Feature Filling

Figure 13:
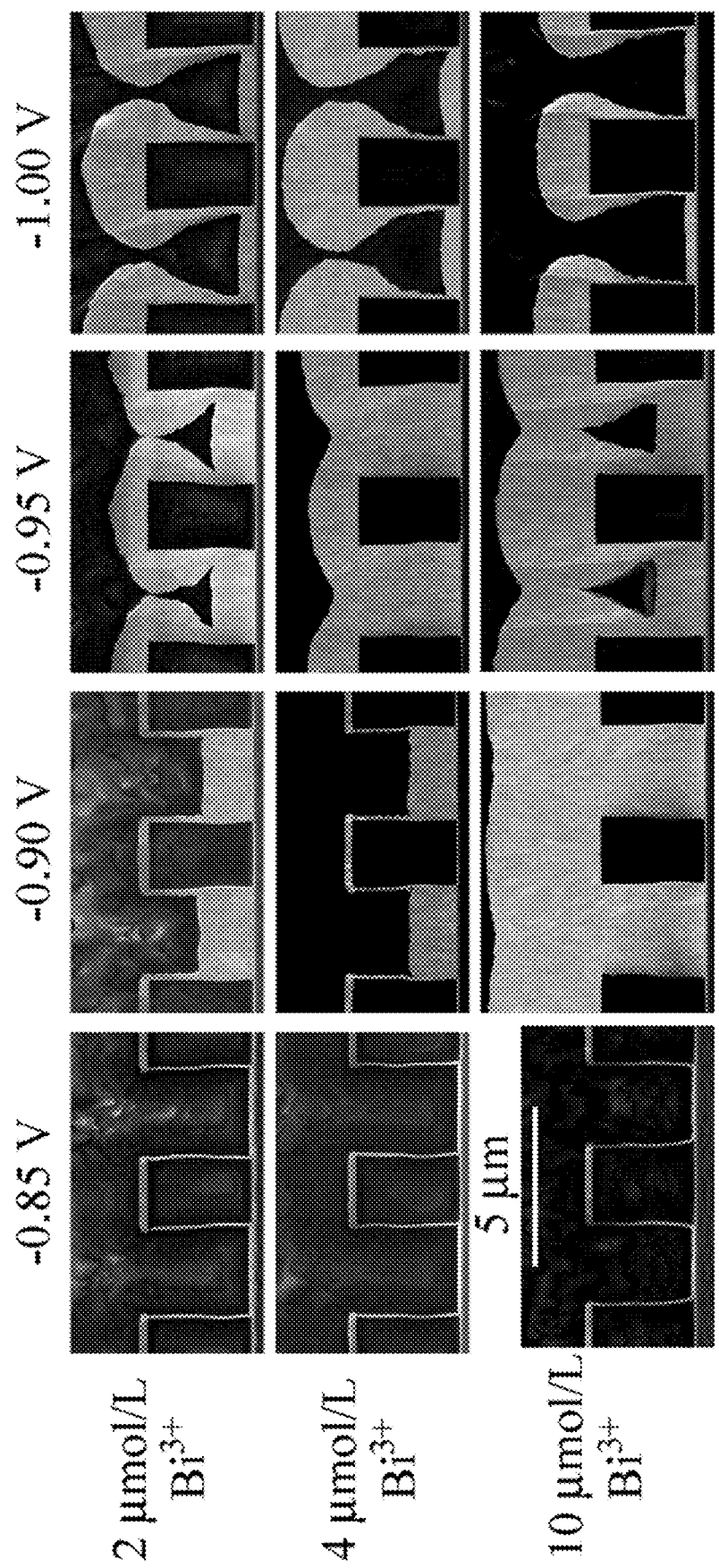
FIG. 13 shows gold deposition in trenches at potentials at (−0.85, −0.9, −0.95, −1.0) V for full passivation to bottom-up deposition with void-free filling, and truncated bottom-up and entirely sub-conformal depositions yielding voided filling. Filling (upper panels) with 2 μmol/L $Bi^{3+}$ at substrate rotation rate 100 rpm and 20 min deposition. Filling (middle panels) with 4 μmol/L $Bi^{3+}$ at substrate rotation rate 400 rpm and 10 min deposition. Filling (lower panels) with 10 μmol/L $Bi^{3+}$ at substrate rotation rate 100 rpm and (20,20, 10,5) min deposition times.
Figure 14:
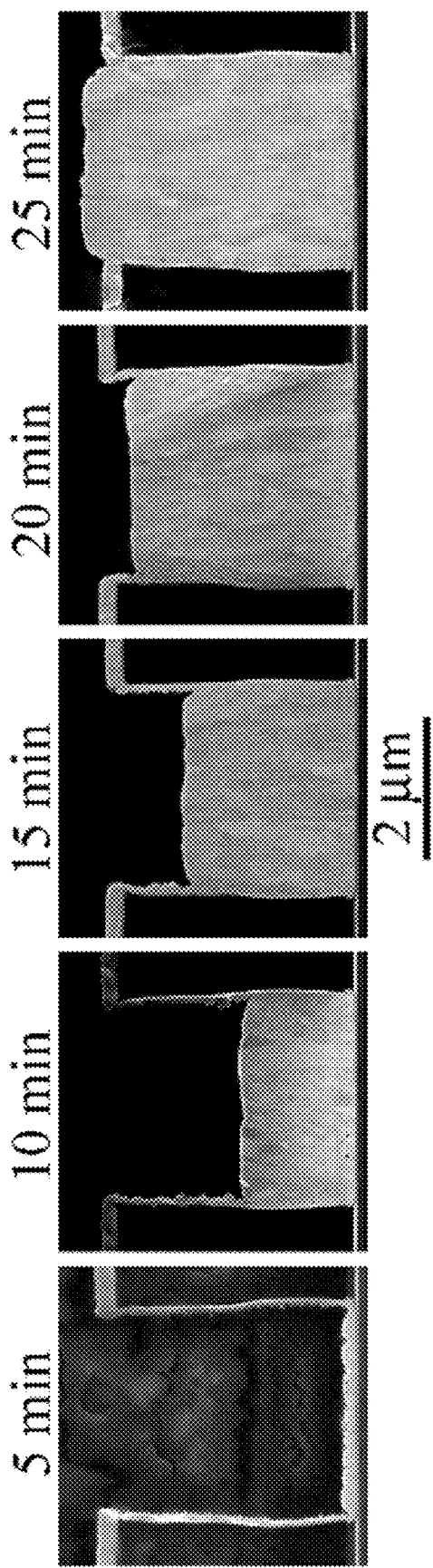
FIG. 14 shows Au deposition in trenches at indicated deposition times for evolution of filling in electrolyte containing 4 μmol/L $Bi^{3+}$ at an applied potential of −0.90 V and substrate rotation rate of 400 rpm.

Trench filling is shown in FIG. 13 for $Bi^{3+}$ concentrations and applied potentials that yield the full variety of observed behaviors. All three concentrations (transport conditions fixed for each) yield complete passivation of both field and recessed feature at −0.85 V. Similarly, all three conditions yield bottom-up deposition at −0.90 V, albeit 20 min is sufficient to fill only half the trench with 2 μmol/L $Bi^{3+}$ and 10 min to fill a similar fraction with 4 μmol/L $Bi^{3+}$. In contrast, truncated bottom-up deposition with voided filling is observed with 2 μmol/L $Bi^{3+}$ and 10 μmol/L $Bi^{3+}$ while the intermediate 4 μmol/L $Bi^{3+}$ concentration yields bottom-up filling. The difference correlates with transport; the 2 μmol/L $Bi^{3+}$ and 10 μmol/L $Bi^{3+}$ share a 100 rpm substrate rotation rate versus the 400 rpm rotation rate used with the 4 μmol/L $Bi^{3+}$. At −1.00 V, all three conditions yield sub-conformal deposition. FIG. 14 shows the temporal evolution of Au deposition with the 4 μmol/L $Bi^{3+}$ and −0.90 V potential that exhibited incomplete bottom-up filling in FIG. 13. The sequence highlights the full bottom-up evolution of the trench filling as well as the associated passivation of the sidewalls and field. It also captures an extended (5 min) period of near universal suppression, only the smallest hint of deposition being seen on the trench bottom, that precedes the bottom-up filling.

Figure 15:
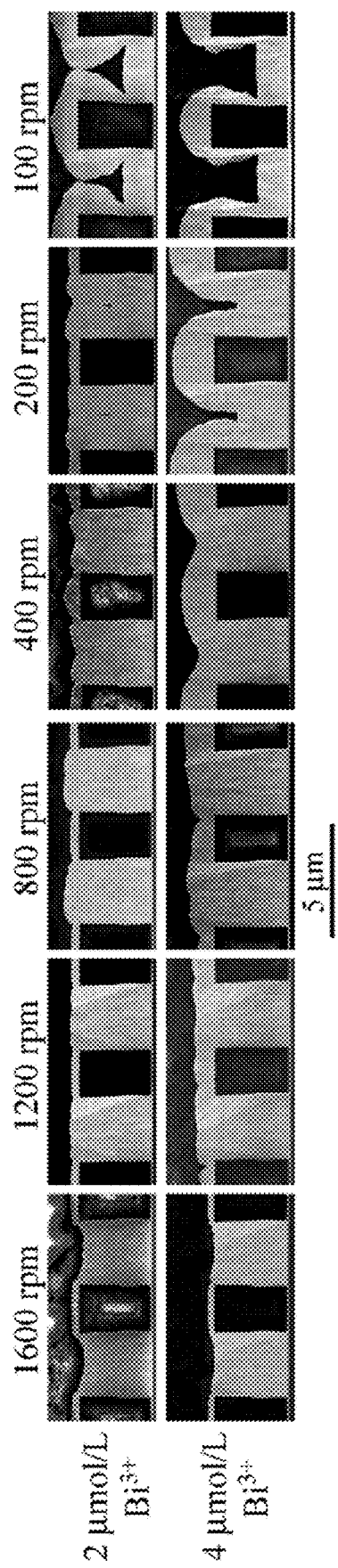
FIG. 15 shows Au deposition at −0.95 V for indicated $Bi^{3+}$ concentrations as a function of substrate rotation rate. Deposition times are 20 min in electrolyte containing 2 μmol/L $Bi^{3+}$ and 10 min in electrolyte containing 4 μmol/L $Bi^{3+}$. Deposition on the field, fully passivated at the highest rotation rate, accelerates as rotation rate decreases.

The impact of substrate rotation rate suggested by the results in FIG. 13 is examined explicitly in FIG. 15 at the −0.95 V potential that yields truncated bottom-up filling with 2 μmol/L $Bi^{3+}$ and 100 rpm versus bottom-up filling with 4 μmol/L $Bi^{3+}$ and 400 rpm. Both concentrations provide completely suppressed deposition on the field at the highest rotation rate of 1600 rpm and near complete bottom-up trench filling. The suppression lifts, deposition on the field accelerating substantially, as the rotation rate decreases. The bottom-up filling in the trenches exhibits a modest increase that converts the slight underfilling to an overfill bum. At the lowest rotation rate, deposition on the field exceeds that inside the features. Voids with a keyhole-shaped upper surface indicate substantial Au depletion with the active field and sidewalls, although truncated bottom-up deposits define a flat lower surface. The acceleration of deposition on the field as transport decreases is unexpected based on the acceleration induced by the $Bi^{3+}$ in the voltammetry at all RDE rotation rates (FIG. 11).

Figure 16:
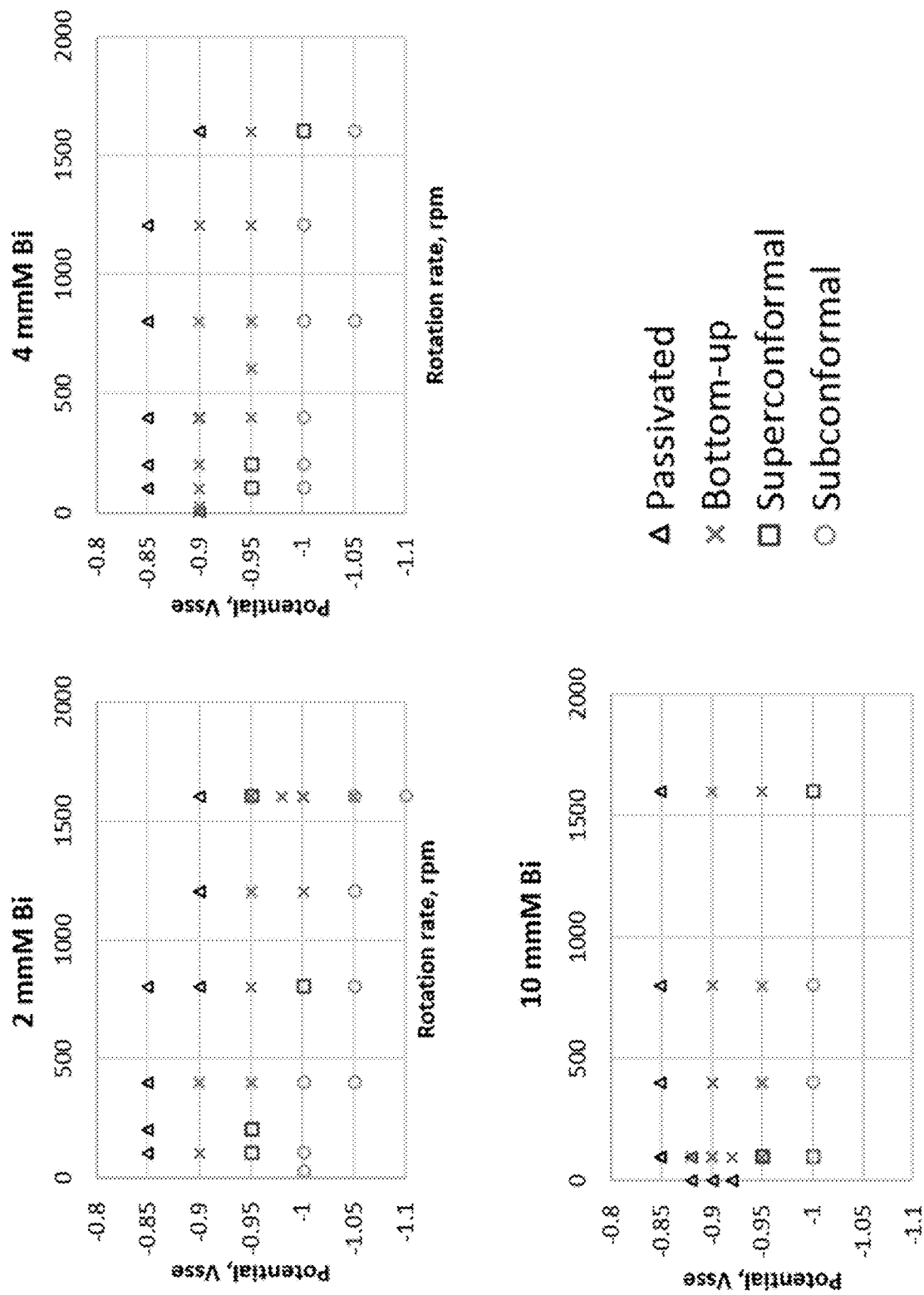
FIG. 16 shows graphs of potential versus rotation rate for filling trenches in electrolyte containing (panel a) 2 μmol/L $Bi^{3+}$, (panel b) 4 μmol/L, and (panel c) 10 μmol/L $Bi^{3+}$.
Figure 17:
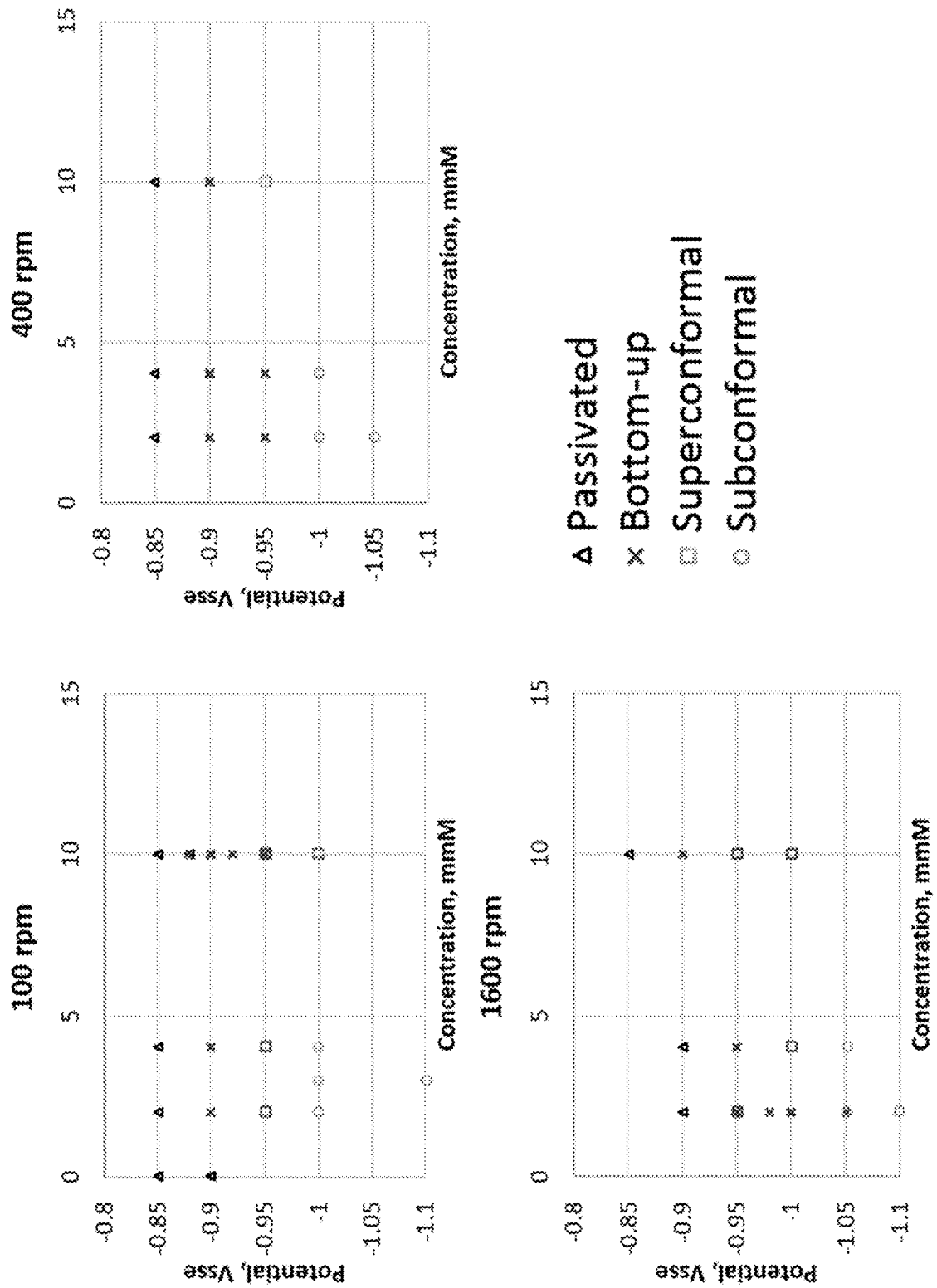
FIG. 17 shows graphs of potential versus $Bi^{3+}$ concentration for filling trenches at substrate rotation rates of (panel a) 100 rpm, (panel b) 400 rpm, and (panel c) 1600 rpm.

Maps that summarize the nature of feature filling systematically over a range of conditions including the set included in FIG. 13 and FIG. 15 are presented in FIG. 16 and FIG. 17. Filling for different potentials and substrate rotation rates in electrolyte with fixed $Bi^{3+}$ concentrations is summarized in FIG. 16. Filling for different potentials and $Bi^{3+}$ concentrations at fixed substrate rotation rates is summarized in FIG. 17. Consistent with FIG. 13, fully suppressed surfaces are observed at less negative potentials (−0.85 V and positive), sub-conformal filling is observed at more negative potentials (−1.00 V and negative) and bottom-up filling is obtained at potentials between. The potential range for bottom-up filling exhibits a limited dependence on the rotation rate. Reduction of the range at the lowest rotation rate indicated by the maps in FIG. 16 is possibly related to the loss of suppression on the field captured in FIG. 15. Truncated bottom-up, or more general superconformal deposition, with enhanced deposition toward the bottom of the trenches that is not necessarily bottom-up or void-free, is observed at the boundary between bottom-up and sub-conformal deposition. Examples can be found in FIG. 13 and FIG. 15.

The filling behavior here with use of only an accelerating additive differs from previous observations of electrolytes that provide superconformal Au, Ag, and Cu filling of features using accelerators. While these other systems also exhibit an "incubation period" prior to bottom-up filling, it is accompanied by some amount of conformal growth on all surfaces. Furthermore, accelerated deposition in these other systems initiates at the bottom corners of the feature rather than the nominally uniform activation of the entire bottom surface captured in FIG. 14. In this Example with the superconformal electrolyte, filling is exclusively superconformal instead of conformal or sub-conformal.

There are aspects where deposition is consistent with CEAC superfill. These include growth in wider features, where nucleation does occur in the lower corners. Furthermore, where significant deposition does occur on the field, it is very smooth (FIG. 13 and FIG. 15), consistent with CEAC smoothing. Nonetheless, were it not for the use of an accelerator and the length scale, the filling sequence pictured in FIG. 14 could easily be improperly confused for bottom-up Cu filling of TSV, obtained using a deposition rate suppressing additive.

These results are consistent with the current transients in FIG. 12. Specifically, the asymptotic behavior manifests deposition accelerating with adsorbate coverage to steady state values on stabilized planar surfaces.

Moreover, current densities on the planar RDE are well below the gold ion transport limit at the −0.90 V and −0.95 V potentials yielding bottom-up deposition at the various $Bi^{3+}$ concentration (FIG. 11). Accordingly, bottom-up superfill of Au has been demonstrated in sub-micrometer trenches using $Bi^{3+}$ upd additive in a $Na_3Au(SO_3)_2$—$Na_2SO_3$ electrolyte. The system exhibits rising chronoamperometric transients and hysteretic voltammetry typical of CEAC superfilling electrolytes. However, the current transients exhibit oscillations typically observed in electrolytes containing suppressing additives and exhibiting superconformal deposition through the S-NDR mechanism.

Comparative Example A. Superfilling Damascene Trenches with Gold in a Sulfite Electrolyte Including Lead Superconformal Au deposition is demonstrated in a $Na_3Au(SO_3)_2$—$Na_2SO_3$ based electrolyte using underpotential deposited (upd) Pb to catalyze the reduction of $Au(SO_3)_2^{3-}$. Micromolar additions of $Pb^{2+}$ to the electrolyte give rise to acceleration of the Au deposition rate as evidenced by hysteretic voltammetry and rising chronoamperometric transients that convolve the diffusion, adsorption kinetics and coverage isotherm of the upd Pb catalyst. The catalytic activity on the Au deposition reaction may be quenched, or reset, by stepping the potential to more positive values to deactivate or strip the Pb catalyst. Void-free Damascene trench superfilling at various fixed potentials and $Pb^{2+}$ concentrations is demonstrated and shown to be congruent with the curvature enhanced accelerator model (CEAC) of superconformal growth. This includes enhanced deposition due to catalyst enrichment on concave surface segments at the bottom corners of the trenches, followed by rapid bottom-up growth and, for certain conditions, bump formation above the filled trenches. It should be appreciated that Pb is toxic and not included in the superconformal filling composition described in the Detailed Description and the Example.

Superconformal film growth by additive-based electrodeposition underlies the successful implementation of Cu in state-of-the-art multilevel interconnect metallization for the silicon based semiconductor industry. In contrast, electrodeposited Au remains the metallization of choice for interconnects and contacts in compound semiconductors and related optoelectronics applications as detailed in recent reviews. To date, the majority of these applications have involved through-mask-electrodeposition. However, increasing circuit densification demands a move to three-dimensional metallization to enable the fabrication of interconnect networks of arbitrary design and complex architectures. Implementation of the Damascene process calls for Au electroplating chemistry that can provide void-free filling of recessed surface features. Previously two different Au electrolytes have been examined and shown to be capable of void-free feature filling. The first derives from the original observation of McIntyre and Peck that underpotential deposited (upd) Pb catalyzes Au deposition from $KAu(CN)_2$-based electrolytes. When this acceleration is combined with mass conservation of the surfactant in the presence of electrode area change, superconformal Au void-free feature filling occurs in accord with the CEAC model. Practically speaking, two short-comings of the system are electrolyte toxicity and the aggressive nature of the alkaline media towards photoresist materials. In order to address these challenges a sulfite-based Au electrolyte was evaluated by Hu and Ritzdorf. The addition of mercaptopropane sulfonic acid (MPS) to a commercial electrolyte comprised of $Na_3Au(SO_3)_2$, $Na_2SO_3$, a pH buffer and $Tl^+$ as a "grain refiner" enabled void-free superconformal deposition. Electroanalytical measurements indicate that MPS serves as an inhibitor that facilitates feature filling in line with traditional leveling concepts although no quantitative modeling was performed. In this report the utility of upd Pb as a surfactant catalyst for Au superfilling of sub-micrometer trenches is revisited using a slightly alkaline $Au(SO_3)_2^{3-}$ electrolyte. Electroanalytical and feature filling experiments are shown to be in good agreement with the CEAC mechanism of superconformal deposition.

The CEAC feature filling mechanism derives from the competition between accelerating and rate inhibiting adsorbates for available surface sites. Successful filling is ascribed to the increasing coverage of the more strongly bound accelerator surface phase (e.g., upd Pb in the present case) during area reduction that accompanies deposition on concave recessed surface segments. The positive feedback due to coupling of decreasing area and increasing accelerator adsorbate coverage at the bottoms of filling features leads to locally increased deposition rate and accelerated bottom-up superfilling. Several feature filling models based on the CEAC mechanism have been shown to accurately predict superfilling of patterned features. Examples can be found ranging from copper deposition in damascene features and microvias from acid sulfate-based electrolytes to the superfilling of trenches and vias with silver and gold deposited from KSeCN, $SC(NH_2)_2$ or Pb catalyzed cyanide-based electrolytes. The surface smoothing capacity and stability associated with the CEAC mechanism has been evaluated as has the influence of surface diffusion 24 and surface derivatization.

Research on sulfite chemistry for Au electrodeposition reportedly dates back to 1842. Compared to cyanide, sulfite electrolytes are environmental friendly but suffer from disproportionation, $SO_2$ formation, and/or dithionnite-based decomposition in acidic media. The instability can be mediated through additive additions, e.g., ethylenediammine, and/or electrolyte modification, i.e., thiosulfate, to enable operation to be extended to pH values as low as 4. Cyanide and sulfite plating baths both exhibit constrained kinetics at least partly associated with the formation of inhibiting species on the surface. The native inhibition of these electrolytes may be lifted by the addition of Pb, Tl, or Sb resulting in depolarization, i.e., acceleration of the deposition rate, that when optimized yields bright Au films.

Experimental

The depositions detailed in this work utilized an industrial sodium gold sulfite source ($Na_3Au(SO_3)_2$) stated to contain 2 troy ounces of gold per liter, equivalent to 0.32 mol/L (197 g/mol gold with 31.1 g=1 troy ounce). This solution was diluted to one-fourth its original concentration using 18 MΩ·cm water and $Na_2SO_3$ was added as a supporting electrolyte. Deposition studies were conducted in a cell containing 100 mL of the 0.080 mol/L $Na_3Au(SO_3)_2$-0.32 mol/L $Na_2SO_3$ electrolyte with sequential additions of aliquots drawn from a 1 mmol/L $Pb(ClO_4)_2$ solution. The electrolyte pH was 9.5, as determined using a pH sensor calibrated to buffer solutions of pH 7.0 and pH 10.0. According to Pourbaix's atlas, $Pb(ClO_4)_2$ (s) dissolution in pH 9.5 solution results in complex formation with two species present in the ratio $[HPbO_2^-]/[Pb^{2+}] \sim 3.49$ The electrolyte was sparged with nitrogen prior to use in order to remove dissolved oxygen. Cyclic voltammometry and chronoamperometry were performed using 100 nm thick planar Au films prepared by electron beam evaporation on Si wafers. The electroanalytical screening studies were performed under quiescent conditions although the vertical orientation of stationary substrates results in density-gradient-driven convection as the $Au(SO_3)_2^{3-}$ is depleted in the electrode boundary layer by deposition. Feature filling experiments were conducted with the patterned specimens held in the same orientation but rotating at $160\pi$ rad/min (80 rpm) with the rotation axis oriented vertically within the plane of the specimen. This enhanced and fixed the $Au(SO_3)_2^{3-}$ transport, necessary because CEAC-based superfilling fails when metal ion transport dominates interface kinetics. The electrolyte was at room temperature ($\approx 23°$ C.) blanketed with nitrogen during deposition. A saturated $Hg/Hg_2SO_4$/saturated $K_2SO_4$ reference electrode (SSE) was used for all experiments. The reference electrode was connected to the working electrode compartment via a fritted salt bridge filled with saturated solution of potassium sulfate while a platinum counter electrode was held in a frit-separated cell immersed within the main cell.

The planar substrates were pieces of a polished silicon wafer coated with 100 nm Au on a 10 nm Ti adhesion layer by electron beam evaporation. These specimens were masked with plater's tape to expose a circular region 0.54 $cm^2$ in area; current densities are obtained from the measured current divided by this area. Studies of superfill in trenches were conducted on fragments of patterned wafers at fixed potential. The substrates with an array of trench widths were purchased from Sematech with a copper seed and Ta barrier already in place. Depositions were performed at fixed potential and each specimen included all the trench sizes studied.

Electrochemical Measurements on Planar Substrates

Figure 18:
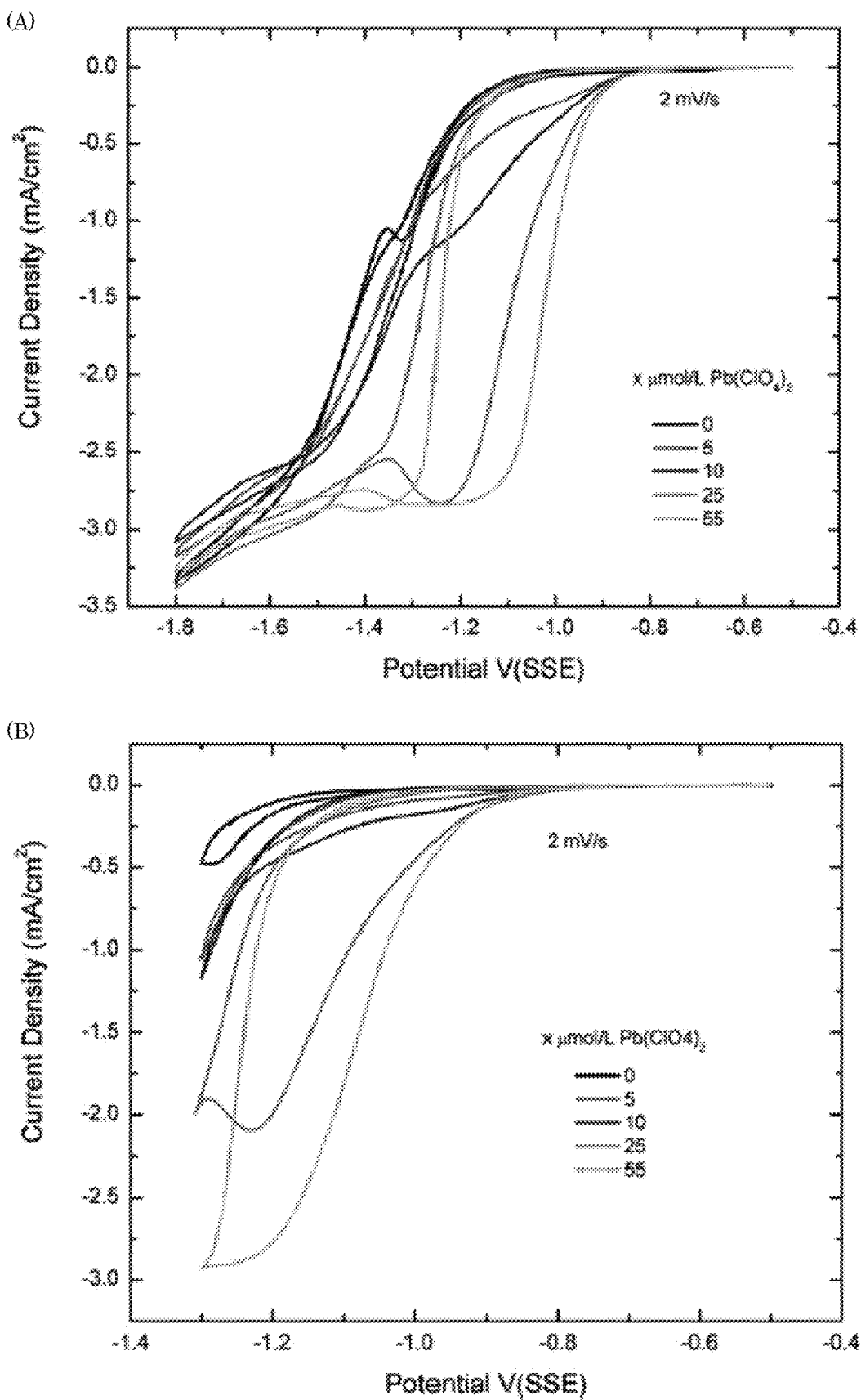
FIG. 18 shows cyclic voltammograms of current density (deposition current) versus applied potential during potential cycling (panel A) from −0.5 V to −1.8 V and back and (panel B) from −0.5 V to −1.3 V and back, wherein potentials are relative to SSE. Deposition currents are for indicated $Pb(ClO_4)_2$ additive concentrations for voltage cycling at 2 mV/s scan rate. Positive-going scans have higher current densities than negative-going scans. Deposition is at room temperature without agitation of the electrolyte.

Cyclic voltammetry in FIG. 18 shows the current density (i.e., metal deposition rate) as a function of the deposition potential for a number of $Pb(ClO_4)_2$ concentrations; the scan rates are 2 mV/s. The additive increases the deposition rate over a range of potentials on both the negative-going and positive-going sweeps. For the additive-free case a slight hysteresis is apparent; the film visibly roughened (not shown) indicating that the larger current density is due to area expansion. In contrast the voltammetry associated with lead additions resulted in specular films. The hysteresis is consistent with Pb upd accumulation during the cycle disrupting the native inhibition associated with reduction of the $Au(SO_3)_2^{3-}$. Cycling to $-1.8$ V yields larger deposition rates on the return sweeps than cycling to $-1.3$ V, indicating higher adsorbate coverage is obtained due to the longer cycle time and/or access to more negative potentials. The Au deposition is evidently constrained by transport at potentials negative of $-1.5$ V, with a diffusion limited current density of $\approx 2.8$ mA/$cm^2$. The negative going sweeps on subsequent cycles (not shown) are identical to those during the first cycle, indicating that desorption/deactivation of adsorbed species occurs at the less negative potentials.

Figure 19:
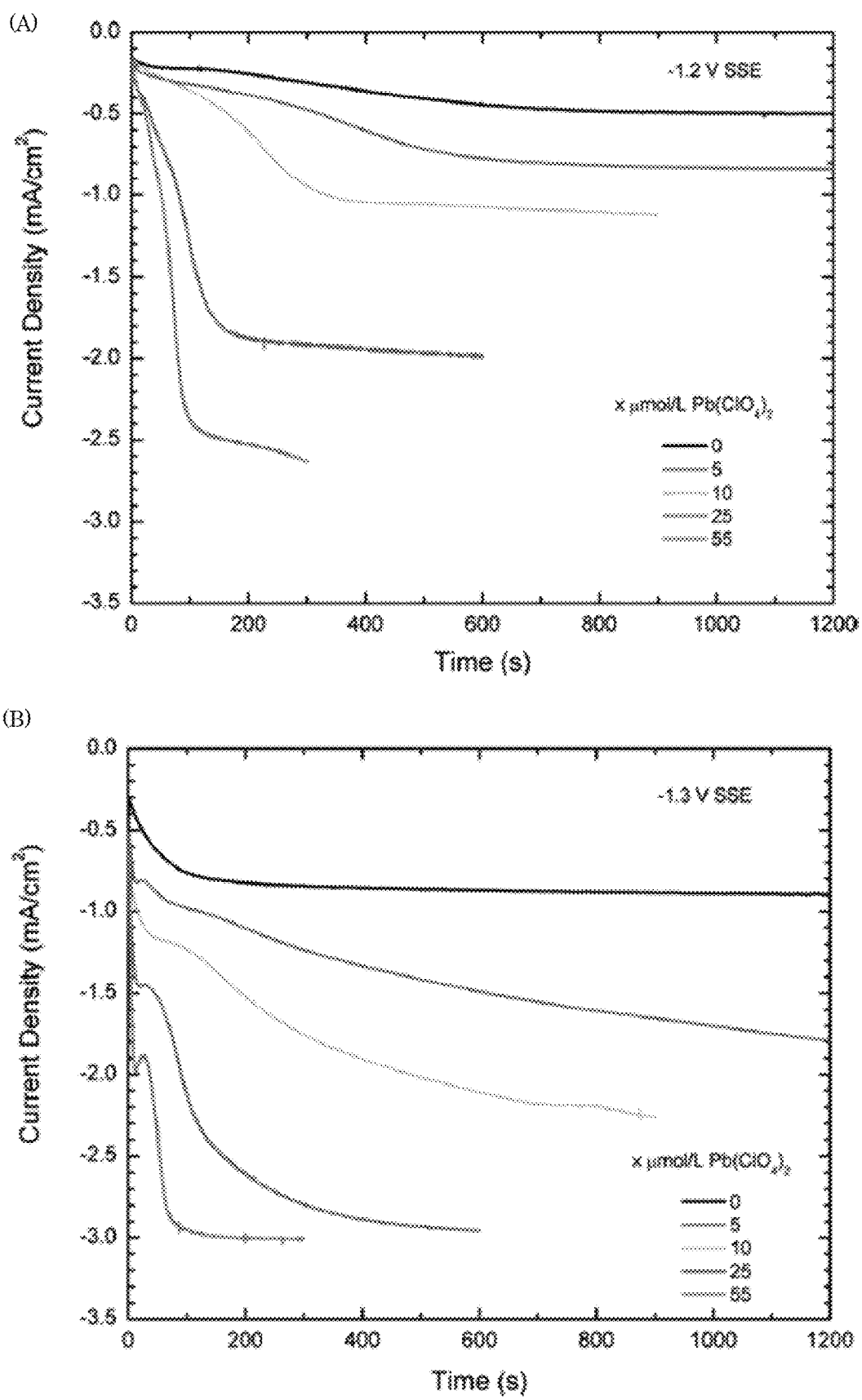
FIG. 19 shows graphs of current density versus time in for current density transients at (panel A) −1.2 V and (panel B) −1.3 V for indicated concentrations of lead perchlorate additive. Depositions were without agitation at the indicated potentials.

FIG. 19 shows rising chronoamperometric transients for a range of additive concentrations at two different deposition potentials. The films grown in the presence of the additive were specular indicating that the increasing current is not due to area expansion. The asymptotic transients are consistent with adsorption (upd) of the accelerating Pb species reaching steady-state coverage. Such transients are observed at potentials where voltammetric hysteresis is also evident in FIG. 18. Asymptotic chronoamperometric behavior is also congruent with the expectations of the CEAC adsorbate evolution equation that relates change of the adsorbate coverage θ to locally changing surface area through the curvature K and growth velocity v. With an explicit form for v(θ) this term captures the full CEAC mechanism as found in all subsequently derived models. For a planar surface κ=0. The model takes into adsorption from the electrolyte given the electrolyte concentration at the interface; it predicts adsorption from the electrolyte up to the unity (normalized) saturation value, yielding the asymptotic behavior observed in the chronoamperometric results; the reverse reaction is straightforward to add. The model includes adsorbate consumption during deposition, reflecting any nonideality as a surfactant. The kinetic factors $k_+$ and $k_-$ and the function v(θ) at a particular deposition potential can be obtained from the chronoamperometric measurements.

Evolution of the boundary layer is convolved with the increasing metal deposition that accompanies increasing adsorbate coverage, particularly evident in the first several tens of seconds as the density gradient that drives the fluid flow first develops. The current density approaches an asymptotic value more rapidly for higher additive concentration, consistent with the dependence on additive concentration (albeit at the interface). Deposition exhibiting this behavior creates mirror-like deposits despite deposition rates approaching substantial fractions of the transport limit. This is in accord with modeling that quantifies the substantial surface stabilization that can arise from the CEAC mechanism (bottom-up filling is effectively a "brightening" process that flattens surfaces by removing micrometer to nanometer size "scratches").

Increase of the additive concentration in the electrolyte yields a larger steady-state current density, from which an increase of the maximum adsorbate coverage is inferred. This suggests some consumption of the adsorbate during Au deposition and/or a concentration-dependent equilibrium coverage. While the former was demonstrated and quantified for lead additive in cyanide-based superfilling electrolyte (preadsorbed lead gradually consumed during deposition in lead-free electrolyte), the latter evidently plays a substantial role here.

FIG. 20A shows the deposition history of a specimen subjected to 10 minute depositions at −1.2 V interleaved with a series of 20 s potential pulses to −0.3 V to −1.0 V in electrolyte containing 5 μmol/L Pb(ClO$_4$)$_2$; the corresponding potential history is overlaid. FIG. 20B replots these transients so that all start at zero time. FIG. 21 shows similar data for a specimen subjected to 3 minute depositions at −1.2 V interleaved with the same series of 20 s pulses in electrolyte containing 25 μmol/L Pb(ClO$_4$)$_2$. The overlaid data in FIG. 20B and FIG. 21B show that, aside from deposition on the fresh substrates, the transients during the −1.2 V depositions are repeatable. The current densities approach steady state values of ≈0.8 mA/cm$^2$ and ≈2.0 mA/cm$^2$, with 5 μmol/L Pb(ClO$_4$)$_2$ and 25 μmol/L Pb(ClO$_4$)$_2$ respectively, that are consistent with the corresponding chronoamperometric results in FIG. 19A. The substantial decrease of current density following the −0.7 V pulse (FIG. 20B and FIG. 21B) indicates correspondingly decreased coverage of active adsorbate; the relative timescales of the subsequent increase of the current density at the different concentrations are consistent with its readsorbtion. Pulsing to less negative potentials is followed by unaccelerated deposition followed by transient increase to the steady state values. Pulsing to more negative potentials is followed by unchanged deposition rate, aside from a very short transient associated with capacitive charging and evolution of the boundary layer.

Figure 20:
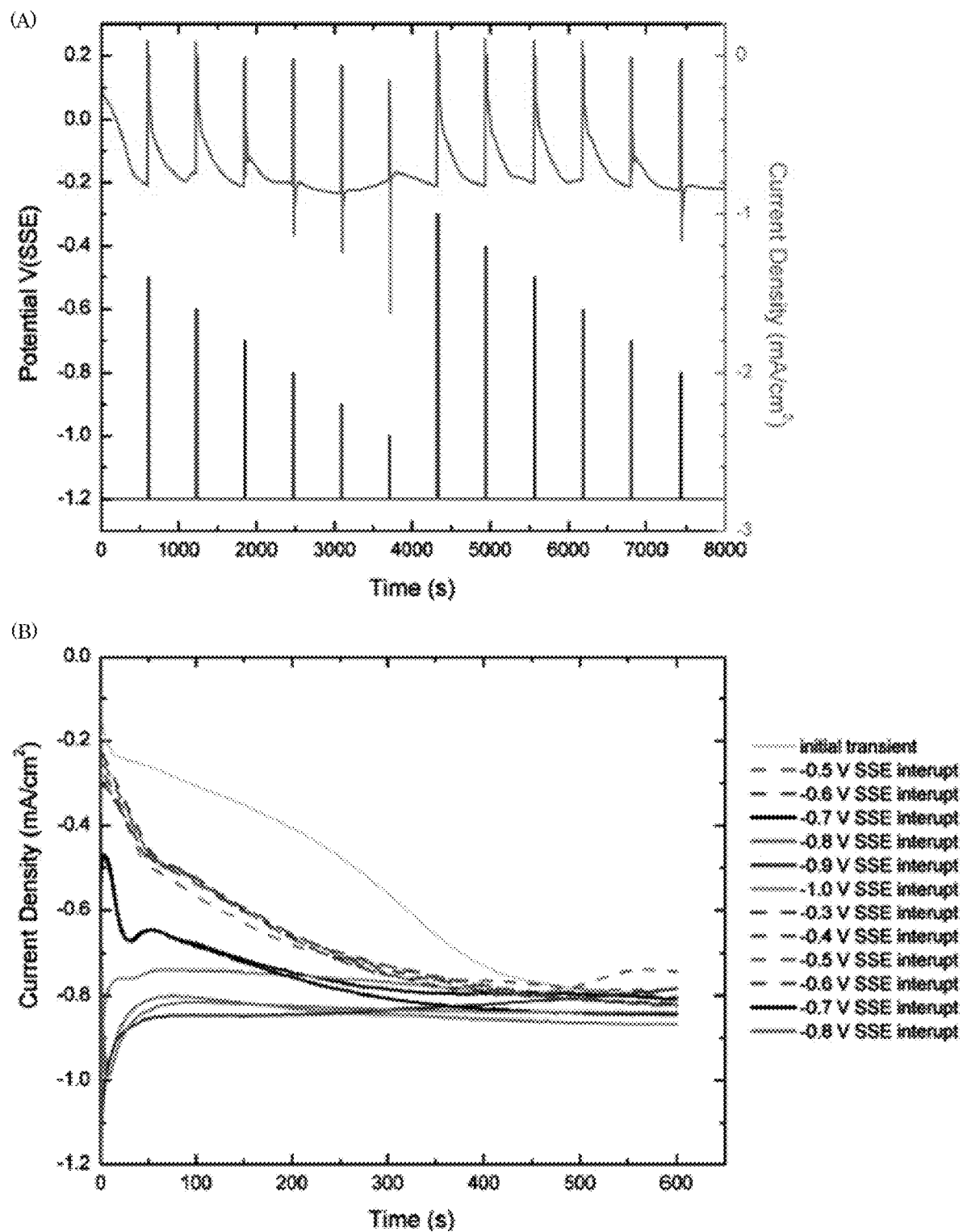
FIG. 20 shows (panel A) a graph of potential versus time in which current density observed during potential pulsing experiments in electrolyte containing 5 μmol/L $Pb(ClO_4)2$ with the applied potential history overlaid. The 10 min transients at −1.2 V following each 20 s pulse at the indicated potentials manifest the impact of the pulse on lead adsorbed during the previous transient. Panel B shows a graph of current density versus time in which transients at −1.2 V are overlaid starting at zero time.
Figure 21:
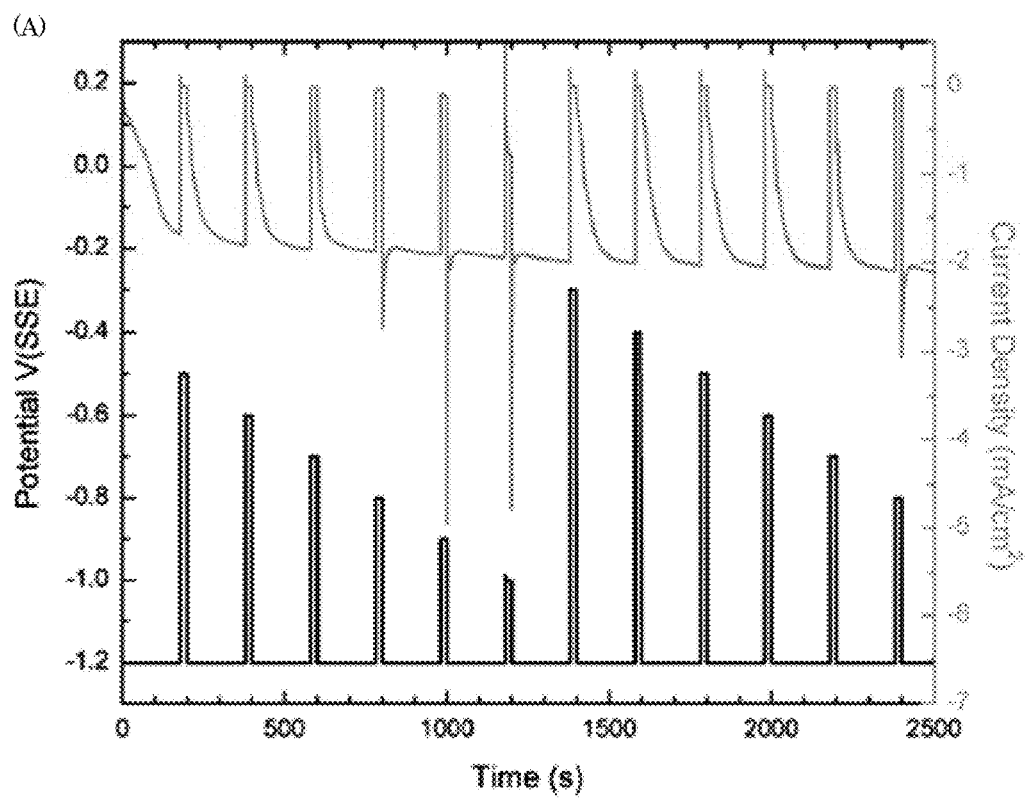
FIG. 21 shows (panel A) a graph of potential versus time for current density during potential pulsing in electrolyte containing 25 μmol/L $Pb(ClO_4)_2$ with applied potential history overlaid. The 3 min transients at −1.2 V following each 20 s pulse at the indicated potentials manifest the impact of the pulse on lead adsorbed during the previous transient. Panel B shows a graph of current density versus time in which transients at −1.2 V are overlaid starting at zero time.
Figure 21:
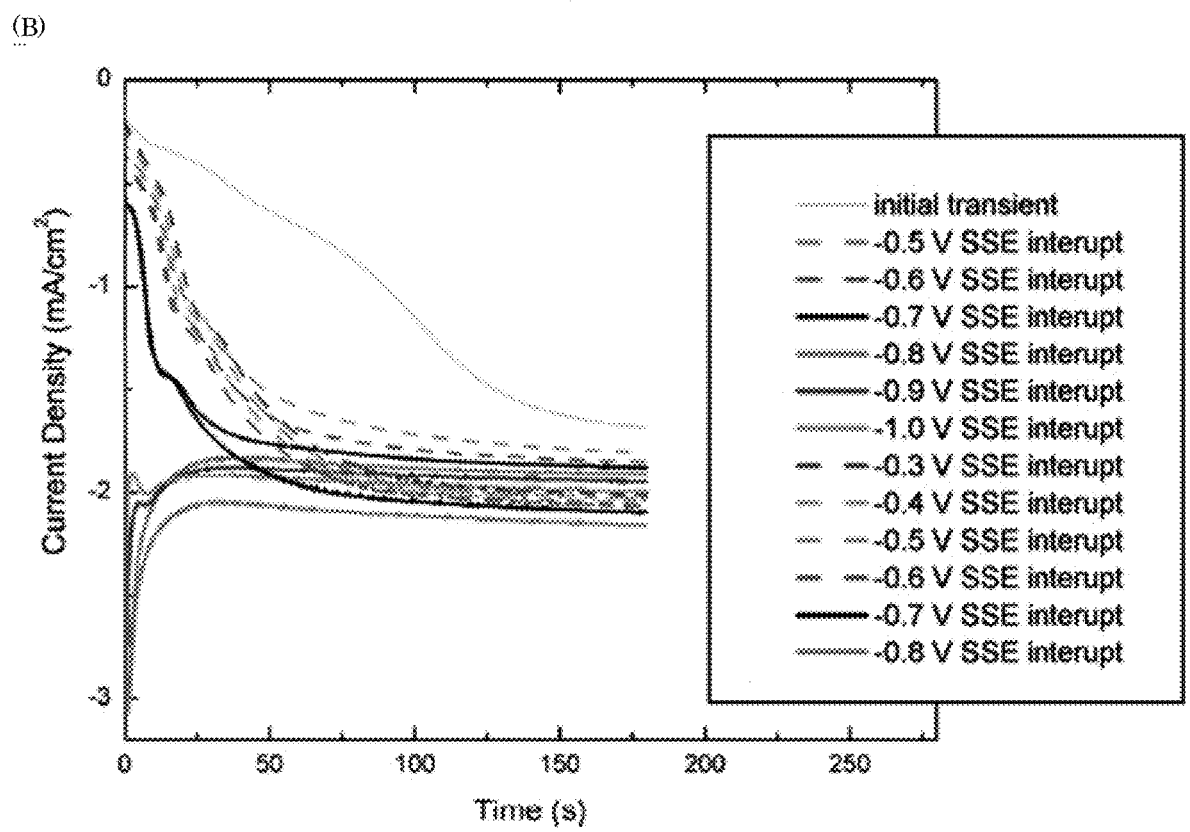

The results in FIG. 20 and FIG. 21 are consistent with the current densities in successive negative-going sweeps of multicycle voltammograms (not shown) that duplicate the first negative-going sweeps (shown in FIG. 18). Specifically, the data in all three figures indicate the impact of Pb adsorbate coverage is substantially reduced at −0.7 V from that at −1.2 V and entirely eliminated at −0.6 V and above.

Feature Filling

All feature filling was initiated with a 5 s pulse at −1.5 V, to obtain high nucleation density and protect the Cu seed from corrosion, followed immediately by deposition at the indicated potential for the indicated time. Without the initial step the Cu seed corroded through galvanic displacement.

Figure 22:
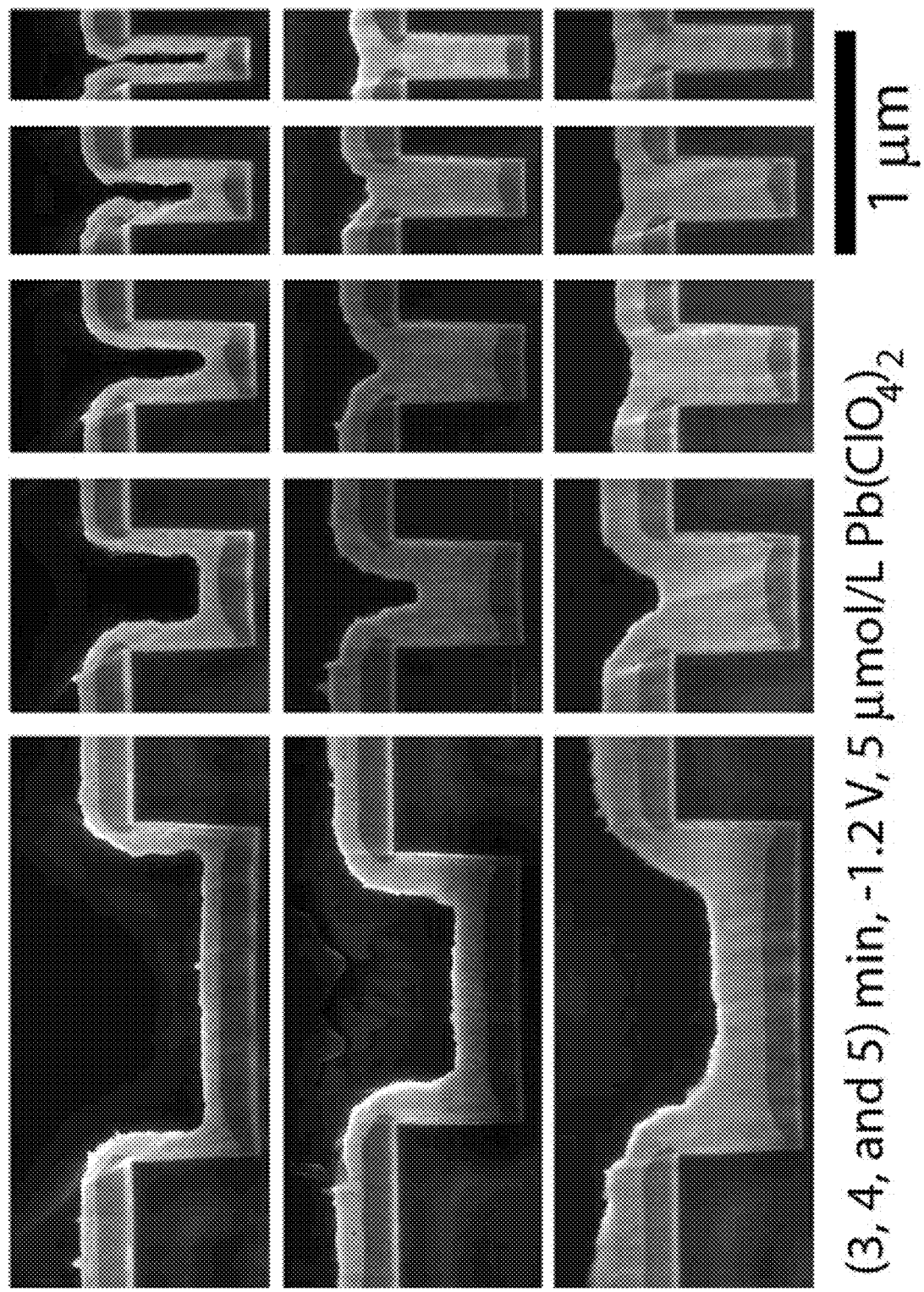
FIG. 22 shows sequential filling of trenches ranging from greater than 1 μm to ≈0.2 μm wide at −1.2 V with 5 μmol/L $Pb(ClO_4)_2$. Deposition times for the top panels to the bottom panels are indicated at the bottom of the figure.
Figure 23:
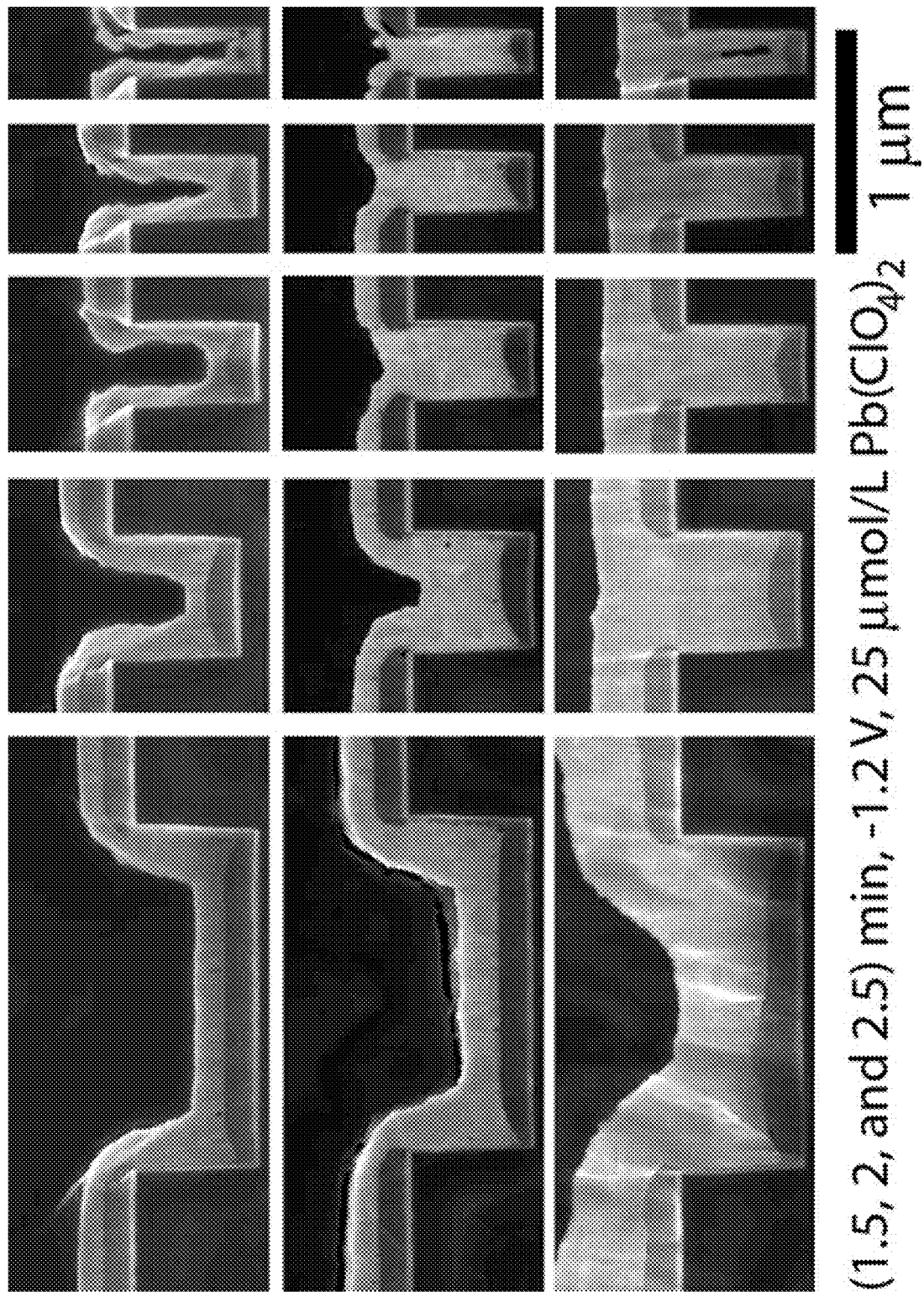
FIG. 23 shows sequential filling of trenches ranging from greater than 1 μm to ≈0.2 μm wide at −1.2 V with 25 μmol/L $Pb(ClO_4)_2$. Deposition times for the top panels to the bottom panels are indicated at the bottom of the figure.
Figure 24:
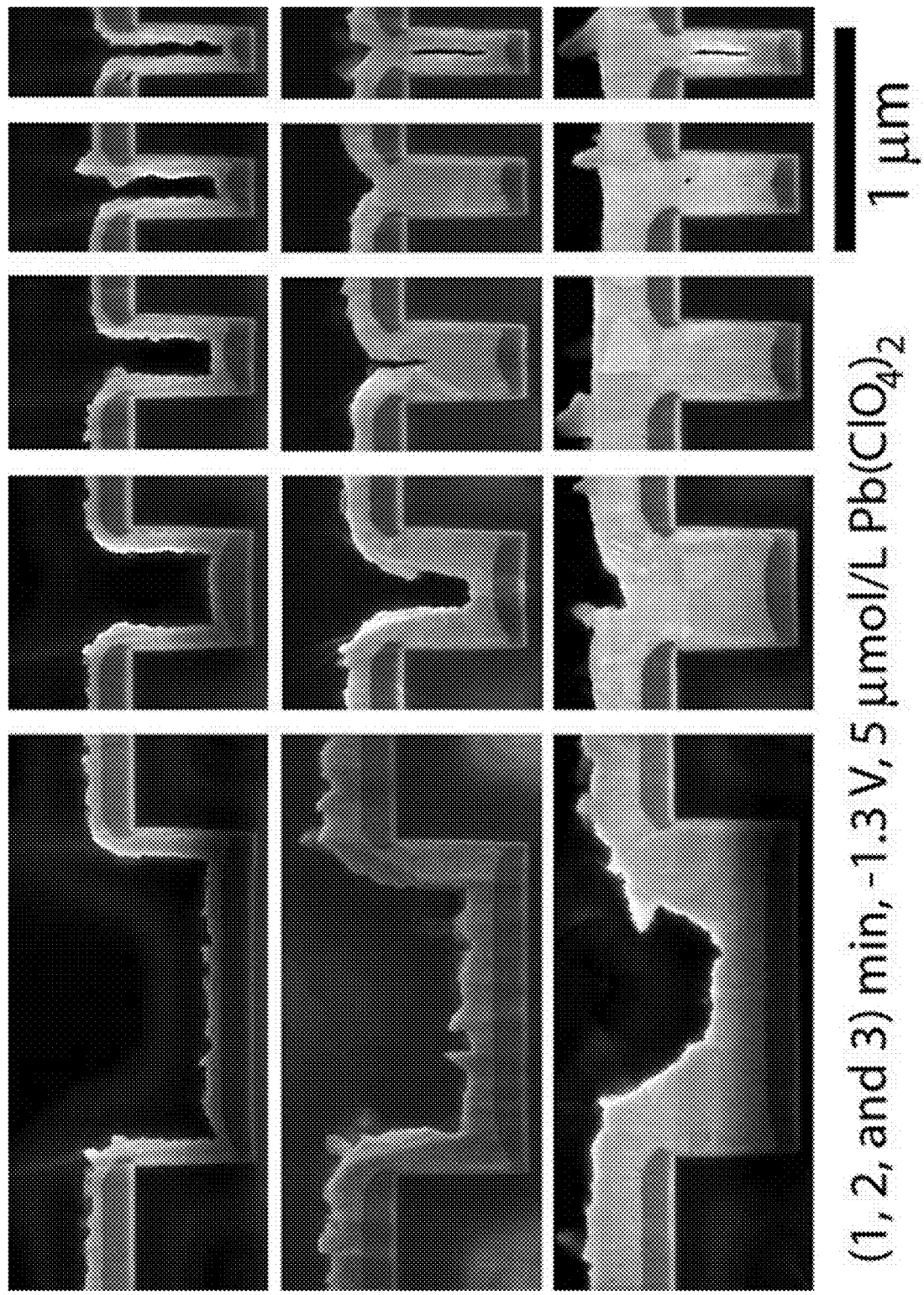
FIG. 24 shows sequential filling of trenches ranging from greater than 1 μm to ≈0.2 μm wide at −1.3 V with 5 μmol/L $Pb(ClO_4)_2$. Deposition times for the top panels to the bottom panels are indicated at the bottom of the figure.
Figure 25:
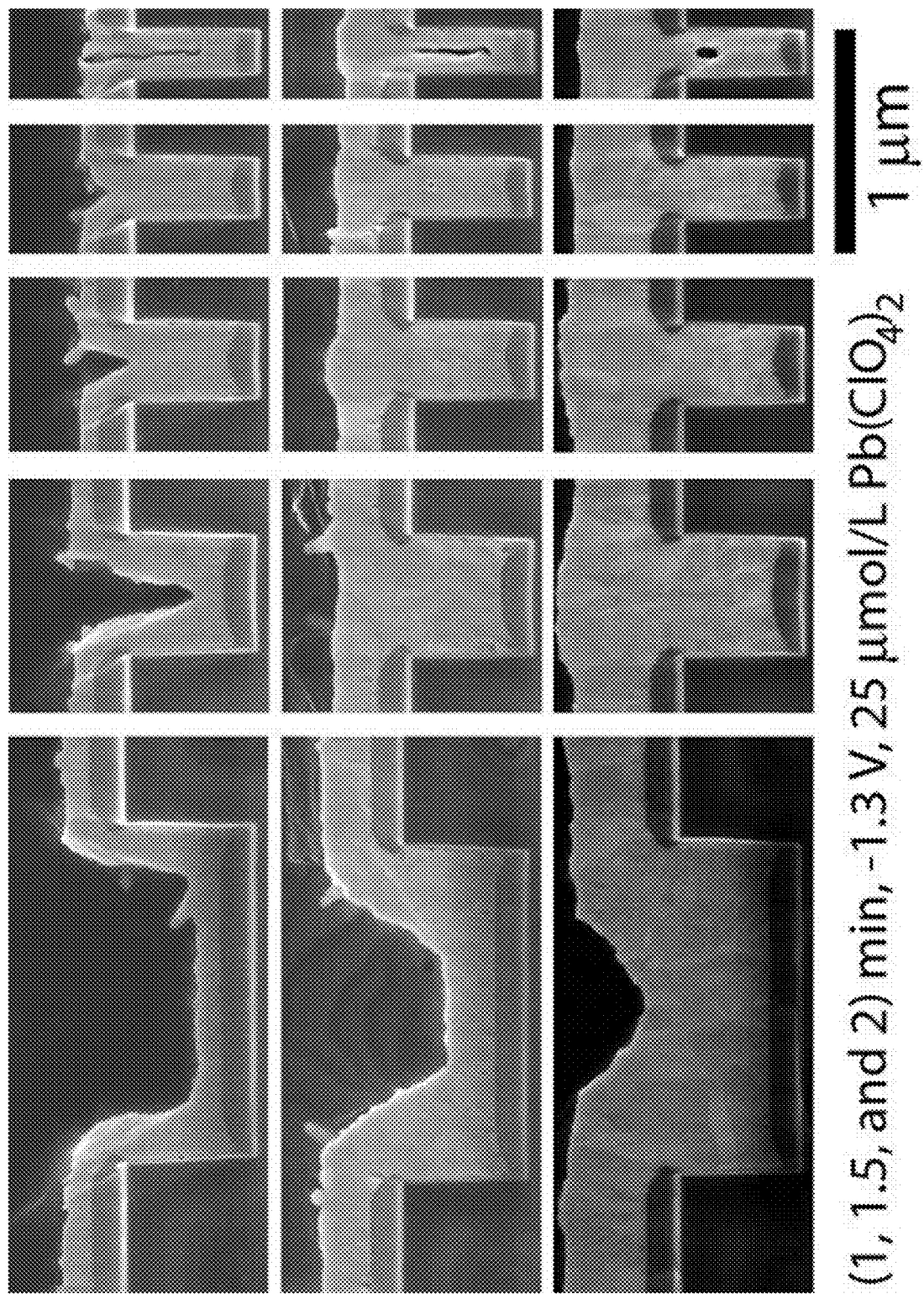
FIG. 25 shows sequential filling of trenches ranging from greater than 1 μm to ≈0.2 μm wide at −1.3 V with 25 μmol/L $Pb(ClO_4)_2$. Deposition times for the top panels to the bottom panels are indicated at the bottom of the figure.

FIG. 22 and FIG. 23 show the evolution of Au deposition at −1.2 V in different width trenches with concentrations of 5 μmol/L Pb(ClO$_4$)$_2$ and 25 μmol/L Pb(ClO$_4$)$_2$, respectively. FIG. 24 and FIG. 25 show evolution of Au deposition at −1.3 V with concentrations of 5 μmol/L Pb(ClO$_4$)$_2$ and 25 μmol/L Pb(ClO$_4$)$_2$, respectively. Deposition times were adjusted to capture trench filling given the faster deposition at more negative potential and/or higher additive concentration. Variable voiding within the narrower trenches is, in part, due to roughness associated with instability in the filling process.

Predicted and previously observed manifestations of the CEAC mechanism in multiple superfilling systems are evident: an "incubation period" of conformal growth (appropriate for no initial adsorbate coverage), inception of superfill through enhanced deposition at the bottom corners of the trench (locations of highest curvature), the signature bottom-up filling that earned the process its moniker and the overfill bumps referred to as "momentum plating". Deposition at −1.2 V also yields deposits consistent with CEAC smoothing.

Faceted whiskers indicative of morphological instability are evident at the shortest deposition times for all four conditions (FIG. 22, FIG. 23, FIG. 24, and FIG. 25), although relatively few are evident for lower driving force and higher additive concentration (FIG. 23). The whiskers have disappeared by the longest deposition times, except at the higher driving force and lower additive concentration (FIG. 24). These results are consistent with, and explain, the current transients in FIG. 19. Specifically, the asymptotic behavior manifests deposition accelerating with adsorbate coverage to steady state values on stabilized planar surfaces. Thus, the deposits initially roughen under the small gold ion concentration gradients (at the initially slow deposition rates) then smoothen with accumulation of adsorbate despite the substantially larger concentration gradients induced by the correspondingly faster deposition. This is an additional demonstration of CEAC stabilization of planar growth during deposition that is broadly general although the topic of only two studies.

Superfilling is most evident for conditions where there is both substantial hysteresis in the cyclic voltammetry (FIG. 18) and asymptotic behavior in the chronoamperometry (FIG. 19). Superfilling at −1.3 V with 5 μmol/L Pb(ClO$_4$)$_2$ (FIG. 24), conditions for which there is minimal hysteresis and any asymptotic behavior is masked by the instability, is only obvious in the widest trench at the longest deposition time. Consistent with the CEAC mechanism, the possibility of accelerated and non-accelerated surfaces as well as conditions (i.e., additive concentrations and feature filling times) that permit adsorption and area change to achieve this differentiation during feature filling are necessary for superfill.

Deposition times for feature filling were generally such that corresponding current densities on planar substrates were significantly below the gold ion transport limit (FIG. 19). This is because interface kinetics must dominate if superfilling by the CEAC mechanism is to occur. It is also significant that the additive concentrations are of the same order as those in other superfilling chemistries for similar feature sizes and filling times. This is because a fraction of a monolayer of additive must adsorb on the surface over the course of feature fill for effective CEAC-based superfill.

Surface diffusion of the CEAC-redistributed adsorbate, previously shown to explain the rounded contours of Au superfilling in cyanide electrolyte as opposed to the sharp corners observed in Cu superfill might also be surmised to explain the more limited rounding evident in FIG. 22, FIG. 23, FIG. 24, and FIG. 25. However, the potential- and concentration-dependent saturation coverage of the adsorbate indicated by the data in FIG. 18, FIG. 19, FIG. 20, and FIG. 21 might also explain these more subtle aspects of the feature filling. Well recognized in the cited studies on planar substrates, such behavior has not been previously included in CEAC superfilling models. Additional measurements and quantitative modeling are required to evaluate the relative influences of surface diffusion and concentration-dependent saturation coverage on these feature filling results.

Optimizing adsorbate coverage for superfill generally requires additive concentration scale inverse to feature size to ensure appropriate accelerator coverage is reached during the feature size-dependent fill time. In this system in particular, for the lower additive concentration required for larger features, CEAC-induced coverage increase might be countered by desorbtion where such enhanced coverage exceeds the correspondingly low equilibrium coverage, diminishing or eliminating CEAC-induced superfilling.

Such concerns notwithstanding, the potential-dependent saturation coverage indicated by FIG. 20 and FIG. 21 suggests a means to obtain uniform coverage of adsorbate on a substrate of arbitrary geometry, accompanied by minimal metal deposition, before feature filling begins. A two-step derivatization process that eliminates the incubation period of conformal growth by first adsorbing the accelerator in additive-containing electrolyte prior to metal deposition in a second electrolyte has previously been demonstrated for both silver and copper superfilling systems. However, the transport-limiting nature of that derivatization process suggests limitations to the size and aspect ratios of features for which it might be used, and transfer between the two electrolytes complicates processing. In contrast, pulsing to an appropriate potential, e.g., −0.7 V in the electrolyte of this study, will yield uniform, saturation adsorbate coverage throughout even the highest aspect ratio feature. Feature filling could then be achieved at a more negative potential. One might also consider pulses during deposition to reset adsorbate coverage, for example, to reduce associated metal ion depletion or overfill bump formation.

Bottom-up superfill of Au has been demonstrated in sub-micrometer trenches using Pb upd as an accelerator in a $Na_3Au(SO_3)_2$ electrolyte. The system exhibits rising chronoamperometric transients and hysteretic voltammetry that are ubiquitous characteristics of superfilling electrolytes. Feature filling is accompanied by surface evolution that reflects enrichment of the Pb upd accelerator on surface segments where area reduction occurs, including growth from the bottom trench corners, v-notch formation, upward accelerating flat bottom surface and bump formation. For application beyond the Damascene feature filling demonstrated herein pulse plating might be used to reset the accelerated gold deposition to specific accelerated, or unaccelerated, rates by stepping the potential to appropriate values. This has implications for processing across other materials systems.

Comparative Example B. Extreme Bottom-Up Filling of Through Silicon Vias and Damascene Trenches with Gold in a Sulfite Electrolyte Superconformal Au deposition is demonstrated in a $Na_3Au(SO_3)_2$ based electrolyte that exhibits critical behavior with addition of the deposition-rate suppressing additive polyethyleneimine (PEI). The critical behavior results from s-shaped negative differential resistance that is stabilized by the resistive electrolyte as evident in hysteretic cyclic-voltammetry. Specifically, the hysteretic potential range indicates conditions under which two states can exist: one in which adsorbed PEI suppresses gold deposition and the other in which ongoing gold deposition continues to disrupt and bury arriving suppressor. The specimen history determines the state observed. "Extreme" bottom-up filling of Through Silicon Vias (TSVs) and superconformal filling of submicrometer Damascene trenches are demonstrated and explained in this context.

Superconformal film growth by additive-based electrodeposition underlies Cu processing in state-of-the-art multi-level interconnect metallization for the silicon based semiconductor industry. On the other hand, electrodeposited Au remains the metallization of choice for interconnects and contacts in compound semiconductors and related optoelectronics applications. While the majority of these applications presently involve through-mask-electrodeposition, increasing circuit densification requires a move to three-dimensional metallization and complex interconnect structures. The implementation of Damascene processing requires Au electroplating chemistries that can provide void-free filling of recessed surface features. To date, three different Au electrolytes have been shown to be capable of void-free feature filling. One electrolyte utilizes an underpotential deposited (upd) Pb process to accelerate Au deposition from $KAu(CN)_2$-based chemistry; a second chemistry uses a similar upd Pb process to accelerate Au deposition from a $Na_3Au(SO_3)_2$-based electrolyte. Both of these electrolytes provide "superfill" and void-free feature filling in accord with Curvature Enhanced Accelerator Coverage (CEAC) models that account for coupling of the rate-acceleration and mass conservation of the surfactant in the presence of electrode area change. The third electrolyte is a commercial sulfite-based Au electrolyte to which mercaptopropane sulfonic acid (MPS) has been added. Electroanalytical measurements indicate that the MPS serves as an inhibitor, with feature filling attributed to traditional leveling; i.e., additive incorporation in the deposit yields an MPS concentration gradient within the filling feature, the decreasing suppressor concentration inducing a smoothly varying, monotonic increase of metal deposition rate down the feature.

This comparative example describes Au deposition from an electrolyte containing a deposition-rate suppressing additive, in this case polyethyleneimine (PEI). However, as will be detailed, the electrochemical signature and Au deposits, particularly within filling TSVs, are consistent with the recently detailed two-state "extreme" bottom-up filling of TSV rather than traditional leveling. The mechanism derives from s-shaped negative differential resistance (S-NDR)

observed in cyclic voltammetry (CV) measurements of suppressor-containing electrolyte. In particular, over a limited range of deposition potential two states can exist: one in which adsorbed PEI suppresses gold deposition and the other in which ongoing gold deposition continues to disrupt and bury arriving suppressor. The spatial distribution of the bifurcation between the two states is coupled to the distributed electrolyte resistance within the deposition system. Temporal evolution of the gradient of suppressor within the feature dictates the geometrical distribution of the suppressed and active regions. This same mechanism was also suggested to explain superconformal filling of Damascene trenches by Cu as well as iron group alloys in resistive, additive-suppressed electrolytes and to underlie the symmetric butterfly pattern Cu deposits reported in through-holes.

Sulfite electrolytes are environmentally friendlier than cyanide. While they suffer from disproportionation, $SO_2$ formation, and/or dithionite-based decomposition in acidic media, the electrolyte instability can be mediated with additives, e.g., ethylenediamine, and/or electrolyte modification, i.e., thiosulfate, extending operation to pH values as low as 4.0. Sulfite plating baths exhibit constrained kinetics at least partly associated with the formation of inhibiting species on the surface. There has been substantial study of the lifting of such native inhibition because of the role that such depolarization plays in the formation of bright, smooth deposits. However, inhibition as studied herein is more relevant for filling of TSVs because it benefits from gradients of additives that are to be anticipated during filling of tall features.

Experimental

The depositions detailed in this comparative example use an industrial aqueous gold sulfite source ($Na_3Au(SO_3)_2$ dissolved in $H_2O$ stated to contain 2 troy ounces of gold per liter, equivalent to 0.32 mol/L (197 g/mol gold and 31.1 g=1 troy ounce). This solution was used in its undiluted form as the working electrolyte. Supporting electrolyte was omitted because higher electrolyte resistivity favors extreme bottom-up feature filling and process control with the otherwise unstable processes. Deposition studies were conducted in a cell containing approximately 60 mL of the 0.32 mol/L $Na_3Au(SO_3)_2$ electrolyte with additions of aliquots drawn from a 10 mmol/L PEI made from 1800 MW PEI diluted in 18 MΩ·cm water. The electrolyte pH was 9.0, as determined using a pH electrode calibrated to buffer solutions of pH 7.0 and pH 10.0.

Cyclic voltammetry and chronoamperometry were performed on 100 nm thick planar Au films prepared by electron beam evaporation on Si wafers. The electroanalytical screening studies were performed under quiescent conditions; the vertical orientation of stationary substrates results in density-gradient-driven convection as the $Au(SO_3)_2^{3-}$ in the boundary layer is depleted by deposition. Feature filling experiments were conducted with the patterned specimens held in the same orientation but rotating at 160π rad/min (80 rpm) with the rotation axis oriented vertically within the plane of the specimen unless otherwise indicated. The electrolyte was at room temperature (≈23° C.) under a covering flow of nitrogen during deposition. A saturated $Hg/Hg_2SO_4$/saturated $K_2SO_4$ reference electrode (SSE) was used for all experiments. The reference electrode was connected to the working electrode compartment using a fritted salt bridge filled with saturated solution of potassium sulfate. A platinum counter electrode was held in a frit-separated cell immersed within the main cell. Nitrogen sparging was used to remove dissolved oxygen. Depositions were performed at controlled applied potential.

The planar substrates were masked with plater's tape to expose a circular region 0.54 cm² in area; current densities are obtained from the measured current divided by this area. Feature filling was studied on fragments of patterned wafers. A wafer with TSVs, already coated with ≈2 μm thick Au seed in the field, and a lesser amount on the features side walls, thicker toward the top, was provided for this study by Hughes Research Laboratory. The ≈50 μm deep TSVs have a square cross-section ≈30 μm on a side.

Electrochemical Measurements on Planar Substrates

Figure 26:
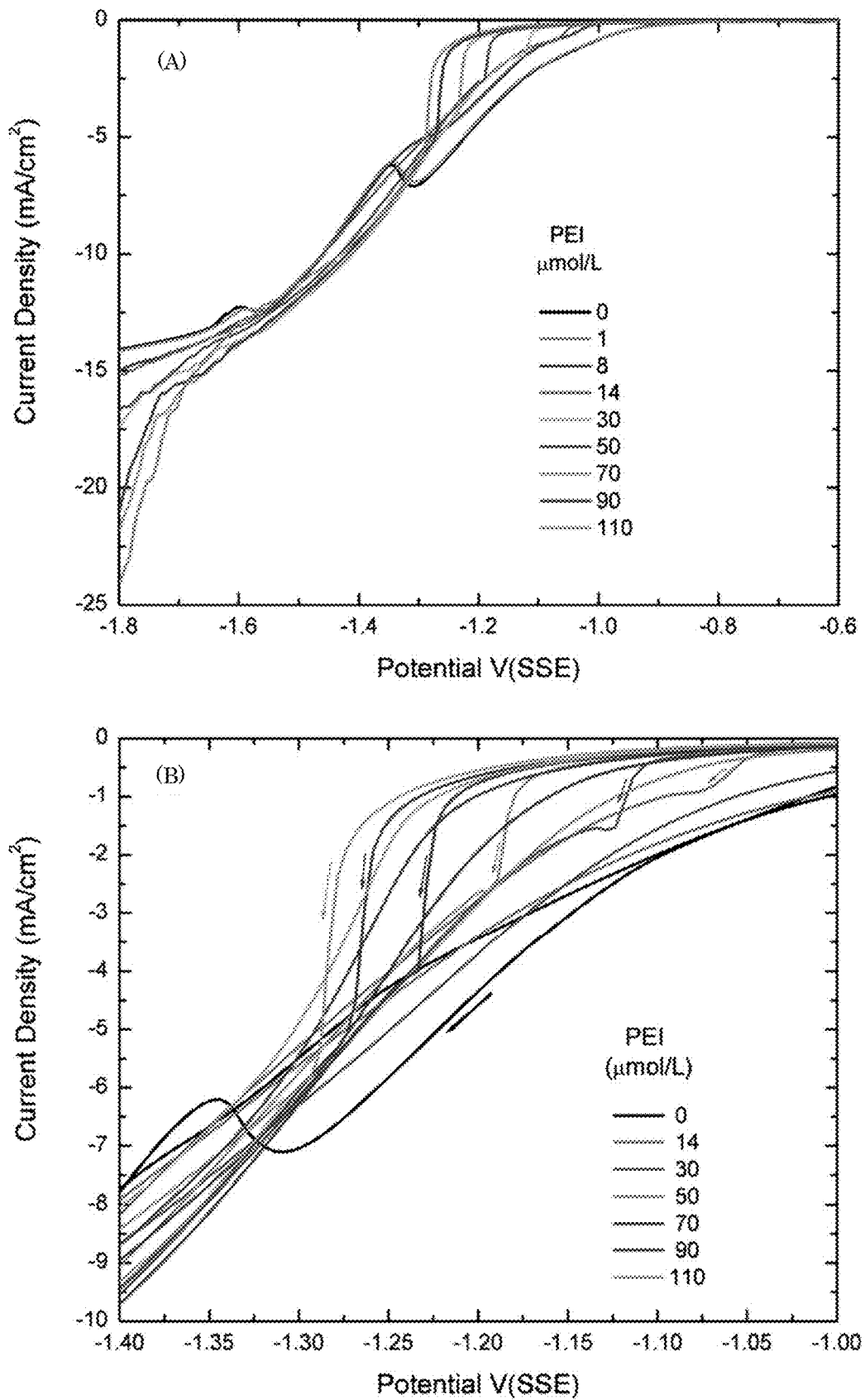
FIG. 26 shows graphs of current density versus potential for cyclic voltammograms showing deposition current density during cycling of the applied potential from −0.6 V to −1.8 V and back at 2 mV/s in gold sulfite electrolyte containing the indicated concentrations of PEI. Panel a shows negative-going sweeps over the full potential range. Panel B shows negative-going (arrows) and subsequent positive-going sweeps in the potential range around the critical potential. All potentials are relative to SSE. Deposition is at room temperature without agitation of the electrolyte.

FIG. 26a shows the negative-going sweep of cyclic voltammograms (CV) capturing the dependence of current density on applied potential for a range of PEI concentrations; FIG. 26b shows both the initial negative-going and subsequent positive-going sweeps in an expanded view of the central range of potentials. For the additive-free case a wave between −1.3 V and −1.4 V is observed; the film roughened visibly passing through this potential range, so that increased current density on the return sweep is due, in part, to area expansion. The Au deposition is constrained by transport at potentials negative of approximately −1.5 V, with a diffusion limited current density of approximately 14 mA/cm²; hydrogen bubbles form at more negative potential. Addition of PEI decreases the deposition rate over a range of potentials on both the negative-going and positive-going sweeps; mirror-like deposits were obtained at the highest concentrations. At PEI concentrations of approximately 8 μmol/L and higher, a critical potential is observed on the negative-going sweep, the current density transitioning from a passivated value to an active value over a few tens of mV. The critical value shifts to more negative potentials as the PEI concentration increases; inhibition of the Au deposition is strengthened by higher suppressor concentration so that higher driving force for the deposition must be supplied to break this inhibition.

In contrast, the subsequent positive-going sweep varies smoothly with potential. Evidently, PEI adsorbed at the slower deposition rates of less negative potentials retards Au deposition as the potential moves toward the critical value (i.e., hindering access and/or reduction of the $Au(SO_3)_2^{3-}$ at the interface); in contrast, the more rapid Au deposition at more negative potentials enables continued Au deposition (i.e., through burial of adsorbing suppressor) as the potential returns to values positive of the transition potential. The resulting hysteresis (e.g., from approximately −1.2 V to the transition at −1.28 V for 110 μmol/L PEI) suggests the possibility of a two-state system in this potential range. While not addressing the stability of the states, or any dependence on potential, the 35 s the scan takes to traverse the 70 mV width of the hysteretic region suggests the ongoing deposition can retard buildup of the blocking PEI layer for at least this long. Gas bubble formation at the perimeter of the substrate increased with higher PEI concentration, yielding an associated increase of the current density at the most negative potentials (FIG. 26a), the PEI serving as a pH buffer to some extent.

Figure 27:
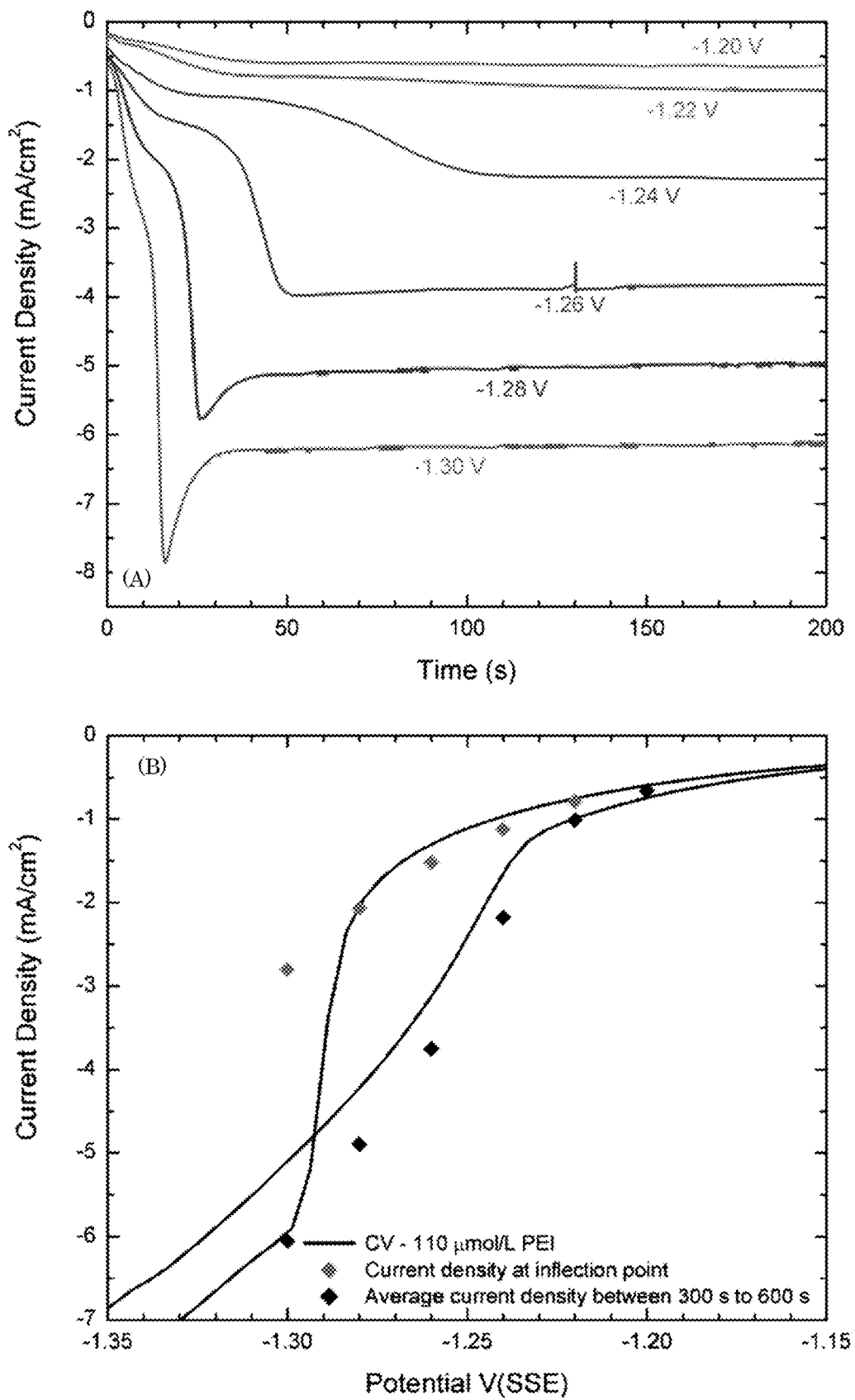
FIG. 27 shows (panel a) chronoamperometric measurements of current density at the indicated applied potentials. Concentration of polyethyleneimine (PEI) concentration in gold sulfite electrolyte is 110 μmol/L, and potentials are relative to SSE. Panel b shows values of current density at an inflection point associated with a first plateau and in a steady state overlaid on a portion of a cyclic voltammogram from −0.6 V to −1.5 V and back at 2 mV/s. Transition from passivated to active surface across the critical potential occurs from approximately −1.28 V to −1.3 V.

FIG. 27a shows chronoamperometric measurements of the deposition current density during deposition at potentials in the vicinity of the transition for the electrolyte containing 110 μmol/L PEI; potentials were applied within several seconds after immersion under open circuit conditions. In all cases the current density, reflecting the initial state of the substrate surface, accelerates over the first ≈10 s. Except for the curve at −1.20 V, each curve exhibits (the start of) a plateau at an intermediate rate for several seconds to several tens of seconds; the inflection point (minimum magnitude slope) associated with this plateau moves from 57 s to 42 s, 24 s, 15 s, and 10 s as the potential goes more negative. Acceleration to a steady state value, with relaxation of the boundary layer evident at the highest current densities, is observed thereafter. The current densities at the inflection and at the steady state (averaged from 300 s to 600 s) are overlaid on a CV scan in the same electrolyte. This CV scan was reversed at −1.5 V to reduce bubble formation and corresponding impact on the current density; in the hysteretic range −1.2 V to −1.3 V the return sweep is approximately 20% higher than the corresponding curve in FIG. 26 that was reversed at −1.8 V.

Figure 28:
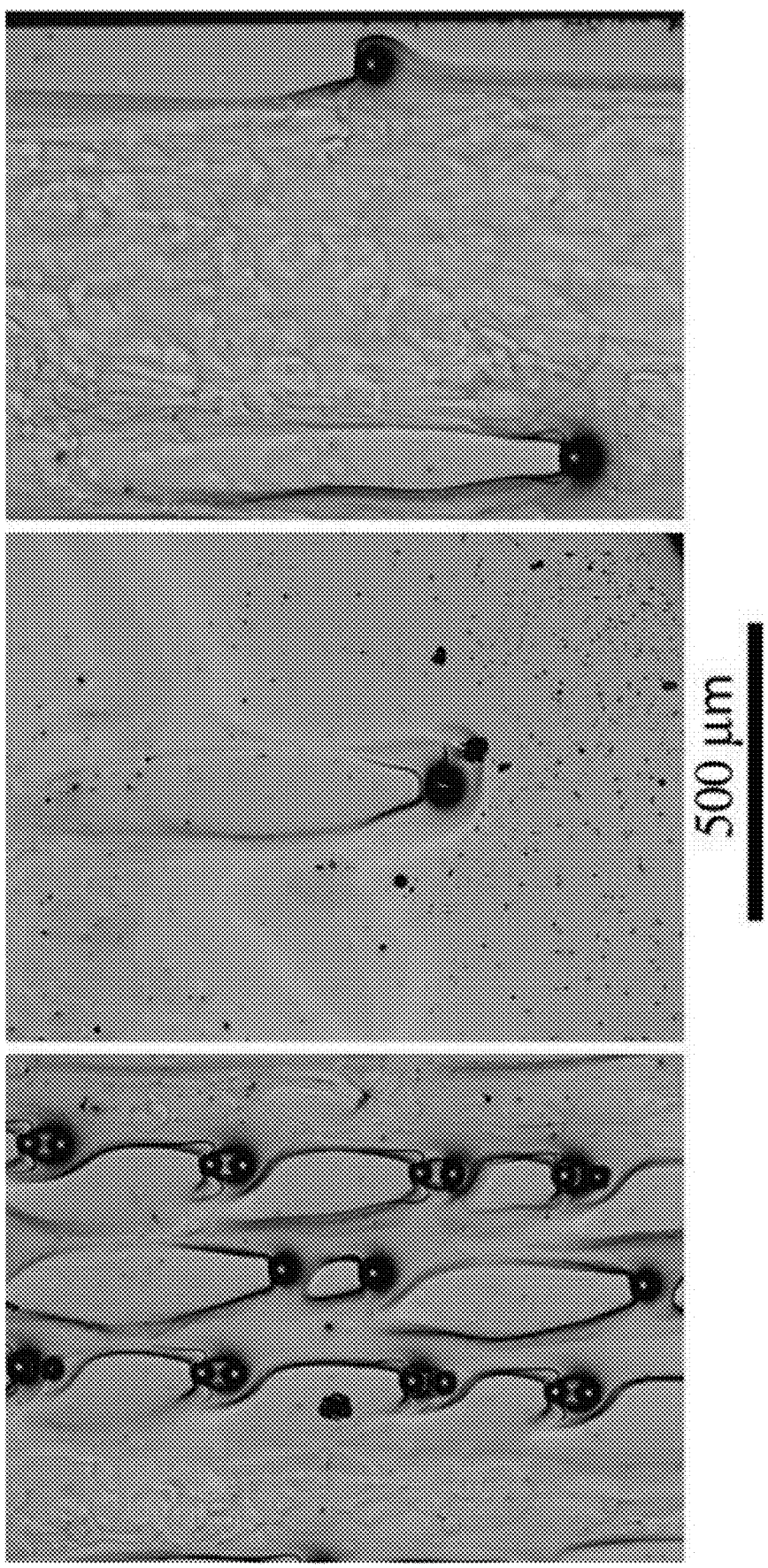
FIG. 28 shows an optical micrograph of deposition on patterned surfaces absent forced convection after 10 min deposition at −1.275 V in electrolyte containing 110 μmol/L PEI. The bottom of the images was toward the bottom of the cell during deposition and the middle image shows the specimen bottom.

FIG. 28 shows planview images of a deposit grown for 10 min at −1.275 V in electrolyte containing 110 µmol/L PEI, the additive concentration used in the feature filling study that follows; the images qualitatively capture the surface morphology of films grown in the hysteretic voltage range absent agitation. The deposit is smooth for approximately 1 mm from the bottom edge of the specimen, except near TSVs, beyond this the deposition rate decreases and localized islands of deposition consistent with bifurcation of the surface between the active and passive states are seen. The deposit morphology in the wake of TSVs, the smooth deposit at the bottom edge and the localized islands of deposition are evident, from left to right, in FIG. 28. The localization of deposition is related to the differing response times of the electric field and material transport processes within the system. High frequency impedance spectroscopy at −1.6 V determined the resistance between the reference and the working electrode (i.e., substrate) to be 9Ω; the associated iR potential drop for the milliampere currents (FIG. 27 using the electrode area) is a substantial fraction of the hysteretic potential range.

Such growth instabilities have been previously seen on planar deposits from the Cu electrolyte that yields extreme bottom-up fill of TSV and exhibits analogous hysteresis and critical behavior. A possible explanation for the transition from uniform deposition to unstable growth going up the planar substrates can be found in analysis of that Cu system; specifically, where two solutions to the equation for steady state adsorbate coverage do exist, changing the ratio of the suppressor and metal ion concentrations can change an unsuppressed surface to full coverage (and suppression), or vice-versa.

Rotation of the substrates during deposition yielded optically smooth deposits even for applied potential near the critical value. The unusual rotation smears pattern development by disturbing the electrical field and concentration gradients preventing formation of regions of enhanced/decreased adsorbate coverage even as it enhances $Au(SO_3)_2^{3-}$ and additive transport.

Feature Filling

Filling of the TSV was accomplished by pre-wetting with ethanol followed by immersion in the electrolyte at open circuit potential followed by prolonged, high speed rotation (at least 1 min at 400 revolutions per minute) to remove the alcohol from the features prior to application of the deposition potential. Without the alcohol predip air bubbles were frequently trapped in the TSVs.

Figure 29:
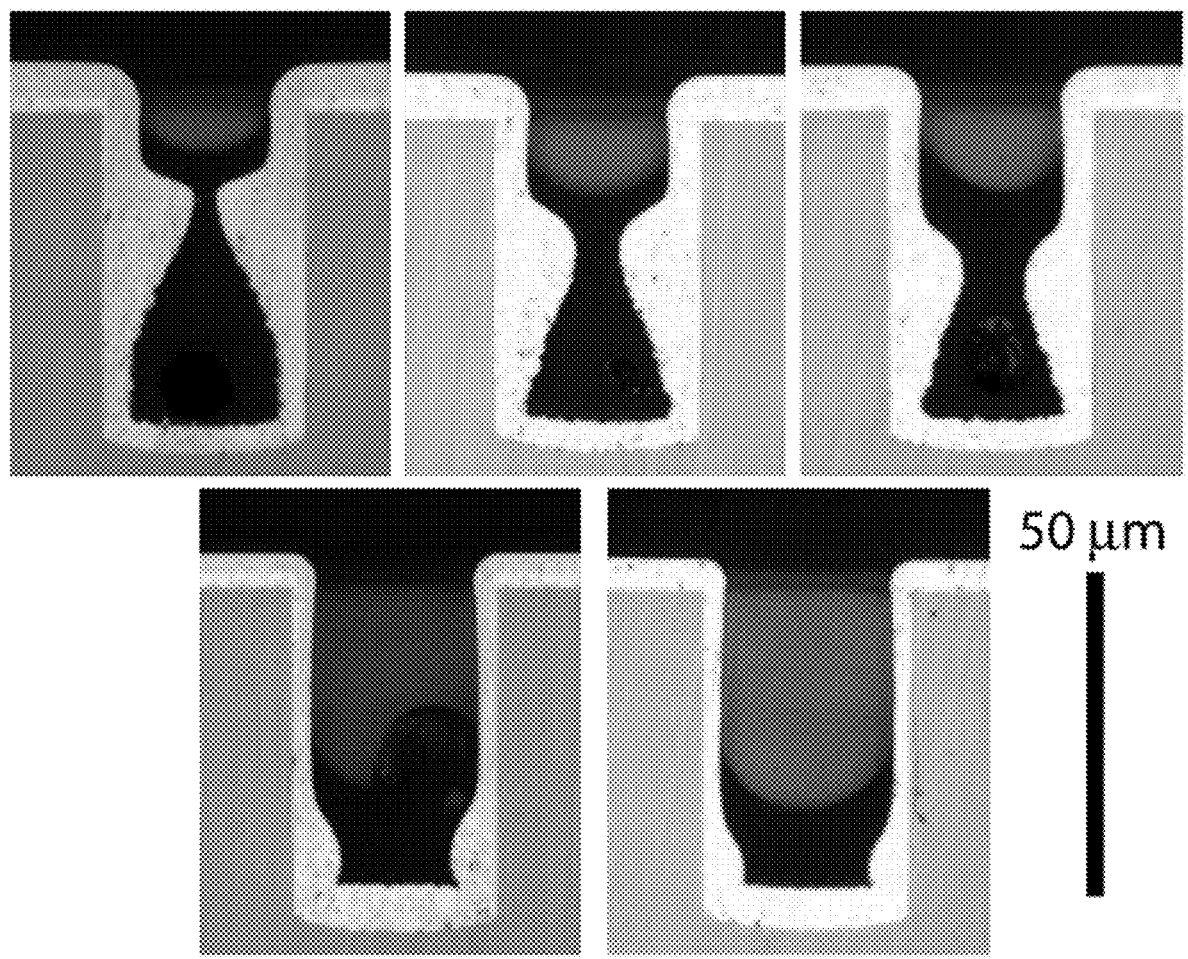
FIG. 29 shows partial filling of square cross-section through silicon vias (TSVs) in gold sulfite electrolyte with 110 μmol/L PEI is shown at deposition potentials from across the hysteretic range. From left to right: top row (−1.26, −1.25, −1.24) V and bottom row (−1.20, −1.19) V. The deposition time is 1 hour.

FIG. 29 shows partial filling of TSVs resulting from 1 hour of deposition at applied potentials ranging from −1.26 V to −1.19 V (within the hysteretic region) in the electrolyte containing 110 µmol/L PEI. Breakdown of the PEI suppression is evident in the substantial increase of deposit thickness, i.e., deposition rate, within the TSVs. The stronger suppression associated with PEI at less negative potentials enables suppression of the Au deposition farther down the features to the lower suppressor concentrations anticipated for the consumption induced concentration gradient. The comparatively gradual decrease of deposit thickness in the lower regions of the TSVs where suppression fails partway down suggests deposition in these regions is dominated by the gradient of gold concentration.

Figure 30:
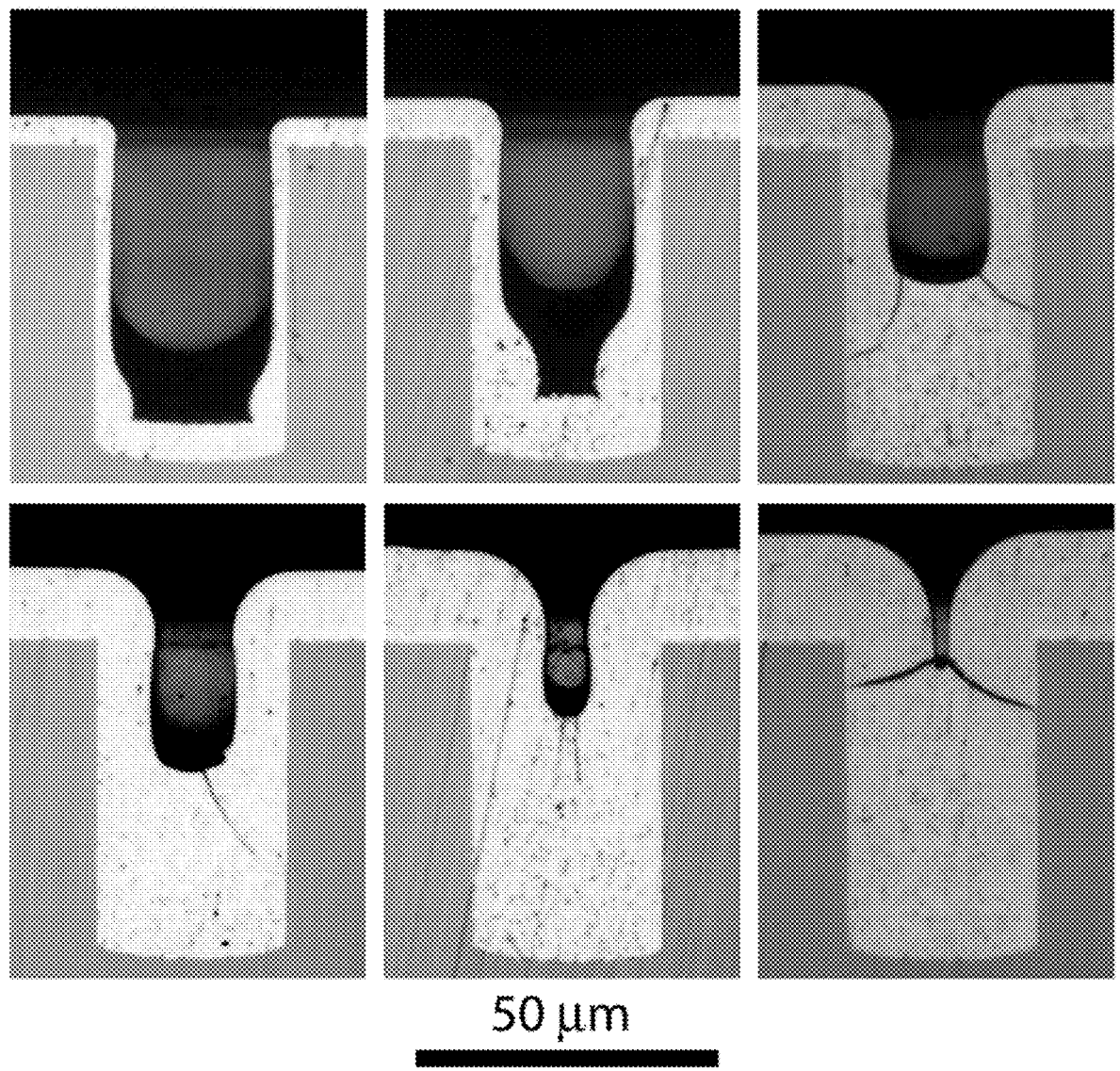
FIG. 30 shows sequential filling of the square cross-section TSVs in gold sulfite electrolyte with 110 μmol/L PEI at an applied potential of −1.19 V, wherein, from left to right, top row (1, 2, 3) hr and bottom row (4, 5, 6) hr.

FIG. 30 shows sequential filling of TSV's for deposition times from 1 hr to 6 hr at an applied potential of −1.19 V in the same electrolyte. This potential was selected because it yields deposition at the bottom of the feature in FIG. 29, consistent with defect-free filling. Cracking of the deposits possibly indicates that adsorbate burial embrittles the gold deposit. The superconformal filling continues throughout the first three hours required to fill the bottom half of the TSV. Deposition is more conformal thereafter, resulting in longer fill time and thicker deposit in the field over the TSV.

Figure 31:
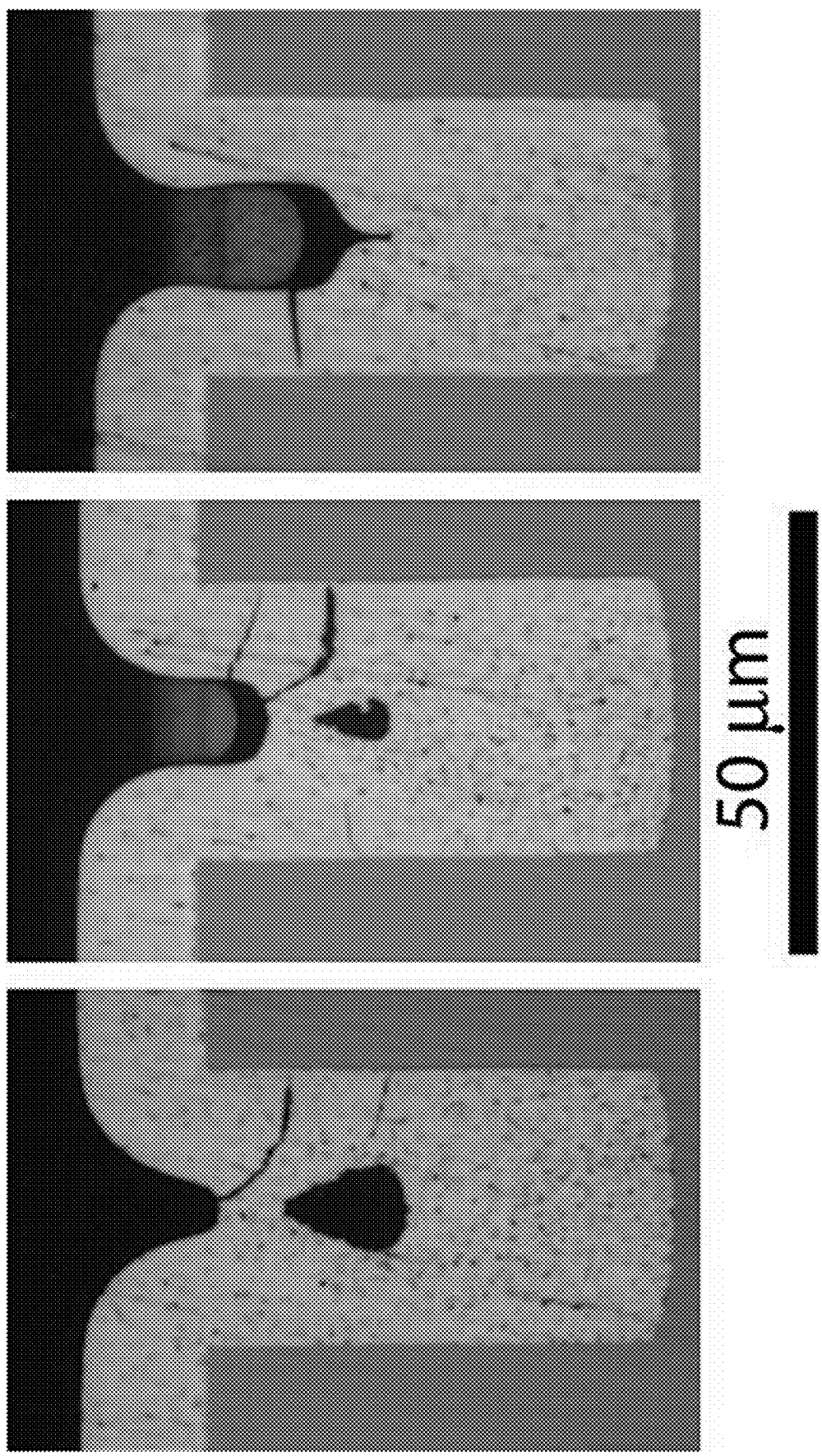
FIG. 31 shows filling of the square cross-section TSVs in gold sulfite electrolyte with 110 μmol/L PEI for total deposition times of 4 hrs. The applied potential is −1.19 V for 3 hours then (left to right: −1.25, −1.23, −1.21) V for 1 hour.

To avoid the transition to conformal filling, and thus reduce filling time, FIG. 31 shows the result of filling the bottom half by three hours of deposition at −1.19 V then depositing for one more hour at a more negative applied potential still within the hysteretic region. The Au deposition (i.e., breakdown of suppression) moves upward in the last hour as compared to depositing for four hours at −1.19 V (as in FIG. 30). The Au deposition moves too high in the TSV for the fourth hour of deposition at −1.25 V, resulting in formation of a large keyhole void. A much smaller keyhole void is formed at −1.23 V, while only a small seam, possibly to be filled, is evident at −1.21 V.

Figure 32:
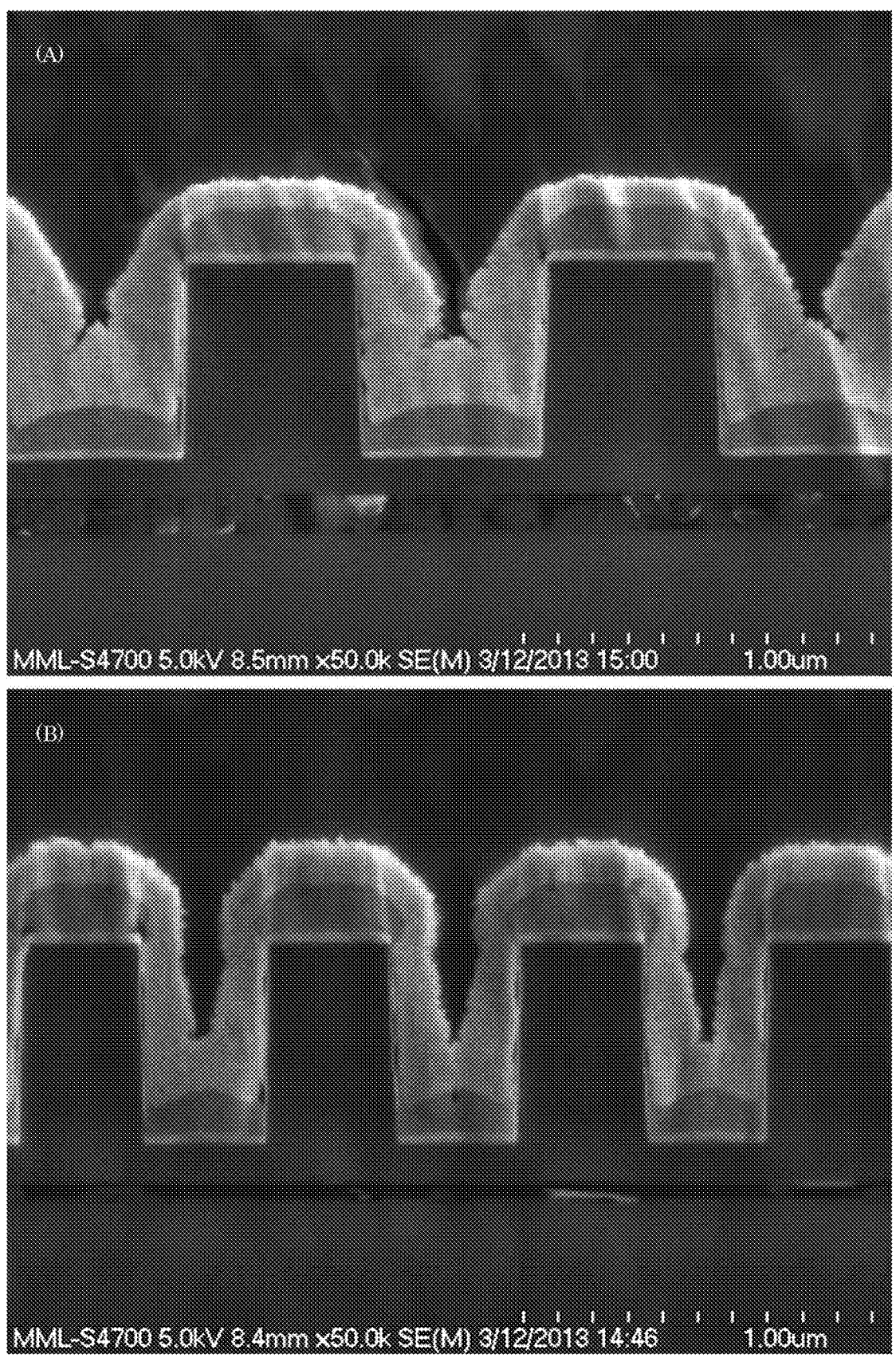
FIG. 32 shows gold deposition for 30 s at −1.275 V in gold sulfite electrolyte with 110 μmol/L PEI in damascene trenches with (panel a) lower and (panel b) higher aspect ratios.

Superconformal filling of submicrometer Cu-seeded trenches is shown in FIG. 32, also using the electrolyte with 110 µmol/L PEI. Deposition in the damascene trenches, with copper seed and Ta barrier already in place, was initiated with a 5 s pulse at −1.5 V, to obtain high nucleation density and protect the Cu seed from corrosion, 8 followed immediately by deposition at −1.275 V for 30 s. The porous deposits exhibit continuous increase of deposition rate going down the trenches, the feature filling geometry analogous to that in the previously noted studies of iron-group alloy deposition in additive-suppressed electrolytes.

The CEAC mechanism, while it has been observed and modeled at TSV length scales, is not at play here with a suppressing additive and enhanced deposition at locations independent of local curvature (e.g., FIG. 30). Neither can the characteristics of the filling observed in this work be explained by the established mechanism of traditional leveling as deposition does not decrease smoothly and monotonically down the TSVs. Rather, the sharp transition of deposition rate in the CV measurements and the inception of deposition toward the bottoms of features are consistent with the inhibition induced S-NDR mechanism developed to explain extreme bottom-up Cu deposition in TSV. Specifically, the coexistence of suppressed and unsuppressed surface states reflected in the hysteretic CV, coupled with a gradient of suppressor concentration within the filling features, yields the transition from passive to active surfaces moving down the TSVs. Potential drop through the electrolyte from the control point (reference electrode) to the substrate (working electrode) provides an electronic control point within the S-NDR region, enabling bifurcation into active and passive regions, effectively stabilizing the process.

In contrast to the results for Cu filling of TSV, the Au deposition rate in the "off" state is still significant. Evident in the negative-going sweep of the CV measurements, this is also captured in the current density at the inflection points as summarized in FIG. 27b. With the steady state values representing the "on" state, for the conditions of the feature fill presented herein, the "on" deposition rate is only approximately twice the "off" value of the current density at the inflection point for this particular electrolyte. There is thus substantial deposition even on the nominally passivated field over both TSVs and trenches. This contrasts with the absence of visible deposit on the field over identical trenches during nickel deposition in acidic electrolyte with much lower concentrations of suppressing PEI. 22 The inhibition of PEI is expected to change with protonation, so that, other things being equal, lower pH Au solutions might exhibit improved suppression at lower PEI concentrations and reduced additive incorporation in the deposits given due care to the chemical stability of the electrolyte.

The Au filling contrasts with the case of extreme bottom-up Cu filling of annular TSV in that the ratio of "on" and "off" deposition rates was orders of magnitude higher with the Cu deposition. The Cu filling also involved unsuppressed deposition current densities whose absolute values were nearly an order of magnitude higher than those here; the $\approx 1$ mA currents associated with Au fill on the TSV die fragments yield a potential drop from the applied value of $\approx 10$ mV across the 9$\Omega$ cell resistance. As a result of both effects, the iR potential drop in these filling experiments does not vary the overpotential available for deposition at the substrate as substantially during feature filling. It is thus likely for these reasons that the strict localization of deposition at the bottom of the feature and upward progress of filling observed at fixed applied potential with the Cu are not observed here. The images in FIG. 31 do, however, show that an analogous bottom-up filling can be accomplished by manual adjustment of the applied potential over time.

One might confuse the Damascene filling images in FIG. 32 with traditional leveling because of the monotonic increase of deposition rate down the trenches. However, no physically sound implementation of traditional leveling can yield a sufficiently steep gradient of suppressor concentration down a 1 µm deep trench given a boundary layer that is at least two orders of magnitude larger. Rather, as with the TSVs, the filling pattern reflects the nonlinear behavior associated with the distributed electrical conditions between the suppressed and unsuppressed surfaces that is reflected in the hysteretic CV measurements.

Modeling quantifies observed effects in terms of metal ion and suppressor concentrations, applied potential and the electrical and transport characteristics of the cell in order to provide a-priori predictions of feature filling. Evaluation of kinetic factors for such modeling will need to remove ambiguity associated with non-planar deposition on planar substrates (FIG. 28); however, it is possible that rotation will, by itself, eliminate this problem while transport within the features remains comparatively unperturbed. The absence of modeling notwithstanding, it is evident that the TSV filling detailed herein complements the highly localized, extreme bottom-up deposition previously detailed and modeled for Cu filling of TSV.

Bottom-up superfill of Au has been demonstrated in this comparative example in 50 µm deep re-entrant TSV and sub-micrometer trenches using PEI as a suppressor in a $Na_3Au(SO_3)_2$ electrolyte, which will be appreciated to be different than the superconformal filling composition described in the Detailed Description and Example. The electrolyte exhibits hysteretic S-NDR behavior in cyclic voltammetry. Deposition shifts from passive to active surfaces over only a few tens of mV on the negative going sweep, with deposition on the return sweep remaining active to potentials positive of the critical value. The S-NDR mechanism coupled with the gradient of suppressor concentration within filling features yields variants of "extreme" bottom-up filling of TSV and superconformal filling of submicrometer Damascene trenches. Potential drop within the electrolyte, for applied potential in the hysteretic range, permits controlled deposition. The results presented here involve a high PEI concentration; filling in additive-stabilized sulfite and sulfite-thiosulfite electrolyte at lower pH are natural extensions and might be anticipated to permit lower impurity content. The results extend the generality of the previously detailed S-NDR behavior, linking "extreme" bottom-up Cu fill and superconformal Ni fill of features that differ in size by nearly two orders of magnitude, in a single electrolyte.

Comparative Example C. Morphological Transitions During Au Electrodeposition: From Porous Films to Compact Films and Nanowires Gold electrodeposition was studied in a sulfite electrolyte to which micromolar concentrations of $Tl_2SO_4$ were added. Hysteresis and a regime of negative differential resistance (NDR) evident in electroanalytical measurements are correlated with deposit morphology and interpreted through measurements of thallium underpotential deposition (upd). Deposit morphologies range from specular surfaces to highly faceted dendrite-like grains of moderate aspect ratio and, for potentials within the NDR region, sub-50 nm diameter, high aspect ratio 110 oriented single crystal nanowires. The nanowires exhibit an epitaxial relationship to the substrate that permits one step fabrication of surfaces densely covered with high aspect ratio nanowires having controlled orientations. The NDR and nanowires are a consequence of the non-monotonic relationship between Tl coverage and growth velocity; at low coverage Tl accelerates Au deposition while at higher coverage it inhibits deposition. Immiscibility of the Tl and Au supports on-going surface segregation during area expansion that accompanies nanowire growth leading to greater dilution of the additive coverage and more rapid growth at the nanowire tips, while the sidewalls remain passivated by a saturated Tl coverage. It should be appreciated that Tl is absent in the superconformal filling composition described in the Detailed Description and Example in which the superconformal filling composition provides advantageous and unexpected benefits.

Interest in nanostructures is driven by the unique properties associated with high surface area to volume materials that express quantum or mesoscale phenomena of importance to diverse subjects ranging from biology and medicine to optics and energy conversion. Of particular interest is the substantial literature on solution or vapor processing to yield a wide variety of nanostructures including high aspect ratio nanowires. Solution-based, chemical reduction processes are attractive because they are inexpensive and scalable. Subsequent processing involving particle packing and/or substrate interactions can lead to higher order organization and colloidal crystals. Alternatively, nanostructures can be grown on or in surfaces that have been shaped by lithography or other means to obtain control of orientation and/or placement. Electrochemical processing may involve through-mask plating in patterned templates or superconformal electrodeposition of metals and alloys including gold in high aspect ratio features. However, these processes require nanoscale patterned topography to create such structures and the associated patterning often comes with increased processing complexity.

Controlled anisotropic growth and orientation, if not position, is possible through vapor-liquid-solid (VLS) growth processes. Fabrication of semiconductor and oxide nanowires typically uses dewetting of a low melting point metal catalyst where the resulting clusters set the feature size while epitaxy to the underlying substrate can control the growth orientation. More recently, an electrochemical electrolyte-liquid-solid analog has been demonstrated for growth of Ge nanowires. In another approach nanowire growth of metallic nanostructures capitalizes on the intrinsic or additive engineered anisotropic energetics and/or growth kinetics on different crystal facets. For example, adsorption of anions or dilute metal ion additives, via under potential deposition (upd), enables fabrication of structures such as Au nanospikes of moderate aspect ratio using a Pb additive and highly faceted, moderately elongated dendrite-like grains using Tl as an additive on unpatterned substrates. This work, part of a broader study of the impact of $Pb^{2+}$ and $Tl^+$ additives on the morphology of Au electrodeposits on planar and patterned substrates, demonstrates the use of dilute $Tl^+$ for controlled growth of single crystal nanowires of much higher aspect ratio on unpatterned surfaces. The additive selection is based on its surfactant quality, derived from the absence of Tl—Au intermetallic phases and negligible mutual solubility (in contrast, there are a number of Au—Pb stoichiometric compounds).

Deposition was conducted in a non-cyanide, alkaline $Au(SO_3)_2^{3-}$ electrolyte at pH 9. At lower pH, sulfite-based electrolytes suffer from disproportionation, $SO_2$ formation, and/or dithionnite-based decomposition. The instability can be mitigated through the use of additives such as ethylenediamine, and/or electrolyte modification such as the use of thiosulfate, to enable operation at pH values as low as 4.0.

Figure 33:
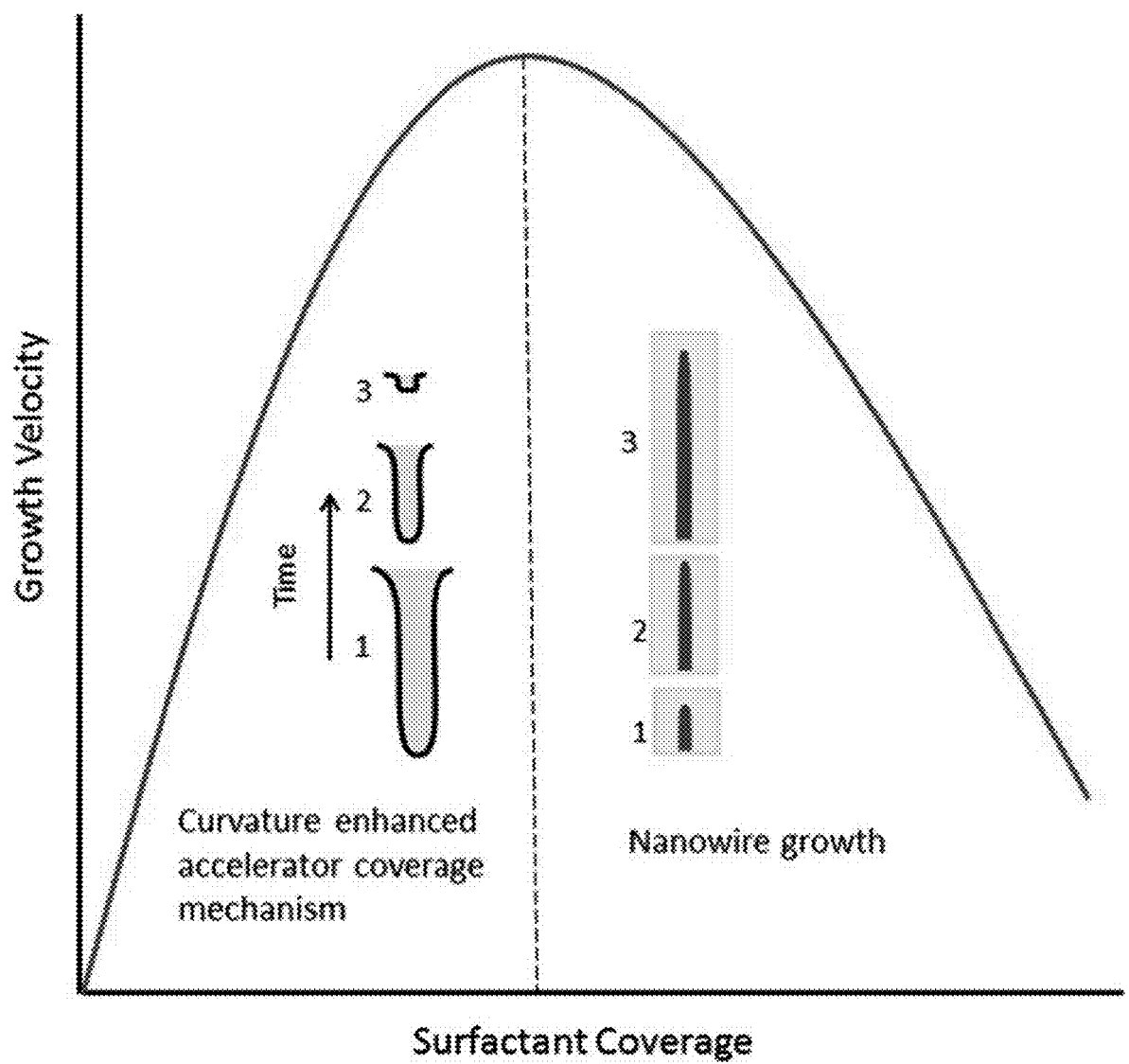
FIG. 33 shows a graph of growth velocity versus surfactant coverage for non-monotonic influence of $Tl_{upd}$ surfactant on Au electrodeposition rate. The curvature enhanced accelerator coverage mechanism of smoothing, by enriching an accelerating surfactant species on concave surface segments, yields preferential deposition at the bottom of the electrolyte filled, recessed surface feature. At high coverage where the surfactant behaves as an inhibitor, area expansion on convex surface segments leads to dilution of the suppressing adsorbate and enhanced growth at the tip of the asperity.

Similar to cyanide electrolytes, metal deposition from sulfite solutions is constrained by the formation of inhibiting species on the deposit surface. This native inhibition can be lifted by the addition of $Tl^+$ or other metal ions to obtain accelerated Au deposition rates and surface smoothing. Alternatively, the native suppression can be enhanced through the use of other inhibiting additives. Such accelerating and suppressing additives underlie a number of processes for creating high aspect Au features through superconformal filling of high aspect ratio trenches and vias in patterned surfaces. Thallium is particularly interesting because of reports of coverage dependent behavior whereby Au electrodeposition is accelerated for low Tl coverage while significant suppression occurs at higher coverages. As will be shown in this comparative example, the non-monotonic behavior leads to a transition between two distinct behaviors indicated schematically in FIG. 33. Specifically, at low coverages the curvature enhanced accelerator growth dynamic yields local surface smoothing via enrichment of adsorbed accelerating Tl on concave surfaces. At high coverages system instability couples with dilution of suppressing Tl on expanding surface area to yield accelerated growth on nanowire tips.

Experimental

The depositions detailed in this work utilized a commercial sodium gold sulfite source containing 2 troy ounces of gold per liter, equivalent to 0.32 mol/L $Na_3Au(SO_3)_2$. Gold electrodeposition experiments were conducted in a cell containing 60 mL of 0.080 mol/L $Na_3Au(SO_3)_2$+0.32 mol/L $Na_2SO_3$ with and without addition of aliquots drawn from a 1 mmol/L $Tl_2SO_4$ solution. The electrolyte pH was 9, as determined using a pH electrode calibrated using pH 7.0 and pH 10.0 buffer solutions. The electrolyte was sparged with nitrogen prior to use to remove dissolved oxygen. Thallium adsorption was also examined by cyclic voltammetry in the 0.32 mol/L $Na_2SO_3$ supporting electrolyte.

Electroanalytical and deposit morphology studies were performed on Si wafers coated with 100 nm thick planar Au films by electron beam evaporation. The specimens were masked with plater's tape to expose a circular area of 0.54 $cm^2$. The substrates were held in a vertical orientation under quiescent conditions, the only convection being that arising from the density-gradient due to deposition derived $Au(SO_3)_2^{3-}$ depletion in the electrode boundary.

The experiments were performed at room temperature (≈23° C.) while the electrolyte was sparged with nitrogen between experiments. A $Hg/Hg_2SO_4$/saturated $K_2SO_4$ reference electrode (SSE) was used for all experiments. The reference electrode was connected to the working electrode compartment via a fritted salt bridge filled with saturated solution of potassium sulfate while a platinum counter electrode was held in a separate fritted compartment filled with the working electrolyte.

Electrochemical Measurements

Figure 34:
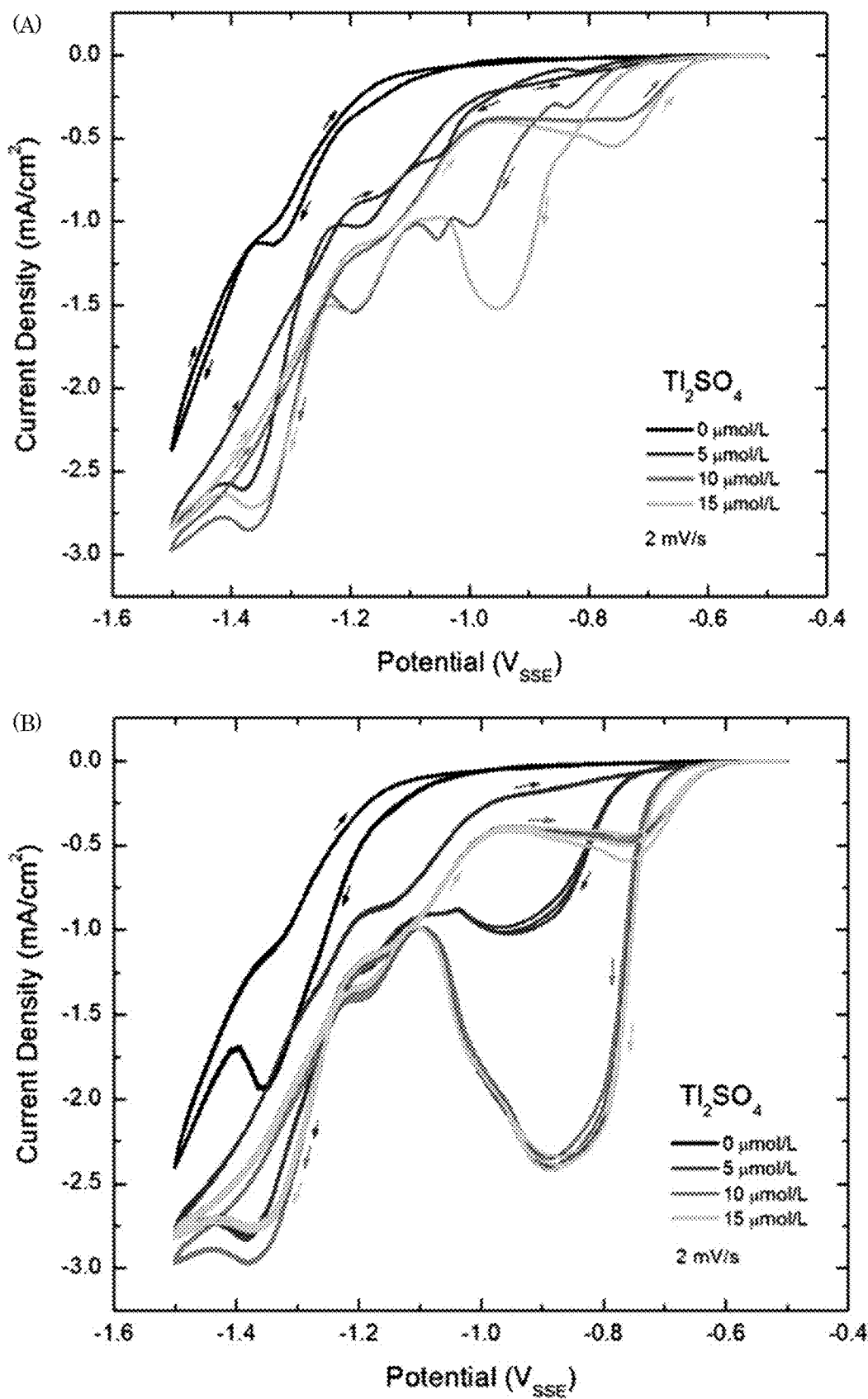
FIG. 34 shows cyclic voltammetry of Au deposition from 0.32 mol/L $Na_2SO_3$+0.08 mol/L $Na_3Au(SO_3)_2$+(0 to 15) μmol/L $Tl_2SO_4$: (panel a) $1^{st}$ voltammetric cycle on the Au-coated substrates, and (panel b) subsequent $2^{nd}$ through $4^{th}$ voltammetric cycles.

Cyclic voltammetry was used to examine the impact of $Tl^+$ concentration on Au deposition through sequential addition of $Tl_2SO_4$ aliquots (FIG. 34a). The onset of potential activated Au deposition from the additive-free solution is first evident at −0.8 $V_{SSE}$ and minimal voltammetric hysteresis accompanies cycling. The addition of $Tl^+$ results in a significant increase in the Au deposition rate with the onset of significant deposition shifted to more positive potentials. The shift indicates that $Tl^+$ adsorption lifts the intrinsic suppression associated with deposition from the $Au(SO_3)_2^{3-}$—$Na_2SO_3$ electrolyte. The Au deposition current increases with $Tl_2SO_4$ concentration over the range examined. For 10 μmol/L $Tl^+$ and 20 μmol/L $Tl^+$ as many as five voltammetric waves were observed between −0.8 $V_{SSE}$ and −1.2 $V_{SSE}$. Significant hysteresis and multiple crossing are evident with cycling, detailed analysis of which lies beyond the present work. However, with extended cycling, a dominant voltammetric peak is evident near −0.9 $V_{SSE}$ on the negative-going scan (FIG. 34b). The peak develops most rapidly for 30 μmol/L $Tl^+$, the current saturating near 2.5 $mA/cm^2$ at −0.9 V for $Tl^+$ concentration above 20 μmol/L. The peak current is sensitive to hydrodynamics (not shown) reflecting the transport constraint on the $Tl^+$ and/or $Au(SO_3)_2^{3-}$ deposition reaction. The decreasing current at potentials negative of −0.9 V demarcates a negative differential resistance (NDR) regime associated with a passivation process. If the switching potential is increased such that the potential is not cycled negative of −0.9 $V_{SSE}$ only a monotonic increase of current with potential cycling is evident (not shown). For switching potential negative of −0.9 $V_{SSE}$ the onset of passivation is evident. In contrast to the negative-going scan, electrode reactivation on the positive-going scan is limited and never fully attains the activated values despite the slow sweep rate employed. However, complete reactivation of the electrode is evident on the subsequent negative-going voltammetric cycles. The origin of this unusual hysteretic behavior remains to be resolved, but as will be discussed below interactions associated with $SO_3^{2-}$ oxidation and Tl oxide formation must be considered.

Figure 35:
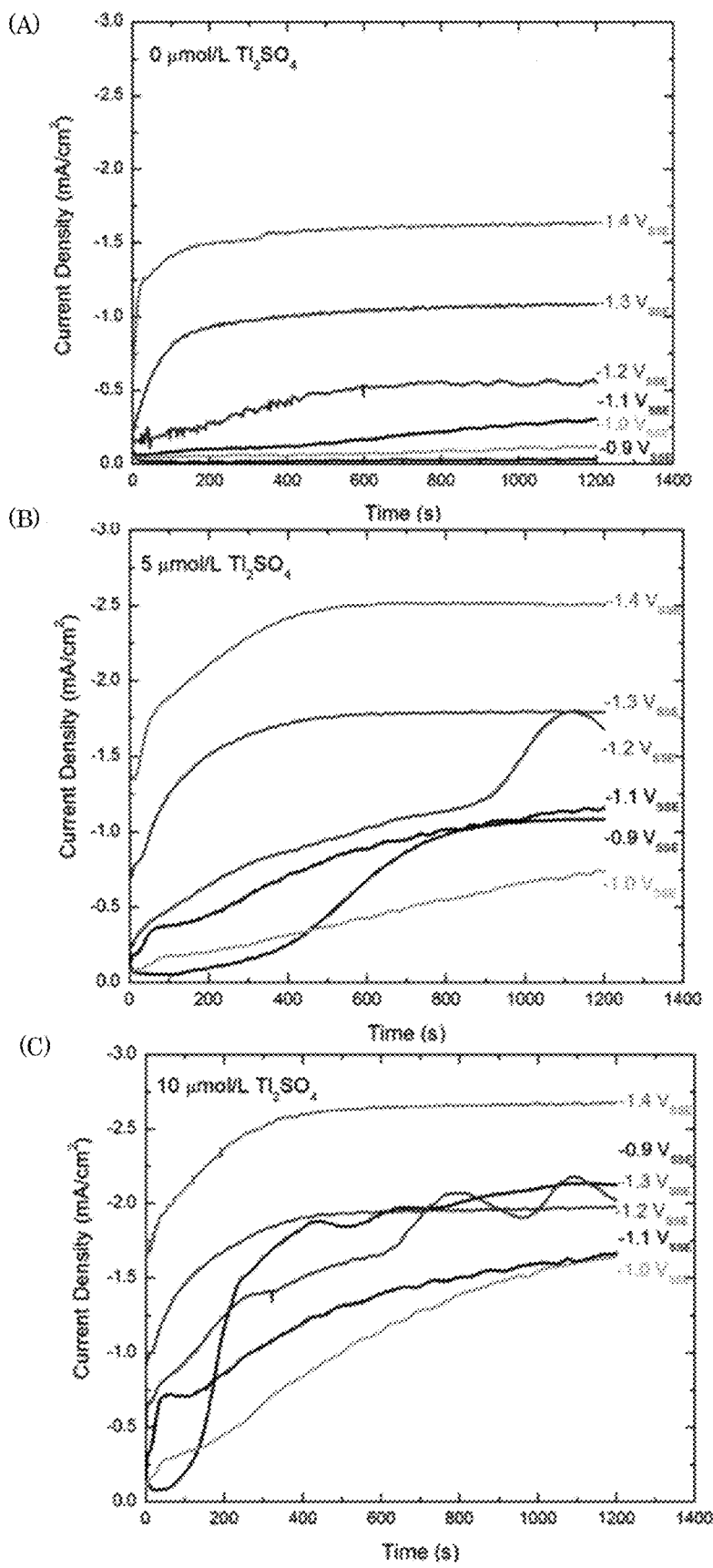
FIG. 35 shows chronoamperometric measurements obtained during Au deposition from 0.32 mol/L $Na_2SO_3$+ 0.08 mol/L $Na_3Au(SO_3)_2$+(0 to 10) μmol/L $Tl_2SO_4$: (panel a) additive-free, (panel b) 5 μmol/L $Tl_2SO_4$ and (panel c) 10 μmol/L $Tl_2SO_4$.

Chronoamperometry was used to further examine the metal deposition dynamics. The potential was stepped from open circuit conditions to representative potentials in the various electrolytes (FIG. 35). Following double layer charging, rising current transients were observed for all experiments. For the Tl$^+$-free electrolyte the increasing current was at least partly associated with increased surface area reflected in the development of optically rough surfaces with time. In the presence of Tl$^+$ the $-0.9$ V$_{SSE}$ transients are distinctly different, similar to a sigmoidal curve, with a slower onset of deposition followed by acceleration of the growth rate that eventually stabilizes at current values as high as those obtained at much more negative potential in the Tl$^+$-free case. In contrast to the rough films seen in the additive-free case, Tl$^+$ additions lead to deposition of optically bright films at this potential, and the rising current is thus associated with acceleration of the deposition rate as opposed to area expansion. The time constant of the transients decreases with increasing Tl$^+$ concentration, indicating its role as the accelerant. Interestingly, the $-0.9$ V$_{SSE}$ current transients increase more rapidly than those collected at more negative potentials. As a result, after 20 minutes in the electrolyte containing 10 µmol/L Tl$^+$ the current at $-0.9$ V is larger than the current at $-1.0$ V$_{SSE}$ and similar to the current at $-1.1$ V$_{SSE}$ while, in the electrolyte containing 20 µmol/L Tl$^+$, the current at $-0.9$ V$_{SSE}$ is larger than that at $-1.0$ V$_{SSE}$ and $-1.1$ V$_{SSE}$ and similar to that observed at $-1.2$ V$_{SSE}$ and $-1.3$ V$_{SSE}$. Transients collected for smaller increments in the deposition potential (FIG. 36) reveal the change occurs negative of $-0.95$ V$_{SSE}$ in the electrolyte containing 20 µmol/L Tl$^+$ as does the shift from deposition of smooth specular film to optically dark surfaces. Significantly, the scaling of the steady state current with Tl$^+$ concentration at $-0.9$ V$_{SSE}$ (FIG. 35b and FIG. 35c), where bright deposits are obtained, indicates that the adsorbed Tl$^+$ surfactant is subject to substantial consumption during Au deposition. Adsorbate consumption (either through burial or a change in chemical character) during Au deposition is also supported by a study of Au deposition kinetics in Tl$^+$ containing cyanide electrolyte.

Figure 36:
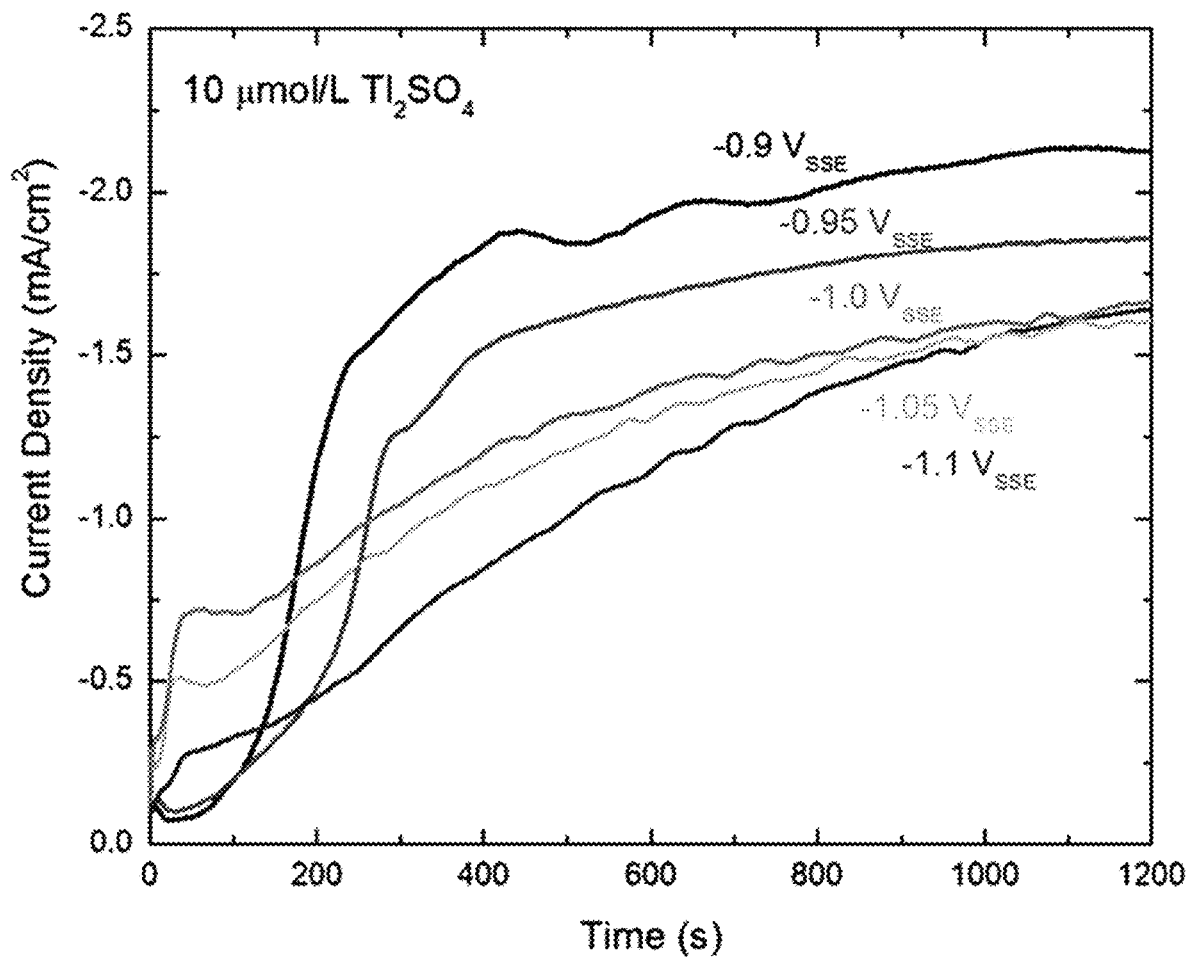
FIG. 36 shows chronoamperometric measurements obtained during Au deposition from 0.32 mol/L $Na_2SO_3$+ 0.08 mol/L $Na_3Au(SO_3)_2$+10 μmol/L $Tl_2SO_4$.
Figure 37:
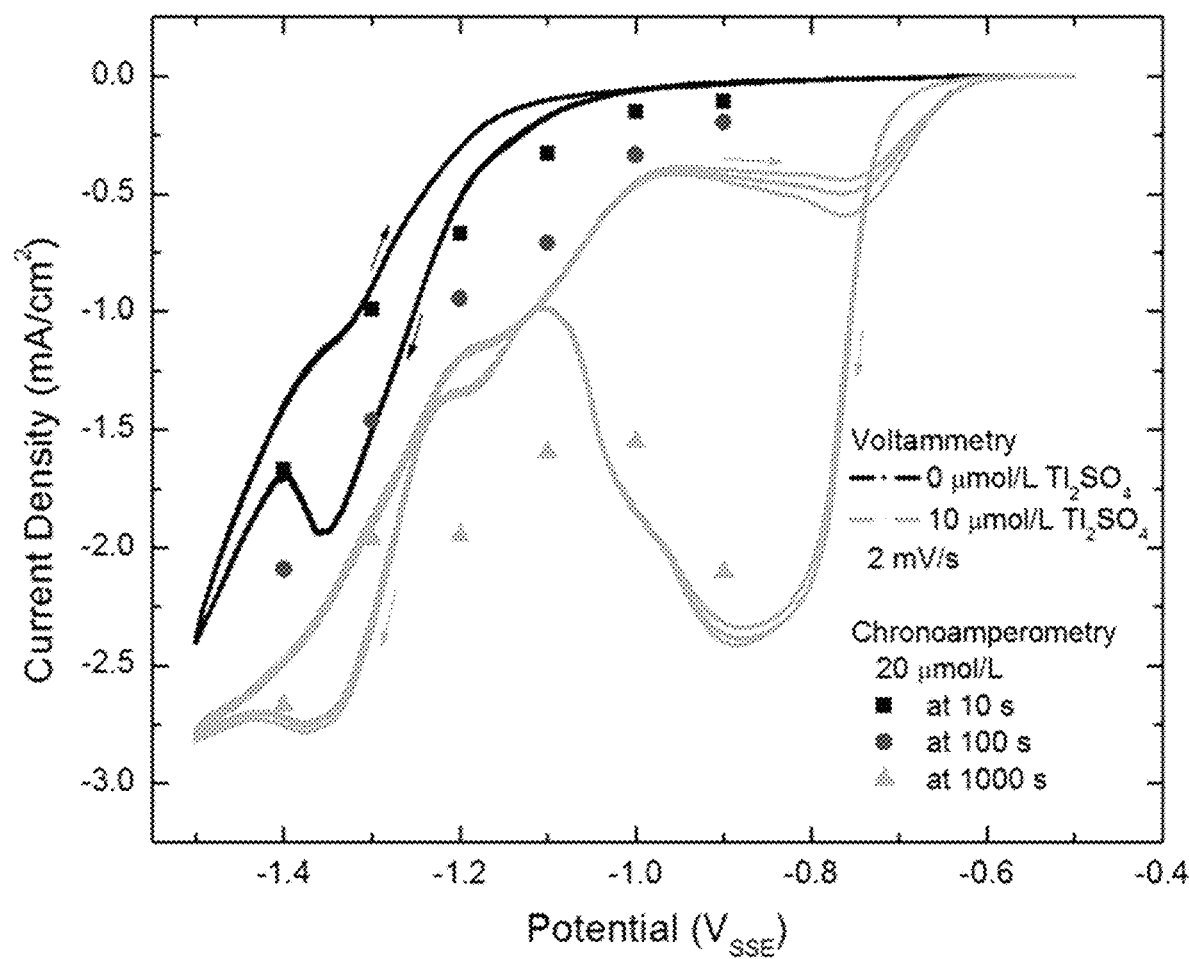
FIG. 37 shows sampled current voltammetry constructed from chronoamperometric transients for Au deposition from 0.32 mol/L $Na_2SO_3$+0.08 mol/L $Na_3Au(SO_3)_2$+10 μmol/L $Tl_2SO_4$ compared to cyclic voltammetry for additive-free and 10 μmol/L $Tl_2SO_4$ electrolytes.

The chronoamperometric data were used to construct sampled current voltammograms and compared to the slow scan voltammetry data for the electrolyte containing 20 µmol/L Tl$^+$ (FIG. 37). At early times, ~10 s, the sampled current is consistent with linear scan voltammetry for the additive-free electrolyte. Congruent with FIG. 35 and FIG. 36 the sampled current increases with time, however the response between 100 s and 1000 s exhibits a clear distinction between films grown at $-0.9$ V$_{SSE}$ versus more negative potentials.

Figure 38:
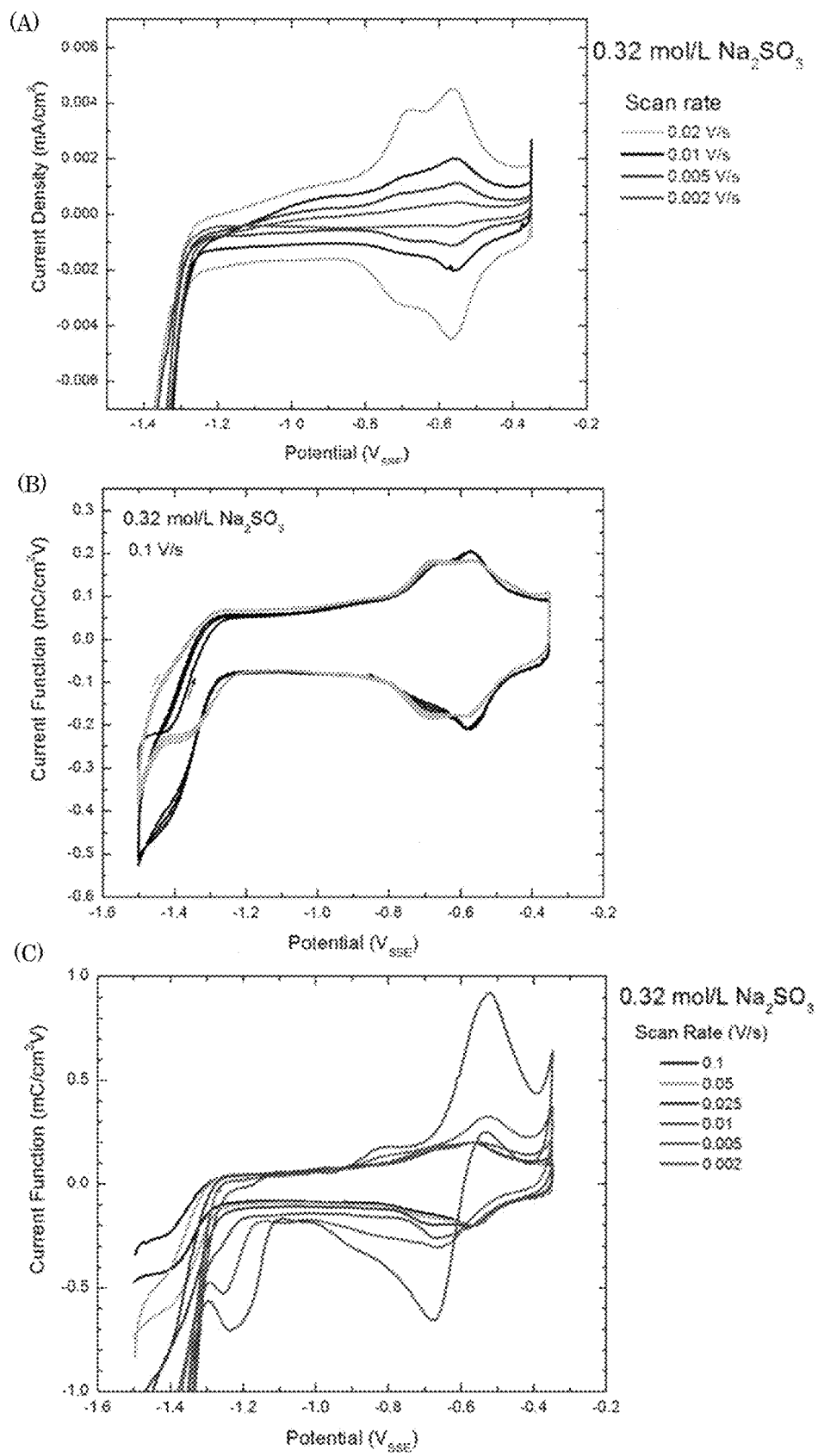
FIG. 38 shows cyclic voltammetry on Au in the 0.32 mol/L $Na_2SO_3$. (panel a) Reversible wave for $SO_3^{2-}$-adsorption. Each scan corresponds to a fresh substrate. (panel b) Representative multicycle scans exhibiting identical behavior upon cycling at 100 mV/s. (panel c) The influence of sweep rate observed in progressively slower scans on a single substrate; the duration of each successive cycle exceeds that of all preceding cycles combined. The current densities are divided by scan rates to probe for the data collapse expected for surface confined reversible surface processes.

In the case of gold cyanide electrolytes, inhibition of the deposition reaction is associated with adsorbed CN— and the related metal complexes. However, less is known about the interactions between Au and SO$_3^{2-}$ and thus the electrochemistry of Au and Tl in the Na$_2$SO$_3$ supporting electrolyte was briefly examined. Cyclic voltammetry experiments performed on freshly prepared Au thin film electrodes in the Na$_2$SO$_3$ electrolyte are shown in FIG. 38a. A pair of symmetric reversible waves are evident at $-0.57$ V$_{SSE}$ and $-0.7$ V$_{SSE}$ and may be ascribed to sulfite adsorption on Au corresponding to the passage of 70 µC/cm$^2$ between $-0.9$ V$_{SSE}$ and $-0.3$ V$_{SSE}$. As revealed more clearly in FIG. 38b scans initiated at negative potentials, $-1.5$ V$_{SSE}$, reveal an additional irreversible reduction process due to some combination of water and sulfite reduction. The reversible SO$_3^{2-}$ waves are not significantly perturbed when the negative switching potential is extended from $-1.2$ V$_{SSE}$ to $-1.5$ V$_{SSE}$, suggesting a benign influence of the reduction process (at negative potentials) on the state of the electrode surface at more positive potentials. However, extended polarization at negative potentials during progressively slower cycles on the same substrate leads to additional voltammetric processes evident in FIG. 38c. Development of the reduction wave at $-1.2$ V$_{SSE}$ is coincident with disruption of the reversible SO$_3^{2-}$ adsorption waves at more positive potential that involves additional charge. SO$_3^{2-}$ reduction to dithionite, S$_2$O$_4^{2-}$, is possible at negative potential while its subsequent oxidation to SO$_3^{2-}$, dithionate, S$_2$O$_6^{2-}$, or SO$_4^{2-}$ may account for the net oxidative reaction at the positive potential limit. Formation of S$_2$O$_4^{2-}$ and its subsequent decomposition may also yield thiosulfate, S$_2$O$_3^{2-}$, and/or sulfide, S$^{2-}$, that perturbs the SO$_3^{2-}$ adsorption waves. The onset potential for the SO$_3^{2-}$ adsorption waves correspond well to the threshold potential for Au(SO$_3$)$_2^{3-}$ reduction from the Ti-free electrolyte. This indicates that the SO$_3^{2-}$ layer inhibits deposition by blocking the adsorption of Au(SO$_3$)$_2^{3-}$ at potentials positive of $-0.8$ V$_{SSE}$ and suggests that one role of Tl additions is disruption of the blocking SO$_3^{2-}$ layer.

Figure 39:
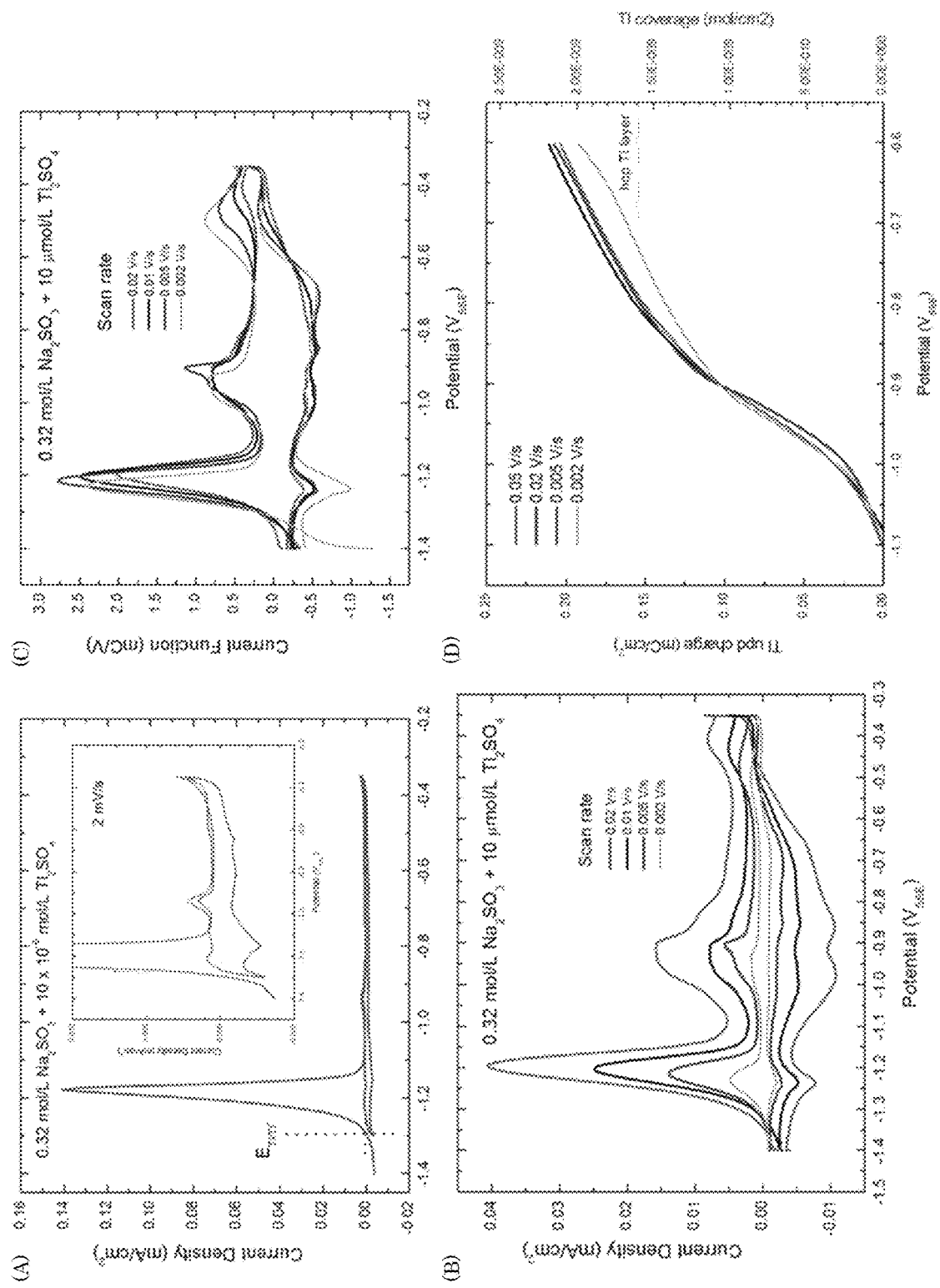
FIG. 39 shows voltammetry for Tl adsorption on Au from 0.32 mol/L $Na_2SO_3$ supporting electrolyte with 10 μmol/L $Tl_2SO_4$: (panel a) Stripping voltammetry reveals dissolution of bulk Tl and $Tl_{upd}$. Inset shows an expanded view of the low current response. (panel b) Stripping voltammetry for different scan rates following 3 minutes of Tl deposition at $-1.4\ V_{SSE}$. (panel c) Scaled stripping voltammograms, current densities divided by scan rates, exhibit the data collapse expected for surface confined reversible surface processes. (panel d) Charge associated with oxidation between $-1.1\ V_{SSE}$ and $-0.6\ V_{SSE}$.

To further examine the influence of Tl on the Au deposition reaction a voltammetric study in 10 µmol/L Tl$_2$SO$_4$+ 0.32 mol/L Na$_2$SO$_3$ was performed. A voltammogram collected after holding the electrode at $-1.4$ V$_{SSE}$ for 20 min reveals the reversible potential for deposition and dissolution of bulk Tl at $-1.3$ V$_{SSE}$ followed by oxidation of underpotential deposited (upd) Tl near $-0.93$ V$_{SSE}$ (FIG. 39a). Less extensive overpotential deposition at $-1.4$ V$_{SSE}$ for 3 min enables the upd oxidation wave to be more clearly resolved for a range of sweep rates as shown in FIG. 39b. Dividing the current by the scan rate, FIG. 39c, reveals the dissolution charge for bulk Tl oxidation is nearly independent of the sweep rate as expected for a fixed deposition time. While the shape of the Tl upd wave in FIG. 39b indicates the convolution of multiple processes, the rescaled voltammogram in FIG. 39c shows that the upd oxidation charge is independent of sweep rate, consistent with formation of a Tl layer on the electrode. This is shown more clearly through integration of the upd oxidation waves from $-1.1$ V$_{SSE}$, the charge ranging from (0.15 to 0.20) mC/cm$^2$ depending on the selected integration limits (FIG. 39d). This is congruent with a close packed Tl layer on 111 textured Au, corresponding to 0.154 mC/cm$^2$ as reported in previous radiotracer studies of competitive adsorption of Tl on polycrystalline Au in Au(CN)$_2^-$, CN$^-$ and CN$^-$-free alkaline electrolytes.

A second oxidation wave is evident between $-0.7$ V$_{SSE}$ and $-0.4$ V$_{SSE}$ in FIG. 39b. Early work with polycrystalline Au attributed this to oxidative deposition of either Tl$^+$/Tl (OH)$_3$ or T/Tl$_2$O$_3$. This comparative example shows that this potential regime also overlaps with the SO$_3^{2-}$—Au interactions evident in FIG. 38. A more recent X-ray surface scattering study of Tl upd on Au 111 single crystal in 5 mmol/L TlF in 0.1 mol/L NaOH demonstrated that the Tl upd process is quite complex, involving an oxidative sequence where a rotated incommensurate metallic Tl upd is converted to an aligned incommensurate TlOH adlayer at the first upd oxidation wave followed by conversion to amorphous Tl$_2$O layer at more positive potentials. On Au 111 the phase transition between the close packed Tl adlayer and the hexagonal TlOH phase is sharp in contrast to the more diffuse wave observed in the present study. Nevertheless, applying this insight to the present work, the upd oxidation wave at $-0.925$ V is assigned to a conversion reaction Tl$_{ads}$+OH$^-$→TlOH$_{ads}$+e$^-$ and the subsequent oxidation wave near $-0.5$ V$_{SSE}$ to the conversion of TlOH$_{ad}$s to Tl$_2$O. On subsequent negative going scans a variety of weakly formed waves, near $-0.65$ V$_{SSE}$, $-0.85$ V$_{SSE}$, $-1.0$ V$_{SSE}$, and $-1.25$ V$_{SSE}$ are observed in FIG. 39b and FIG. 39c that convolve Tl₂O reduction, Tl and TlOH upd along with possible interaction with $SO_3^{2-}$ and related reaction products.

Figure 40:
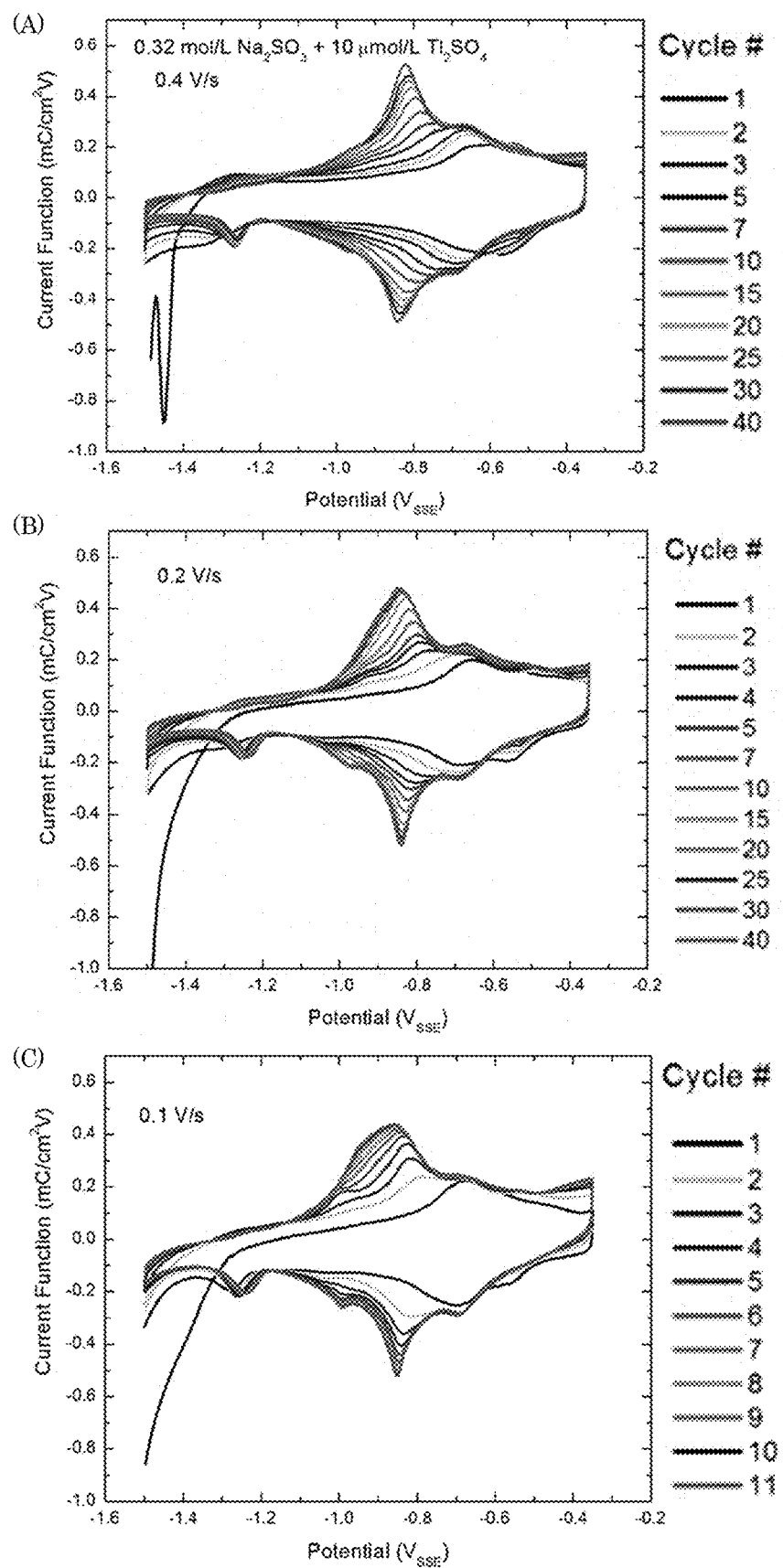
FIG. 40 shows irreversible accumulation of Tl on Au during continuous voltammetric cycling at: (panel a) 0.4 V/s, (panel b) 0.2 V/s and (panel c) 0.1 V/s. Saturation occurs after ~230 s that corresponds to 40, 20 and 10 cycles at the respective scan rates.

Since oxidation of Tl upd leads to the formation of its hydroxide and oxide, the adsorption of $Tl^+$ on a fresh Au surface is an irreversible process. Nevertheless, the adsorbed Tl species still gives rise to surface confined voltammetric waves associated with the respective structural changes during cycling, albeit accompanied by some limited dissolution and readsorption of the $Tl_{ads}$ species. The net accumulation of $Tl_{ads}$/$TOH_{ads}$ species was followed by monitoring the evolution of a fresh Au surface during rapid voltammetric cycling, 0.4 V/s, in the presence of 20 µmol/L $Tl^+$ (FIG. 40a) For this relatively fast sweep rate, significant formation of Tl₂O at the more positive potentials does not occur (FIG. 39c) and the competition between $Tl_{ads}$/$TlOH_{ads}$ and $SO_3^{2-}$ for Au surface sites can be followed. The voltammogram evolves from the two reversible $SO_3^{2-}$ adsorption waves at $-0.550$ $V_{SSE}$ and $-0.650$ $V_{SSE}$ to a pair of reversible waves centered near $-0.680$ $V_{SSE}$ and $-0.825$ $V_{SSE}$ that reflect accumulation of Tl. The main peak at $-0.825$ $V_{SSE}$ is almost 0.1 V more positive than the Tl upd stripping wave observed in FIG. 39 and thus reflects a different state for the upd Tl, perhaps involving sulfide; the peak position shifts progressively to more negative values when slower scan rates are used (FIG. 40b and FIG. 40c). The symmetric nature of the voltammetric wave is consistent with the accumulated Tl species being largely surface confined under these conditions. The reduction wave centered near $-1.28$ $V_{SSE}$ is similar to that observed in the neat sulfite electrolyte (FIG. 37b and FIG. 37c) and may be associated with reduction of some S species.

Figure 41:
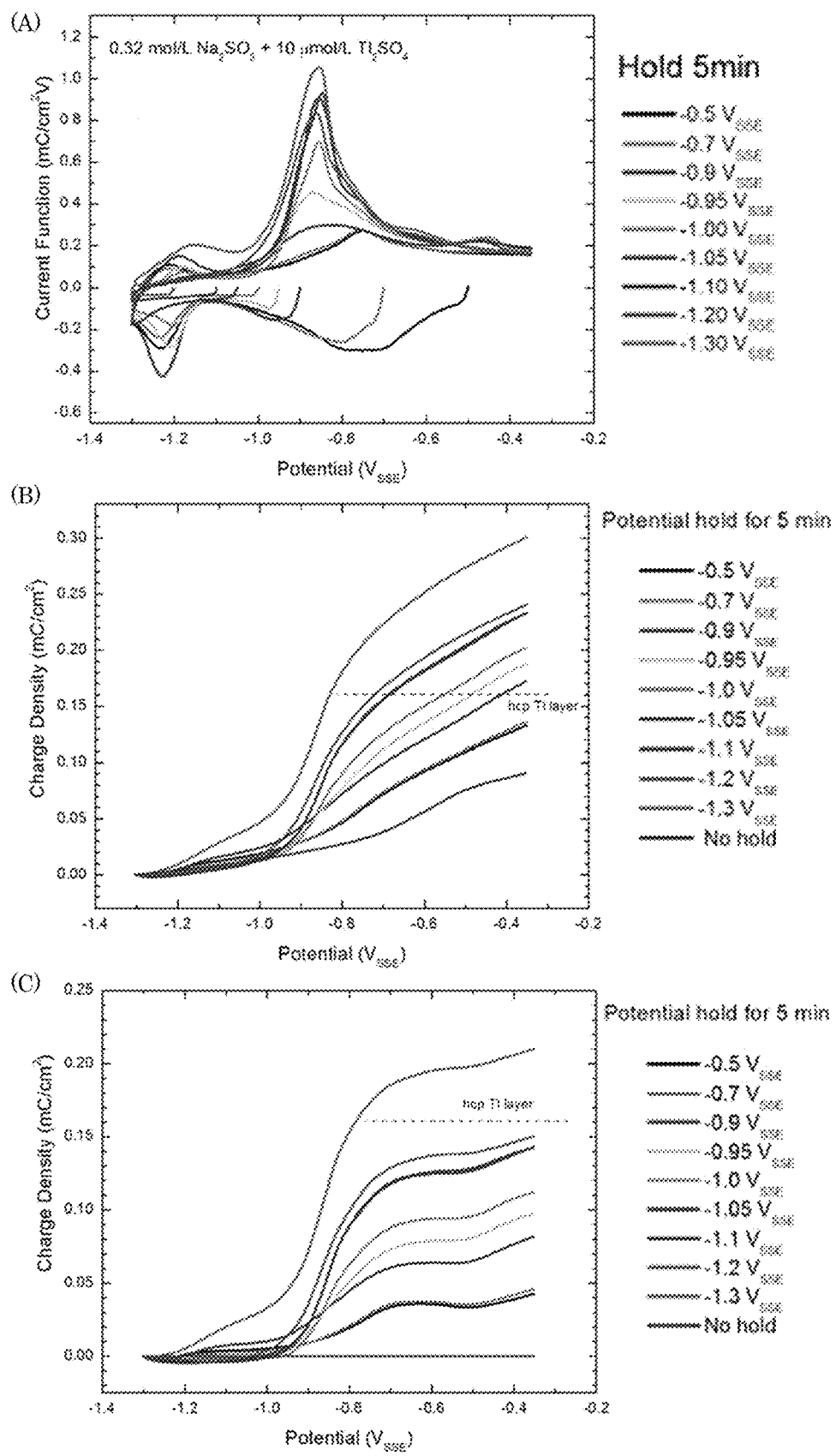
FIG. 41 shows (panel a) assaying the potential dependence of Tl adsorption by voltammetric stripping at 0.5 V/s following 5 minutes accumulation at the specified potential; (panel b) integrated oxidative charge following 5 minutes at the specified potentials. The oxidation charge associated with conversion of upd $Tl_upd$ to $TlOH_{ads}$ is measured for the positive going sweep from $-1.3\ V_{SSE}$. Panel C shows oxidative charges recorded in panel b minus the result without pretreatment (i.e., "No hold")

The potential dependence of the Tl upd adsorption was examined by holding fresh Au electrodes at different fixed potentials for 5 minutes followed by rapid voltammetric oxidation to assay the Tl surface coverage. As shown in FIG. 41a, after a 5 min hold at $-0.5$ $V_{SSE}$ the $SO_3^{2-}$ waves (e.g., FIG. 38b) are no longer evident, and the stripping wave is instead similar to that observed after 40 s of continuous voltammetric cycling (i.e., FIG. 38a, cycle 7). Pretreatment at more negative potentials leads to development of a well-defined oxidation wave near $-0.850$ $V_{SSE}$ that is still slightly positive of the Tl upd oxidation wave in FIG. 39a and FIG. 39c. The magnitude of the oxidation wave saturates for hold potentials equal to, or negative of, $-1.05$ $V_{SSE}$. Aging at $-1.3$ $V_{SSE}$, adjacent to the reversible potential for bulk Tl deposition, results in an additional oxidation wave near $-1.15$ $V_{SSE}$ attributed to dissolution of a small amount of bulk Tl that formed during the pretreatment step.

The integrated oxidation charge between $-1.3$ $V_{SSE}$ and $-0.35$ $V_{SSE}$ is shown in FIG. 41b. Although additional material deposited during the negative-going portion of the stripping cycle, the high voltammetic scan rate means that the majority of the oxidation charge was largely associated with Tl deposited while at the hold potential. The magnitude of the reduction peak at $-1.2$ $V_{SSE}$ evident in FIG. 41a is not correlated to the immersion potential in any obvious manner. The voltammetric oxidation charge was normalized to that measured after insignificant ageing. As shown in FIG. 41c this gives rise to saturated oxidation charge that is slightly less than a full Tl hcp monolayer for films aged just positive of the reversible $Tl/Tl^+$ potential.

Figure 42:
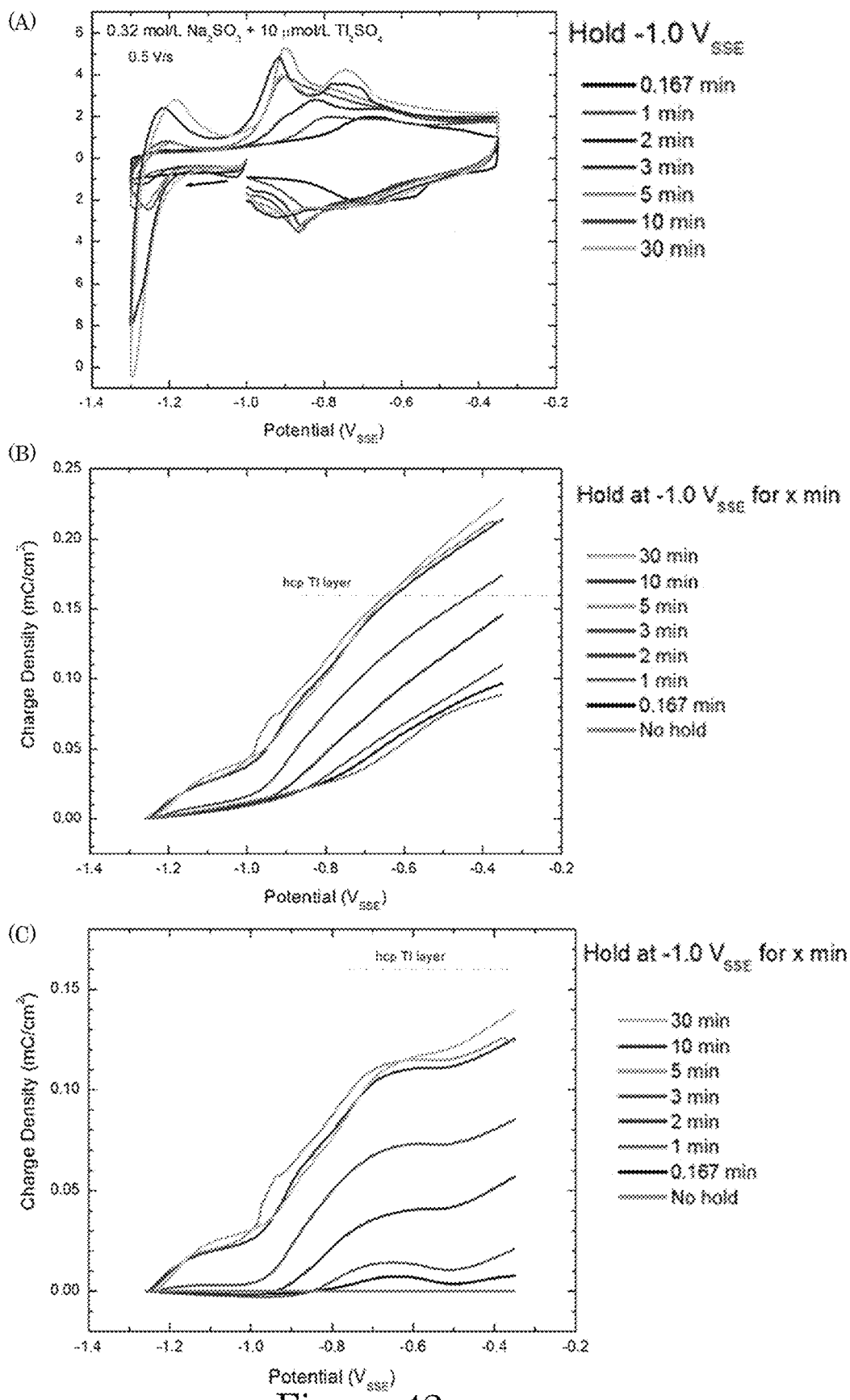
FIG. 42 shows (panel a) time dependence of Tl accumulation at $-1.0\ V_{SSE}$ followed by voltammetric stripping. A monolayer is formed within 5 minutes, followed by additional phenomena at longer times. Panel b shows integrated oxidative charge following different hold times at $-1.0\ V_{SSE}$. The oxidation charge associated with conversion of upd $Tl_{upd}$ to $TlOH_{ads}$ is measured for the positive going sweep from $-1.3\ V_{SSE}$. Panel c shows oxidative charges recorded in panel b minus the result without pretreatment (i.e., "No hold")

Analogous stripping (more precisely, oxidation) experiments after holding the potential at $-1.0$ $V_{SSE}$ for various times were used to examine the time dependence of Tl accumulation. The time dependence evident in FIG. 42a reflects diffusional and/or kinetic constraint on $Tl_{upd}$ or $TlOH_{ads}$ adsorption. Nonetheless, aging for just 10 s at $-1.0$ $V_{SSE}$ perturbs the $SO_3^{2-}$ adsorption wave (i.e., compare to FIG. 38a); a small oxidation charge associated with the Tl accumulation is also evident (FIG. 42b). The reduction wave near $-1.2$ $V_{SSE}$ begins to develop after 2 minutes, becoming quite large after extended aging at $-1.0$ $V_{SSE}$. This may indicate slow sulfide formation at $-1.0$ $V_{SSE}$ and its subsequent desorption during the negative going voltammetric sweep.

Upon oxidation a wide variety of behaviors are evident. The peak near $-1.2$ $V_{SSE}$ is suggestive of bulk Tl dissolution. The oxidation peak centered near $-0.9$ $V_{SSE}$ is consistent with that observed in FIG. 39b. The peaks near $-0.75$ $V_{SSE}$ and $-1.2$ $V_{SSE}$, associated with extended precycle hold times, suggest Tl-Au surface alloying or Tl₂S formation during the pretreatment. Subtraction of the baseline curve (i.e., no hold) from the integrated oxidation waves (FIG. 42c) indicates that Tl saturation occurs within 5 minutes, consistent with the time constant for the chronoamperometric transients observed during Au deposition in the presence of the same 20 µmol/L $Tl^+$ (FIG. 35c).

Electrodeposit Morphology

Figure 43:
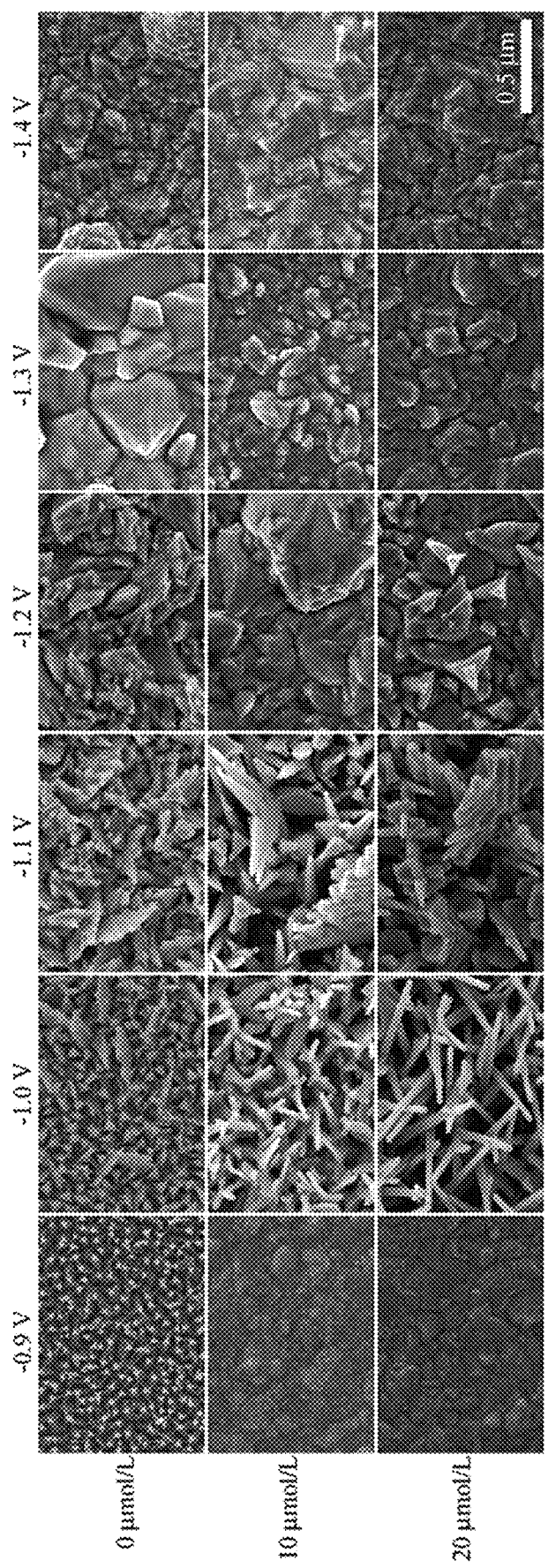
FIG. 43 shows images from top of Au deposits after 20 min deposition at the indicated potentials and $Tl^+$ concentrations. Deposition at all potentials in the 10 μmol/L $Tl^+$ containing electrolyte was preceded by 10 s deposition at $-1.5\ V_{SSE}$. The scale bar is 0.5 μm and applies to all images.

A series of Au films were electrodeposited from an electrolyte containing 0.080 mol/L Na₃Au(SO₃)₂+0.32 mol/L Na₂SO₃. The deposit surfaces were imaged by scanning electron microscope after 20 min of growth at the potentials used for the chronoamperometry in FIG. 35. As shown in FIG. 43, growth in the additive-free electrolyte at $-0.9$ $V_{SSE}$ yields triangular and lenticular faceted deposits. Growth at $-1.1$ $V_{SSE}$ yields dendrite-like structures while deposition at more negative potentials, $-1.3$ $V_{SSE}$, results in a transition to larger, more compact equiaxed grains. Interestingly, the largest grained compact deposit is obtained at $-1.3$ $V_{SSE}$, near the voltammetic peak evident in FIG. 34a.

Figure 44:
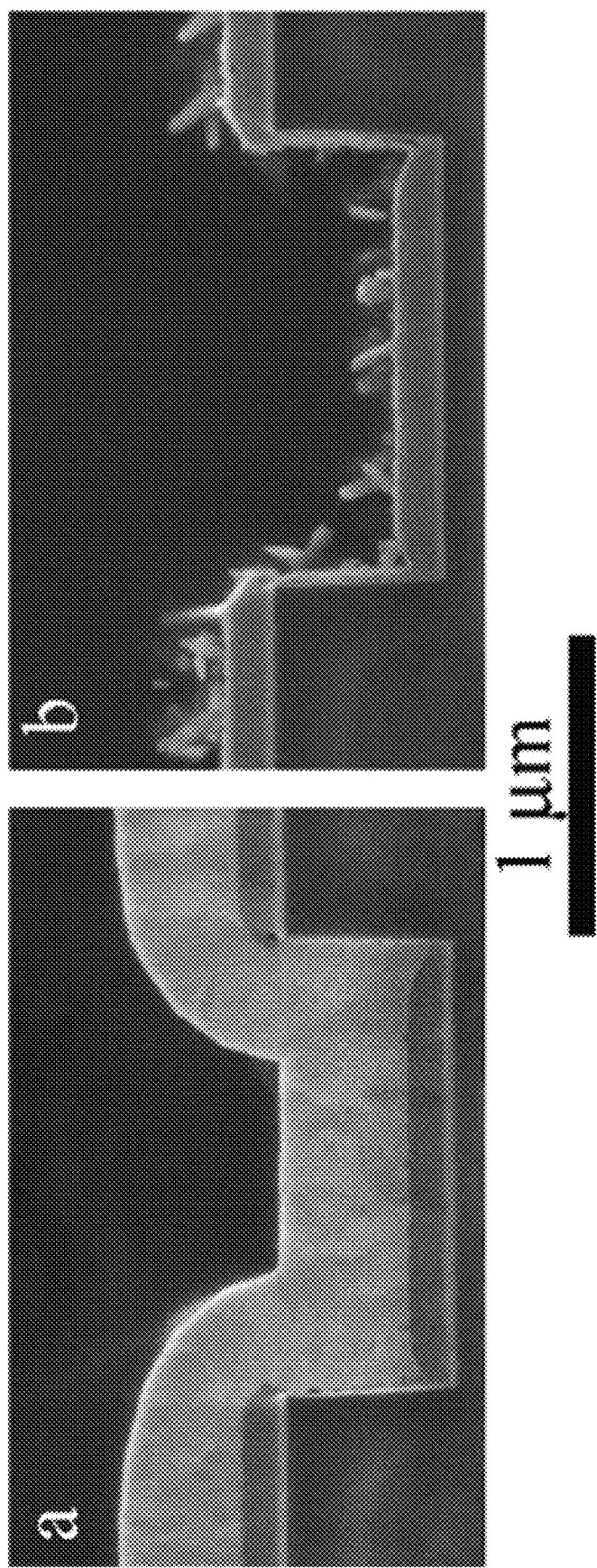
FIG. 44 shows (panel a) cross-section view of Au deposit for 13 min at $-0.8\ V_{SSE}$ in electrolyte containing 10 μmol/L $Tl^+$ on a Cu-seeded trench patterned substrate. Panel b shows deposition for 3 min at $-1.0$ V in electrolyte containing 20 μmol/L $Tl^+$ on a Cu-seeded trench patterned substrate. Both were immediately preceded by deposition for 10 s at $-1.5\ V_{SSE}$ for Cu seed protection.

In contrast to the additive-free electrolyte, Au deposits from the $Tl^+$ containing electrolytes exhibit optically bright, smooth surfaces at $-0.9$ $V_{SSE}$ (FIG. 43), as noted previously, while well-defined, sub-50 nm diameter nanowires are deposited at $-1.0$ $V_{SSE}$ in the center of the NDR voltammetric region. As shown in FIG. 44, similar morphologies are obtained on patterned substrates; smooth deposits are obtained at less negative potential, in this case $-0.8$ $V_{SSE}$ with 10 µmol/L $Tl^+$, and nanowires are obtained at $-1.0$ $V_{SSE}$ with 20 µmol/L $Tl^+$. It is noteworthy that the $Tl^+$ upd beginning near $-0.7$ V correlates with substantial depolarization (increase of current) through $-0.9$ V (FIG. 34, FIG. 35, FIG. 36) and the smooth deposits at $-0.8$ $V_{SSE}$ and $-0.9$ $V_{SSE}$. A similar relationship has been observed before in cyanide electrolytes. As previously noted, this is explained by CEAC smoothing through the impact of the accelerating surfactant.

Further increase of adsorbate coverage through $-1.05$ $V_{SSE}$ is associated with decreased deposition current despite a deposit surface area that is orders of magnitude larger. It has been suggested that the threshold coverage beyond which adsorbed Tl no longer accelerates Au deposition is approximately 30% of the saturation coverage $F=1.6 \times 10^{-9}$ mol/cm², the deposition rate decreasing both above and below this value. The fractional coverage stripped after holding at $-0.9$ $V_{SSE}$ in the electrolyte containing 20 µmol/L $Tl^+$ (FIG. 41) is reasonably close to this value, and the CVs do exhibit maximum Au deposition current near this potential (FIG. 33b).

A transition to faceted dendrite-like structures analogous to those observed with the additive-free electrolyte is seen at $-1.1$ $V_{SSE}$ (FIG. 43); the dendrites are somewhat larger in the presence of Tl. Such multifaceted crystallites of moderate aspect ratio have been noted previously in this system. As the potential becomes progressively more negative the growth reverts from rough faceted crystallites back toward equiaxed crystals, as observed at the same potentials in the additive-free electrolyte.

Three regimes of behavior are thus identified for Au deposition from the Tl containing electrolyte. At small overpotentials deposition is characterized by smooth surfaces and rising current transients indicating that Tl adsorption accelerates the deposition rate and, by virtue of the CEAC mechanism, leads to smoothing of the deposit. Deposition at more negative potentials falling within the NDR region yields nanowires of well-defined dimension. As per FIG. 39, FIG. 40, FIG. 41, and FIG. 42, the transition from smooth compact film growth to nanowire deposition overlaps the potential region where the coverage of Tl increases sharply and its equilibrium form changes from $TlOH_{ads}$ to Tl. At the most negative potentials examined here the morphology of the Au deposits in the presence or absence of Tl are similar. For growth at these potentials Tl may co-deposit with Au. However, no obvious impact on the film morphology was observed in this limited study. Similar growth despite 10 s deposition at $-1.5\ V_{SSE}$ prior to the growth in the electrolyte containing 10 μmol/L $Tl^+$ indicates the morphologies are determined by the deposition potential rather than the initial surface state.

Figure 45:
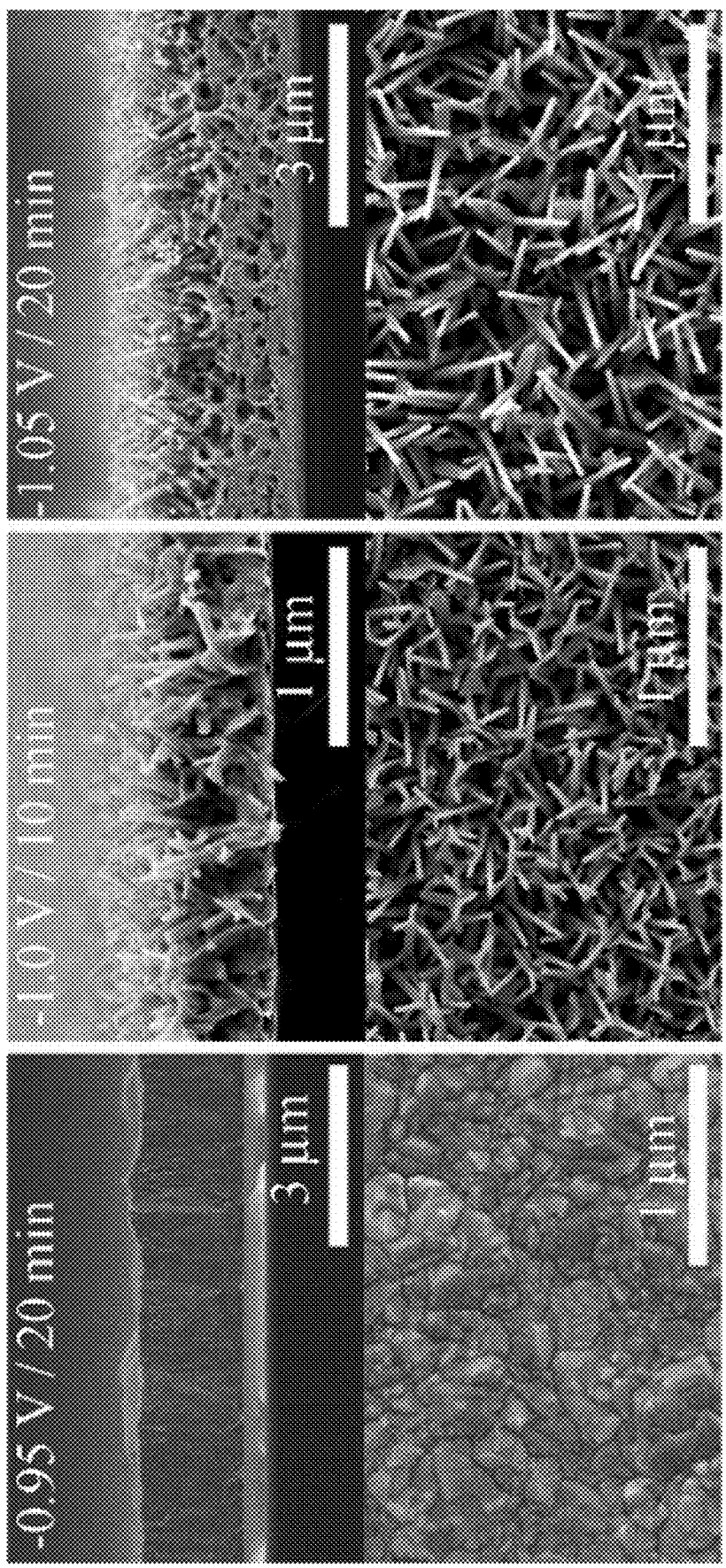
FIG. 45 shows cross-sectional and plan view images of Au deposits from electrolyte containing 20 μmol/L $Tl^+$ after the indicated deposition times at the indicated potentials.

The correlation of nanowire deposition and potentials within the NDR regime was probed further by planar and cross-section examination of deposits grown in electrolyte containing 20 μmol/L $Tl^+$. As shown in FIG. 45, films deposited at $-0.95\ V_{SSE}$, near the peak voltammetric current in FIG. 34b, are smooth and compact. As in FIG. 43, deposition at $-1.0\ V_{SSE}$, within the NDR regime, yields well defined nanowires. Nanowires are also obtained for deposition at $-1.05\ V_{SSE}$. Cross-sections show that the wires nucleate at the substrate surface in both cases. The transition in morphology is consistent with the previously noted changes in the shape of the chronoamperometric transients collected at these same potentials (FIG. 36). The nanowires grown in the $Tl^+$ containing electrolytes are longer and of more uniform diameter than those reported for growth using a $Pb^{2+}$ additive in cyanide electrolyte.

Figure 46:
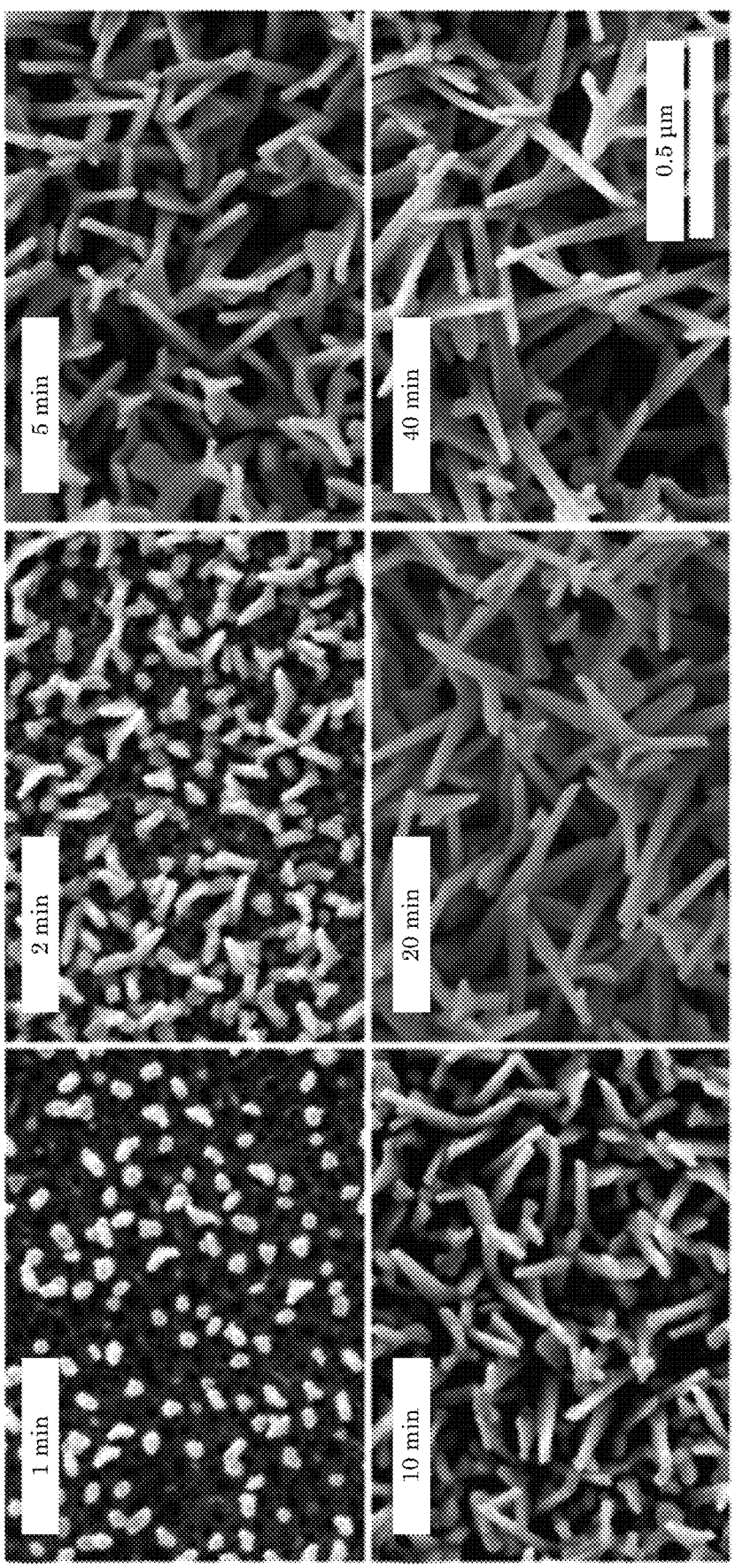
FIG. 46 shows plan view images of Au deposits from electrolyte containing 20 μmol/L $Tl^+$ after the indicated deposition times at $-1.0\ V_{SSE}$. The scale bar is 0.5 μm and applies to all images.

FIG. 46 captures the evolution of the nanowire growth through a series of deposits grown at $-1.0\ V_{SSE}$. Faceted nuclei smaller than 50 nm in diameter are visible after the first minute of deposition, followed by nanowire development that is clearly evident at the end of the second minute. Expansion of the surface area accompanies nanowire growth and their projection into the boundary layer accounts for the gradual increase in current beginning at ≈120 s in the corresponding current transient in FIG. 36.

Figure 47:
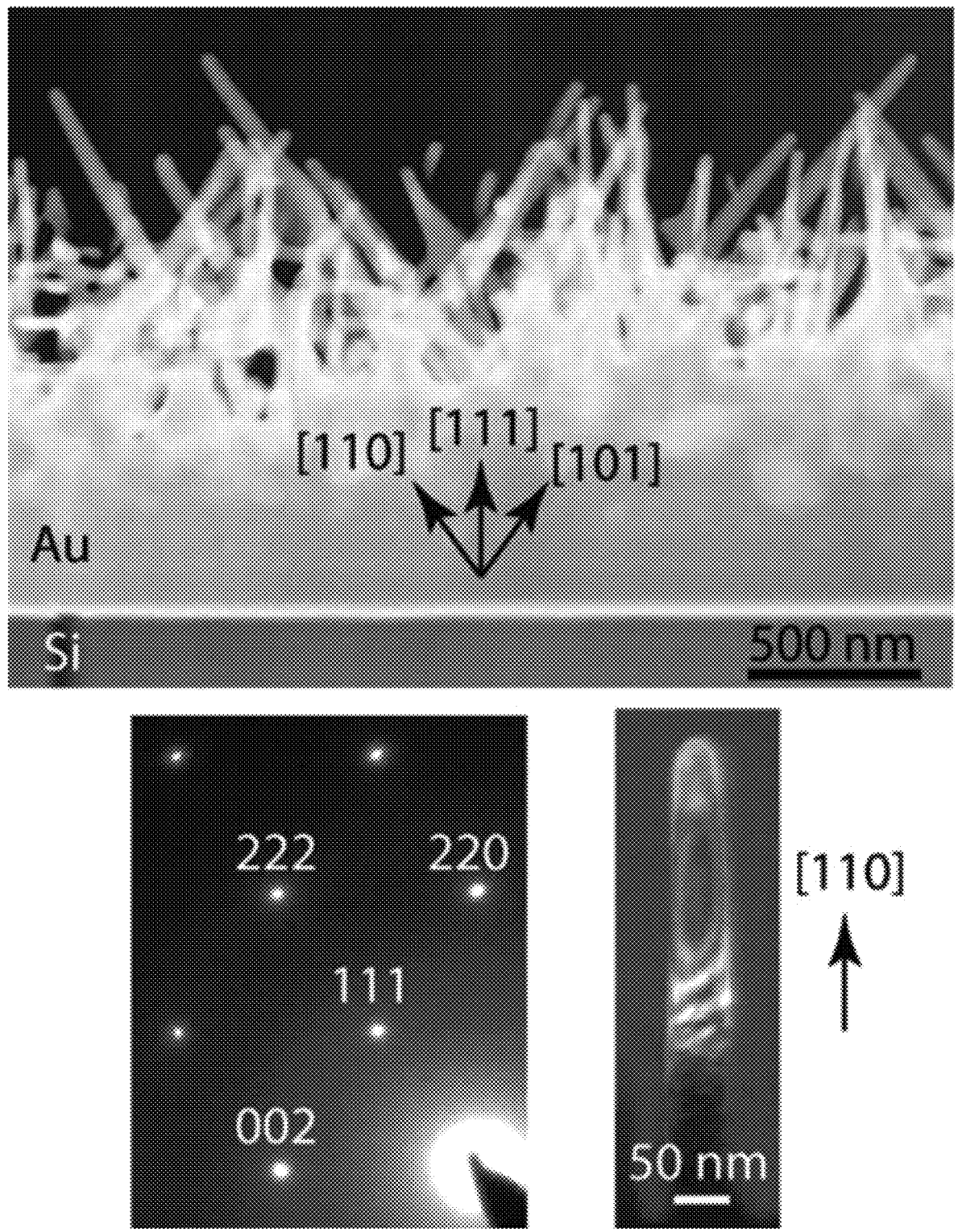
FIG. 47 shows (top panel) a high-angle annular dark field STEM image of gold nanowires. The PVD Au seed layer is textured with {111} planes parallel to the surface of the oxidized Si substrate. Because this texture is preserved in the nanowires and the nanowire axes are parallel to ⟨110⟩ directions, the nanowires are inclined from the substrate surface by ≈54.7°. Bottom left panel shows selected area electron diffraction pattern recorded from a single nanowire in the [1 -1 0] zone-axis orientation. The bottom right panel shows a dark field image of an individual nanowire recorded with the 111-type reflection strongly excited by slight tilting off the [1 -1 0] orientation.

The microstructures of the nanowires were examined using transmission electron microscopy. Dark field imaging and selected area diffraction of wires grown at $-1.0\ V_{SSE}$ for 10 min in electrolyte containing 20 μmol/L $Tl^+$ shows that they are single crystals, with growth axes directed along ⟨110⟩ directions, and free of twin boundaries throughout their length (FIG. 47). The 111 texture of the Au thin film seed layer, typical of vapor deposited fcc metals, is preserved in the nanowire nuclei. This results in the three-fold symmetry evident at shorter growth times (FIG. 46) as well as the ≈35.3° inclination of the wires from the substrate normal (FIG. 47), which value is a maximum viewed in projection given that the substrate film texture does not preclude rotation about the substrate normal.

The single crystal ⟨110⟩ oriented nanowires differ from free standing Au nanowires fabricated using colloidal surfactant-based processes. These include single crystal nanowires that are elongated in the ⟨100⟩ direction and ⟨112⟩ oriented nanowires that contain a (111) twin plane along the growth axis, the latter microstructure also seen with Ag nanowires produced in an electroless process. Gold nanowires that do grow in the ⟨110⟩ direction are 5-fold twinned rather than single crystal as obtained here, although the origins of internal microstructure and nanowire growth direction remain a topic of discussion. That said, ⟨110⟩ growth habits are observed with lower aspect ratio protrusions on branched Au structures such as stars or spikes. Given the branched geometry at the 3-fold rotationally symmetric junctions from which the wires originate this is not unreasonable.

Figure 48:
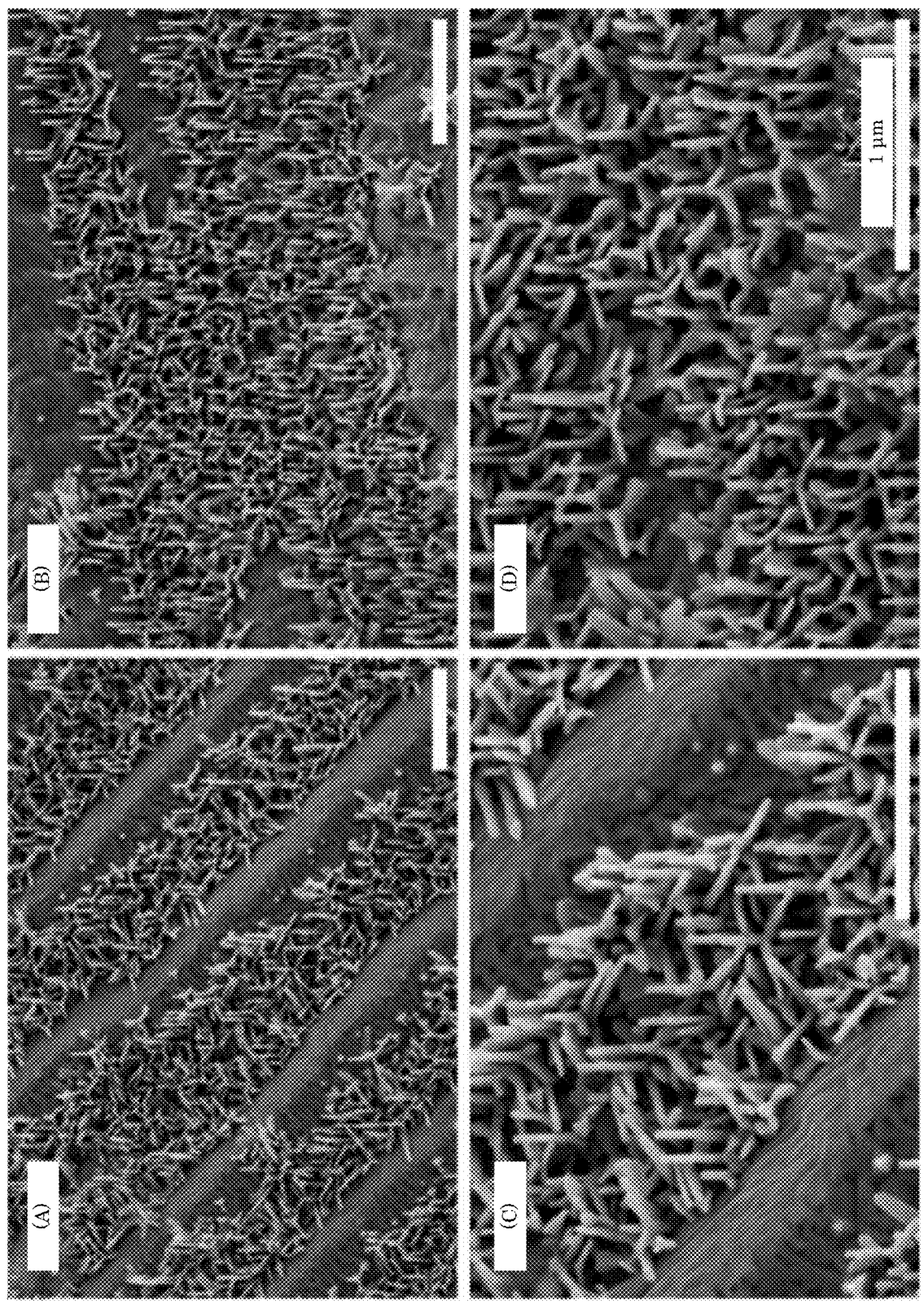
FIG. 48 shows nanowire growth on a freshly solidified Au substrate for (panels a and b) lower magnification views and (panels c and d) corresponding higher magnification views. Deposition for 6 min at $-1.0\ V_{SSE}$ in electrolyte containing 20 μmol/L $Tl^+$. The entire area of each image is contained within a single grain on the Au substrate surface. The nanowires are viewed somewhat off the 3-fold symmetric rotational axis.

The epitaxial growth of the nanowires on the thin film substrate indicates that control of the substrate crystallography should yield uniform nanowire orientations. As shown in FIG. 48, in single crystal domains on a freshly solidified polycrystalline Au substrate the nanowire orientations are indeed restricted to three directions consistent with epitaxy between the nanowire nuclei and the substrate.

Au deposition from the sulfite electrolyte exhibits a range of potential dependent growth morphologies, and additional geometries arise upon inclusion of $Tl^+$ in the electrolyte. Highly faceted, stacking fault-rich, vertically oriented nanowires can be grown in the additive-free Au electrolyte at small overpotentials (i.e., at $-0.9\ V_{SSE}$) according to prior literature; analogous structures are seen here in FIG. 43 (albeit viewed from above). Transitions to lenticular grains and dendrites are observed for deposition at more negative potentials. Surprisingly, deposition at even more negative potentials yields more uniform Au deposition with grains having lateral dimensions approaching the film thickness for the conditions examined.

Addition of $Tl^+$ to the plating electrolyte results in significant depolarization of the electrodeposition reaction. The acceleration of Au deposition at $-0.9\ V_{SSE}$ and positive of it is associated with a dilute coverage of upd Tl species. The impact of $Tl_{ads}$ on the metal deposition reaction at these potentials is captured by the rising chronoamperometric transient; for deposition at $-0.9\ V_{SSE}$ the rise time in the electrolyte with 10 μmol/L $Tl^+$ (FIG. 35b) is 550 s, roughly twice as long as that for the electrolyte with 20 μmol/L $Tl^+$ (FIG. 35c). The dilute surfactant yields surface smoothing via the curvature enhanced accelerator mechanism (CEAC), such smoothing being evident for deposition at $-0.8\ V_{SSE}$ and $-0.9\ V_{SSE}$ on planar regions as well as patterned recessed surface features utilized for Damascene interconnect fabrication (FIG. 43 and FIG. 44).

At more negative potentials the $Tl_{ads}$ changes to an inhibitor of the Au deposition process. In combination, the potential dependent Au deposition kinetics (FIG. 34b and FIG. 37) and Tl upd voltammetry (FIG. 39, FIG. 41) indicate that this transition is coincident with formation of a deposition-blocking, close packed Tl upd layer on the deposit surface. Comparison of the positive-going voltammetric scan for Au deposition (FIG. 34b) with the oxidative conversion of the Tl upd layer to an incommensurate $TlOH_{ads}$ layer (FIG. 39) indicates that this converted phase also hinders the metal deposition reaction. Only excursion to the most positive potentials examined, where $Tl_2O$ is formed and possibly buried by metal deposition, is the accelerating role of dilute Tl coverage re-expressed on the subsequent negative-going sweep (FIG. 34b).

The most interesting finding in the present study is the bifurcation of the electrode into active and passive regions associated with deposition at potentials within the NDR voltammetric regime. On a planar electrode the growth velocity, v, surfactant coverage, θ, relationship exhibits a peak deposition rate just prior to the onset of the NDR. Beyond this coverage the surfactant becomes an inhibitor as indicated schematically in FIG. 33. When operating in this regime with a growth geometry including convex surface segments, such as occurs for deposition in the additive-free electrolyte near the transport limit, morphological instability naturally follows. Specifically, dilation of the local Tl coverage that accompanies an increase in the local surface area accelerates the rate of metal deposition, and the resulting positive feedback reinforces the process. It is proposed in the present case that dendritic growth through side branching that might normally occur is blocked by lateral rejection of accumulating of Tl from the advancing tip region to the newly forming sidewall area as well as adsorption of $Tl^+$ directly from the electrolyte onto those sidewall regions. Propagation of the nanowire is maintained by the more effective dilution of suppressing $Tl^+$ adsorbate on the spherical tip, which has twice the curvature of the cylindrical sidewalls. Nanowire tip growth can thus be viewed as a competition between expanding interfacial area due to Au deposition and anisotropic $Tl^+$ adsorption supported by lateral segregation resulting in formation of the close packed Tl adlayer that inhibits lateral growth. Furthermore, because Au and Tl are immiscible, Tl trapped during Au deposition will phase separate, and for these length scales contribute to the buildup of a close packed Tl layer on the sidewalls. On-going Au deposition at the nanowire tip leads to the development of fresh Au sites that support further deposition of Au and adsorption of $Tl^+$.

Nanowire development at $-1.0$ $V_{SSE}$ begins with a population of ≈130 nuclei/μm² (estimated from FIG. 46), each nucleus giving rise to a maximum of three nanowires. However, after 20 minutes of deposition, the density of nanowires is less than 60 μm⁻² (6×10⁹ cm⁻²) due to impingement and screening effects (FIG. 45 through FIG. 48). As the density was determined from top view SEM images, it most likely represent an upper bound as some of the visible wires are recessed from the surface and no longer actively growing due to metal ion depletion behind the advancing nanowire array. The TEM shows that the gold nanowires, with diameters d≈50 nm, grow in the 110 direction; their modest taper (FIG. 46) indicates much slower deposition on the surrounding sidewalls as the wires lengthen. Chronoamperometry (FIG. 35c) reveals a monotonic increase in current density that after 20 minutes reaches $-1.5$ mA/cm² (normalized to projected area) at both $-1.0$ $V_{SSE}$ and $-1.1$ $V_{SSE}$. FIG. 45 shows the distance between the substrate and growth front of the nanowire deposit achieved at $-1.05$ $V_{SSE}$ in the same 20 min growth period is ≈2.5 μm. They are actually closer to 3 μm in length, accounting for their ≈35° inclination from the surface normal. This corresponds to an average growth rate of 2.5 nm/s. For comparison, using the estimated nanowire density and diameter, the steady state current density on the electroactive area of the growing tips associated with the $-1.5$ mA/cm² (planar area) value is ≈13 mA/cm², equivalent to an instantaneous nanowire growth velocity, $v_{Au}$, of ≈1.4× 10⁻⁶ cm/s or 14 nm/s.

Extension of a nanowire leads to an increase in electrode area, A, associated with the newly created cylindrical sidewalls. Maintenance of the nanowire growth geometry involves passivation of the newly created sidewall by $Tl^+$ accumulation from the electrolyte to form a blocking monolayer. The reasonableness of this mechanism is assessed through comparison of the diffusion limited flux of $Tl^+$ in the electrolyte to the growing Au nanowire tip and the adsorbate coverage required for passivation of the surface area as it is created.

Beyond mass balance, the mechanistic basis for Tl segregation to the sidewalls deserves some discussion. Segregation of the Tl co-deposited with Au via underpotential deposition onto the nanowire surface is supported by the intrinsic immiscibility of Au and Tl. Accelerated growth on the nanowire surface is proposed to occur through dilution of the suppressing Tl coverage by area expansion on the higher (compound) curvature tip. While the positive curvature of the growing tip will also lead to a negative shift of the reversible potential for a given equilibrium surface coverage of Tl, the effect is expected to be small given the (relatively) large 25 nm radius of curvature.

Because the nanowires grow with a fixed orientation, anisotropy of the thermodynamics and kinetics of Tl upd, alloying and surface segregation and the associated impact on $Au(SO_3)_2^{3-}$ reduction necessarily plays a role in shape evolution. Indeed, the substantial suppression of Au deposition evident in the voltammetry and the anisotropic crystallite growth obtained in the Tl-free sulfite electrolyte at less negative potentials (i.e., smaller overpotentials) suggest that the mechanism of nanowire growth by facet-dependent suppression or reaction kinetics applies to this system. Such anisotropy has been previously noted in a study of Tl upd on the three primary low index surface of Au in alkaline electrolyte. As such, the proposed mechanism of sidewall suppression by Tl adsorption has direct analogy in the commonly used "Ag(I) assisted" approach for growth of single crystal ⟨100⟩ oriented nanowires although the $Ag^+$ in that approach is at much higher concentrations (similar to that of the $Au^+$ this study); as with Tl here, Ag upd on the sides of the growing Au nanowires retards deposition on those surfaces. The mechanism by which the $Tl^+$ initiates and maintains the nanowire growth along the ⟨110⟩ growth axes calls for further exploration.

Deposition of Au from a $Na_3Au(SO_3)_2$—$Na_2SO_3$ electrolyte has been studied as a function of potential and $Tl_2SO_4$ additions. Gold deposition from $Au(SO_3)_2^{3-}$ is intrinsically slow at least partly due to $SO_3^{2-}$ adsorption at potentials positive of $-0.8$ $V_{SSE}$. The addition of $Tl^+$ to the base electrolyte results in depolarization of the Au deposition and development of hysteretic voltammetry and an NDR regime. Electroanalytical studies of Tl underpotential and overpotential deposition reveal a close connection between Tl coverage and the resulting morphology of the Au deposits. Electrodeposition in the presence of limited Tl coverage at modest overpotentials for Au deposition, $-0.8$ $V_{SSE}$ and $-0.9$ $V_{SSE}$, is accelerated and exhibits optically bright surfaces consistent with the CEAC mechanism of surface smoothing. Deposition at potentials that lie within the voltammetric NDR region, e.g. $-1.0$ $V_{SSE}$, yields a dense array of high aspect ratio, single crystal gold nanowires with diameters of approximately 50 nm and axes along ⟨110⟩ directions. The nanowires are epitaxially oriented on the {111} textured substrates and grow from 111 oriented nuclei with three-fold symmetry reflecting anisotropic deposition along the ⟨110⟩ directions. The transition from CEAC based compact film growth to nanowire deposition is correlated with, and explained by, the surfactant Tl coverage and its effect on the rate of Au deposition.

Comparative Example D. Superconformal Bottom-Up Gold Deposition in High Aspect Ratio Through Silicon Vias This comparative example provides superconformal, bottom-up Au filling of high aspect ratio through silicon vias (TSVs) along with a predictive framework based on the coupling of suppression breakdown and surface topography. The work extends a previous study of superconformal Au deposition in lower aspect ratio TSVs. Deposition was performed in a $Na_3Au(SO_3)_2$ electrolyte containing a branched polyethyleneimine (PEI) deposition-rate suppressing additive, dissimilar from the superconformal filling composition described in the Detailed Description and Example.

Voltammetric measurements using a rotating disk electrode (RDE) were used to assess the impact of the PEI suppressor concentration and transport on the rate of metal deposition, enabling the interplay between metal deposition and suppressor adsorption to be quantified. The positive feedback associated with suppression breakdown gives rise to an S-shaped negative differential resistance (S-NDR). The derived kinetics for suppressor adsorption and consumption were used in a mass conservation model to account for bottom-up filling of patterned features. Predictions, including the impact of deposition potential and additive concentration on feature filling, are shown to match experimental results for filling of TSVs. This further generalizes the utility of the additive derived S-NDR model as a predictive formalism for identifying additives capable of generating localized, void-free filling of TSVs by electrodeposition.

While Cu is now the dominant metal used for on-chip interconnects, Au is still the metal of choice for contacts to wide bandgap semiconductors. Through-mask plating is widely used for forming these simple Au structures, with deposition proceeding from a common back contact with a layer of patterned photoresist defining the plated area. However, processes that achieve superconformal filling of damascene patterned features, such as those that dominate manufacture of on-chip Cu interconnects from the nanoscale to the microscale, are desirable because of the versatility offered by the Damascene process to build dense 3-D metallization networks of arbitrary complexity. Superconformal Au filling of micrometer size trenches has, in fact, been demonstrated using processes based on the use of a rate suppressing additive guided by the linear theory of leveling as well as the curvature enhanced accelerator coverage (CEAC) mechanism that involves competition between rate suppressing and accelerating additives. More recently, an effort to fill much larger TSVs using an electrolyte that exhibited non-linear S-shaped Negative Differential Resistance (S-NDR) was reported. The system gives rise to distinctive partitioning of the work piece into active and passive regions whence, for 3-D patterned structures, deposition on the free surface is blocked while Au is actively deposited within the recessed features, the transition from passive to active behavior within the filling features being a sensitive function of the process control parameters. Previously, the S-NDR mechanism has been shown to explain extreme bottom-up filling of Cu as well as the sidewall passive-to-active transition in Zn, Co, and Ni, including accurate quantitative prediction. However, no quantitative modeling has been applied to the Au system.

Transport, adsorption, deactivation and surface area change all can impact the coverage of adsorbed additives that more broadly underlie superconformal feature filling. However, S-NDR based models implemented thus far only required the first three effects to accurately predict the temporal and spatial evolution of deposition. The superconformal filling profiles associated with S-NDR systems arise from competition between metal passivation by suppressor adsorption and surface activation through suppressor deactivation. The resulting nonlinear dependence of suppressor coverage on suppressor concentration couples with a gradient of suppressor concentration down filling features to localize deposition at, or toward, the bottoms of filling features. Both the side-wall passive-to-active transition and exclusive bottom-up geometries may be captured by S-NDR models, with critical behavior associated with the suppression breakdown underlying the highly nonlinear dependence of deposition rate on position in all cases. Importantly, such highly localized, sharp transitions cannot be derived from older leveling models based on linear relationships between deposition rates, suppressor coverage and suppressor concentration.

The additive branched polyethyleneimine (PEI) is used as the suppressor; however, in the present case a five-fold larger molecular weight is used. Electroanalytical measurements are used to parameterize an S-NDR model that enables quantitative prediction of the onset geometry of significant Au deposition within TSVs. This understanding is then combined with a programmed potential step wave form to achieve nearly void-free Au filling of the TSVs. Based on previous work with the $Na_3Au(SO_3)_2$-PEI electrolyte system, significant porosity evident in the microstructure can negatively impact the mechanical properties, including crack formation and propagation. Thus, close attention will be given to the impact of PEI on the microstructure of the deposits.

Experimental

Depositions were conducted at room temperature in a cell containing 35 mL of 0.32 mol/L $Na_3Au(SO_3)_2$ electrolyte of pH 9.0. Additive was introduced to the electrolyte from a master solution of 10 mmol/L PEI with a molecular weight of 10,000 g/mol in 18 MΩ·cm water. The electrolyte was sparged with argon between electrochemical measurements to reduce the impact of dissolved oxygen. A $Hg/Hg_2SO_4/$ saturated $K_2SO_4$ reference electrode (SSE) was connected to the working electrode compartment via a fritted salt bridge and all quoted potentials are relative to this electrode. All experiments were conducted without iR compensation. A platinum counter electrode was held in a fritted compartment immersed within the main cell.

Voltammetry was conducted on Au rotating disk electrode (RDE) of 1.0 cm diameter (area 0.78 $cm^2$). The RDE was polished with 1200 grade SiC paper and rinsed with 18 MΩ·cm water prior to each experiment. Voltammetry was performed at 2 mV/s at different RDE rotation rates: 25 rpm, 100 rpm, 400 rpm and 1600 rpm. Currents in electroanalytical measurements are converted to current densities using the projected RDE geometric area. However, as will be seen, the deposit area is generally ill-defined beyond suppression breakdown. Specifically, deposition in the additive-containing electrolyte is not uniform so that the "current density" reported under such circumstance represents a lower bound estimate. Conversely, the measured currents can also be amplified by deposition on asperities that project beyond the boundary layer.

Feature filling was performed using fragments of wafers patterned with ≈56 μm deep TSVs of annular cross-section (courtesy of IBM) having a 1 μm thick Cu seed in the field and a lesser amount on the side walls. To give definition to the metal ion and additive transport, the patterned substrates rotated about one end from a Pt spindle during deposition, like a helicopter blade, the patterned surface facing upwards. Based on the ≈1 cm distance between the features and rotational axis for most of the imaged TSVs, the 100 rpm (200π rad/min) rotation rate corresponds to an estimated 10 cm/s flow rate over the surface. Pre-wetting with ethyl alcohol was used to displace air bubbles that were otherwise trapped in the TSVs during immersion in the electrolyte for Au deposition. Following immersion, the specimens were rotated at open circuit for 2 min prior to starting the metal deposition in order to displace the alcohol from the TSV by mixing with the bulk electrolyte. In most cases a 5 s voltage pulse at −1.5 V was then applied, just prior to feature filling, to improve nucleation on the Cu seeded TSVs.

The TSVs were imaged optically after embedding them in epoxy and then cross-sectioning and polishing them on diamond lapping films down to 0.1 μm grit size using standard techniques and equipment. A subset of specimens was also examined by scanning electron microscopy. These specimens were subjected to an additional cleaning of the surface using oblique 4 keV $Ar^+$ to remove residual surface damage from the mechanical polishing prior to imaging.

Deposition on Planar and Patterned Substrates

Figure 49:
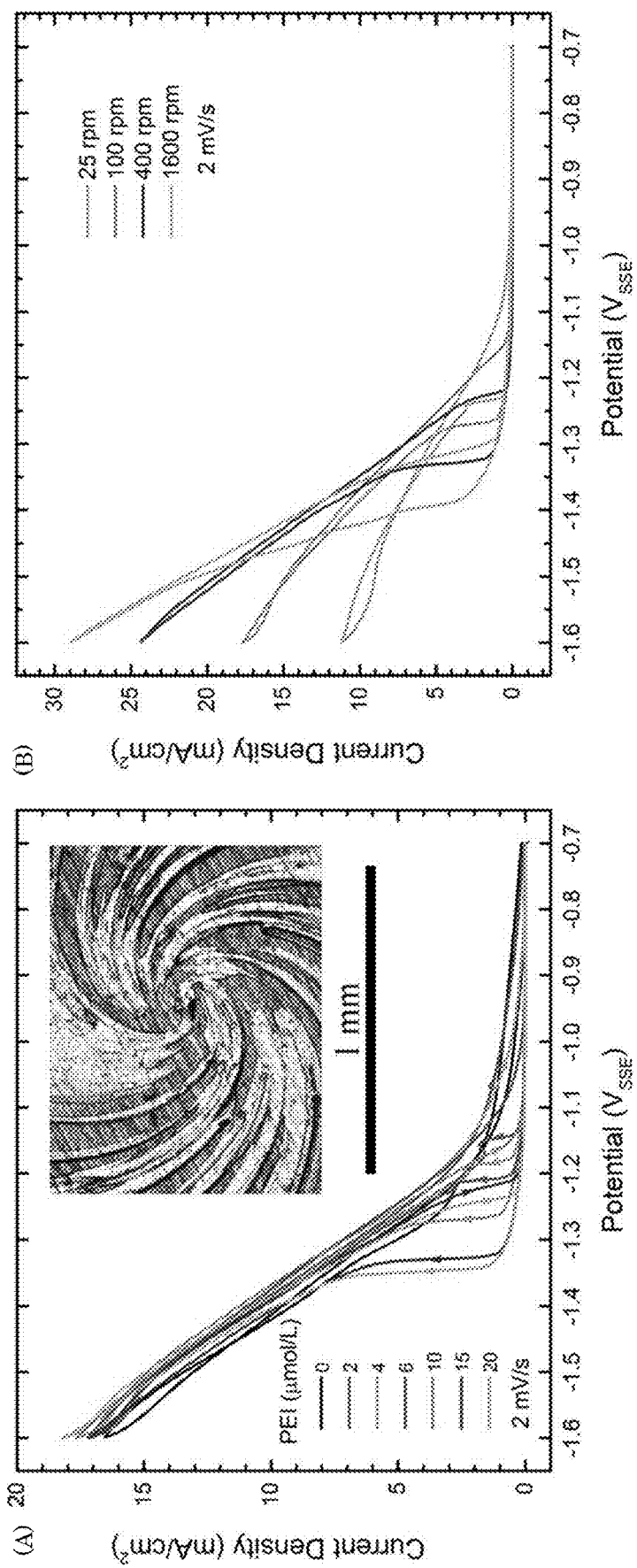
FIG. 49 shows cyclic voltammetry of Au deposition (panel a) in electrolytes containing indicated concentrations of PEI additive with RDE rotation rate 100 rpm (10π/3 rad/s) and (panel b) in electrolyte containing 10 μmol/L PEI at the indicated RDE rotation rates. Acquired currents are converted to current densities using a 0.78 $cm^2$ RDE area. Data were collected without compensation for iR potential drop across the measured cell resistance R, measured values of which ranged between 6Ω and 9Ω, and data were plotted against the applied potential. The insert shows an inhomogeneous deposit swirled on the RDE surface after cycling in electrolyte containing 20 μmol/L PEI for rotation rate of 1600 rpm.

FIG. 49 shows cyclic voltammograms (CVs) that capture the suppression induced by the introduction of the PEI additive as well as the concentration-dependence (FIG. 49a) and the transport-dependence (FIG. 49b) of the potential at which breakdown occurs. Suppression is seen to lift at more negative potentials, the threshold value decreasing with both PEI concentration and RDE rotation rate. Following suppression breakdown, the current-voltage response merges with the response of the additive-free electrolyte. The gradual increase of current in the passive region, i.e. at potentials positive of the suppression breakdown, suggests a leakage process associated with metal deposition and/or some parasitic contribution from water reduction. Deposition currents on the return sweeps remain accelerated to more positive potentials than the suppression breakdown potentials, leading to hysteretic responses. Analogous behavior has been seen for all the previously cited electrolytes exhibiting superconformal metal deposition in TSVs by the S-NDR mechanism. Examination of the electrode surface after cycling reveals a swirl pattern comprised of active and passive regions. For 20 μmol/L PEI the pattern is especially clear at higher rotation rates as shown in the optical micrograph of the RDE center that is inset in FIG. 49a. Similar swirl patterns have been reported in RDE studies of other metal-additive S-NDR systems.

Figure 50:
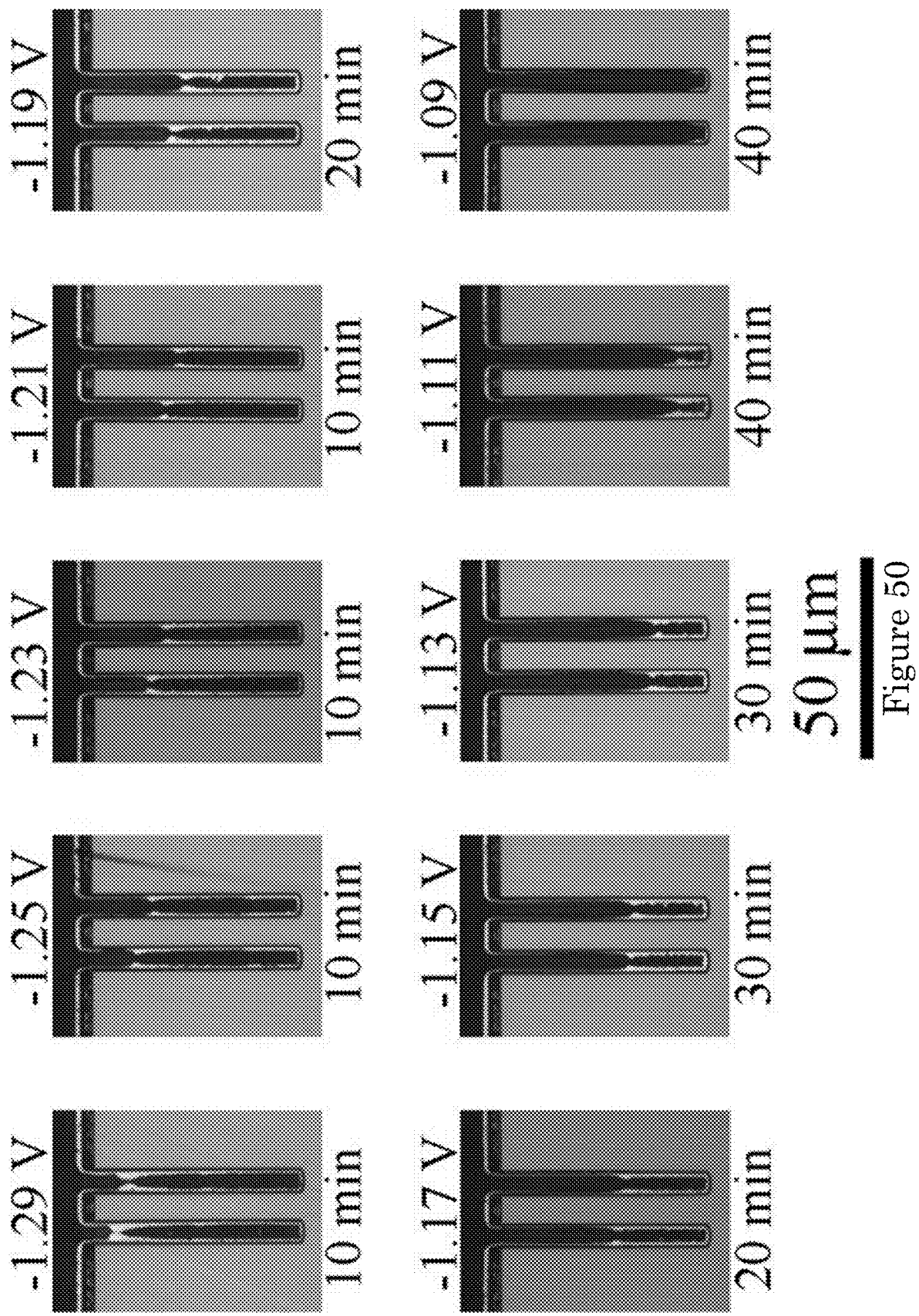
FIG. 50 shows optical images of cross-sectioned annular TSVs after Au deposition in electrolyte containing 20 μmol/L PEI concentrations for the indicated deposition times and applied potentials. Except for the two most negative potentials, the deposits were preceded by a 5 s pulse at $-1.5$ V to improve nucleation on the Cu seeded surface. Patterned substrates were rotated at 100 rpm during deposition.

FIG. 50 shows cross sectioned annular TSV's following Au deposition from a 20 μmol/L PEI-containing electrolyte at the indicated applied potentials. The specified potentials are all positive of the critical potential that defines the hysteretic voltammetric loop for deposition on a planar electrode (FIG. 49). Accordingly, the free surfaces of the TSV patterned work pieces are in the passive state while a transition to active metal deposition is evident within the recessed vias. The transition from the passive state to active deposition expressed as the distance from the field to the location where the maximum Au deposit thickness is first achieved, $d_s$, is seen to increase at more positive potentials. An analogous dependence, as well as an increase of $d_s$ with suppressor concentration, has been detailed with the Ni and Co systems exhibiting suppression breakdown induced S-NDR. Longer deposition times at more positive potentials (see FIG. 50) are necessary to provide visible deposits due to the slower potential activated deposition rate. The figure also implicitly captures the minimal impact of deposition time on the passive distance $d_s$, consistent with behavior observed with the Ni and Co systems from the onset of breakdown all the way to impingement of the deposits on the opposing sidewall.

Figure 51:
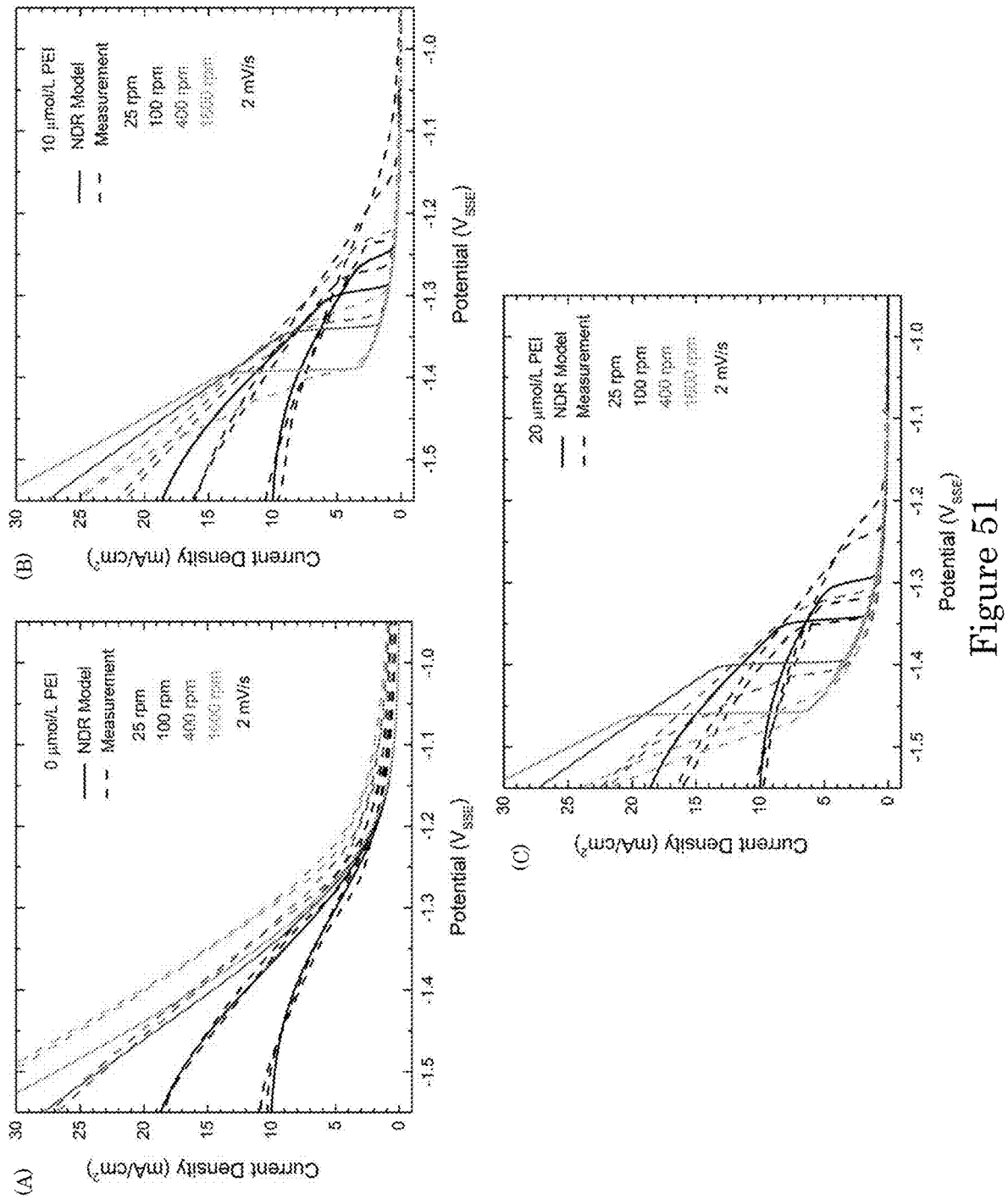
FIG. 51 shows experimental and simulated voltammetry of Au deposition in electrolytes with additive concentrations (panel a) 0 μmol/L PEI, (panel b) 10 μmol/L PEI, and (panel c) 20 μmol/L PEI at indicated RDE rotation rates. Lifting of suppression on the initial negative-going scans in PEI-containing electrolytes occurs at more negative potentials than the reassertion of suppression on the return scans. Experimental currents are converted to current densities using the 0.78 $cm^2$ RDE area. The data were collected without compensation for iR potential drop across the cell resistance R. The simulations account for the associated deviation from the applied 2 mV/s potential scan rate. The graphs show experimental and simulated current density versus applied potential.

Fitted curves are overlaid on the experimental data in FIG. 51a; the CVs. The similar experimental current densities prior to suppression breakdown at the higher PEI concentrations in FIG. 49 suggest that the surfaces in these PEI-containing electrolytes are saturated with PEI prior to the suppression breakdown event.

Parasitic processes such as water reduction that can reduce the current density associated with the metal deposition below the measured current density are taken to be negligible in this system. The values of $j°_{θ=1}$ and $α_{θ=1}$ were therefore obtained directly from the fit to the negative-going sweeps up to the critical potential. The difference of $α_{θ=1}$ from $α_{θ=0}$ is not expected from a simple blocking mechanism. Rather, the change of the charge transfer coefficient from 0.45 to 0.35 between the free and fully suppressed surfaces speaks to a change in the deposition mechanism.

Fitting of the CVs to obtain the remaining kinetic parameters $k_+$ and $k_-$ involves integrating for θ(t) and mass balance between suppressor diffusion across the boundary layer and its adsorption onto the surface. Values for the areal density of sites Γ, suppressor diffusion coefficient $D_s$ and boundary layer thickness δ (scaling with the rotation rate as $ω^{-0.5}$) were estimated. Metal ion depletion across the boundary layer, more significant here than in our recent Ni and Co studies with higher metal ions concentrations, was accounted for by balancing the molar volume weighted ion flux across the boundary layer with the deposition rate. This balance is most relevant when deposition approaches the metal ion transport limit.

Evolution of current density and adsorbate coverage depends on a number of parameters. However, with values for the other parameters either known or otherwise estimated, $k_+$ and $k_-$ were adjusted to capture the dependence of the suppressor breakdown potential on the suppressor flux to the interface, as manifest in the concentration and RDE rotation rate dependences. Significantly, simulations over a wide range of $k_+$ values can exhibit similar suppression breakdown potential if $k_-$ is scaled appropriately. This is clearest for the case of near ideal suppression (i.e., $v_{θ=0} \gg v_{θ=1} \rightarrow 0$) for which the unsaturated steady state suppressor coverage so that $k_+$ and $k_-$ enter explicitly only in the ratio k+k−k+k−. However, the coverage also depends on the suppressor and metal ion concentrations at the electrolyte/metal interface ($C_S$ and $v_{θ=0}$, respectively) and thus the boundary layer thickness. Simultaneous fitting of the suppression breakdown potentials at the four rotation rates therefore further restricts the range of $k_+$ and $k_-$ values.

Fitting of the suppression breakdown observed in the cyclic voltammetry for two different suppressor concentrations and four different rotation rates is shown in FIG. 51b,c. The emphasis was on capturing the suppression breakdown potentials, with no effort to fit the slope of the data at more negative potentials in light of the evolving and unquantified surface area, and thereby current density, associated with active regions of the bifurcating electrode. As the data acquisition was performed without iR compensation, a corresponding −iR potential offset is included in the overlaid simulations. Both the cell resistance and metal ion transport limit have only a modest impact on fitting of the suppression breakdown due to the low currents, well below the transport limit, prior to suppression breakdown. At potentials negative of suppression breakdown, the current densities generally fall below the predicted values, suggesting incomplete activation of the RDE surface (FIG. 49a inset).

TSV Filling Simulations

The distinct breakdown of inhibition in the voltammetric curves reflects the emergence of a two state active-passive system, the critical potential representing the limiting condition for balance between the concentration-dependent rate of suppressor adsorption onto the uniform, planar surface and the potential-dependent rate of adsorbate deactivation. Decrease of the suppressor concentration within recessed features effectively introduces a position-dependent positive shift of the critical potential from that at the free-surface. For experiments of most interest the passive-to-active transition occurs at the location within the feature where the critical potential equals the actual applied potential.

Previous models of Cu bottom-up TSV filling through the additive derived S-NDR mechanism evaluated both the metal ion and the suppressor concentration distributions within the boundary layer and the TSV, capturing experimental observations. These entailed full spatial and temporal analysis or a pseudo steady state, one-dimensional analysis that took advantage of experimental TSV fill times that were substantially longer than diffusional relaxation times. This comparative example, like the earlier Co and Ni studies, uses the pseudo steady state approach, neglecting the impact of the transient and spatial evolution of the actual current distribution. Likewise, although this is a less robust approximation due to the lower metal ion concentration in the present Au electrolyte, metal ion depletion is again neglected in the simulations yielding the location of the passive-to-active transition. The general uniformity of the metal deposited within the TSVs at less negative potentials (FIG. 50) indicates that this is good approximation for the less negative applied potentials in the study. Thus, simple evaluation of the suppressor concentration as a function of distance down the TSV permits the position of the passive-to-active transition within it to be predicted as a function of applied potential (and suppressor concentration) using only the voltammetrically measured critical potential.

Figure 52:
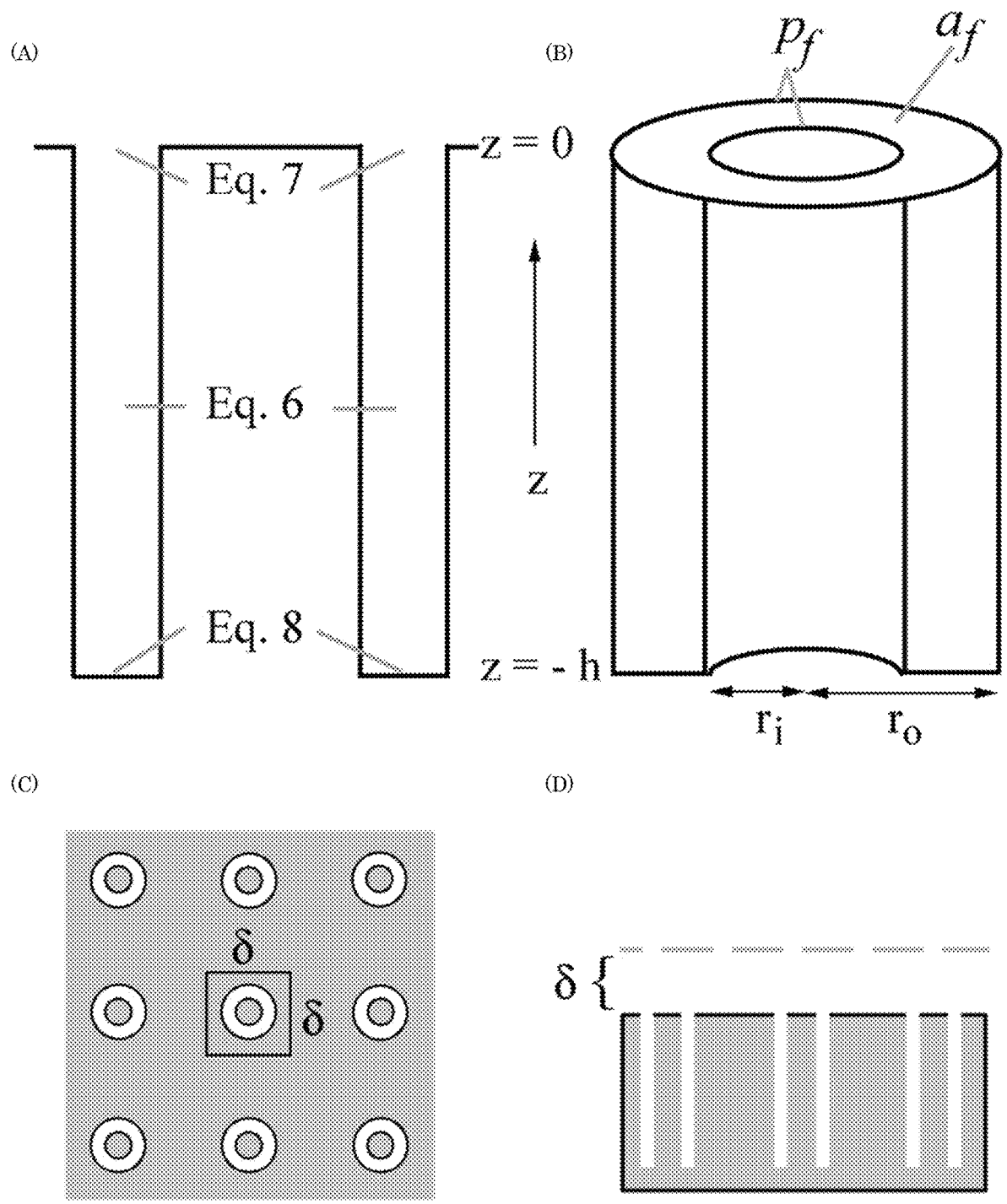
FIG. 52 shows a geometry for modeling Au deposition with annular TSVs: (panel a) cross-section of a TSV showing the domain for the simulations, (panel b) half TSV with full top indicating the inner and outer radii that define the perimeter $p_f$ and open area $a_f$, (panel c) planview of TSV array with area $\delta^2$ supplying suppressor flux to the underlying field and embedded TSV demarcated, and (panel d) cross-section through a row of TSVs with height of the boundary layer indicated.

FIG. 52 shows schematic representations of the geometry utilized in the simulations. Summarizing the relevant equations, for inner radius $r_i$ and outer radius $r_o$ of the annular TSV, mass balance of the divergence of suppressor flux down the cross-sectional area $a_f = \pi(r_o^2 - r_i^2)$ and the rate of suppressor adsorption on the surrounding sidewall perimeter $p_f = 2\pi(r_o + r_i)$ yields z as the distance from the field down the TSV. Equating the flux across the linear gradient of the boundary layer to the sum of adsorption on the field around the TSV and that going down the TSV gives the concentration at the boundary layer-substrate interface equals that at the top of the TSV. For boundary layer thickness $\delta$ that is less than the spacing of the TSVs as in the experiments, the mass balance is invoked over the square area $a_s = \delta^2$ around each TSV.

The differential equation, boundary conditions, suppressor adsorption, and metal deposition interactions permit simulation of deposition profiles using the kinetic parameters obtained from the RDE experiments. Suppressed deposition is predicted in the upper portion of the TSVs with a micrometer scale transition to unsuppressed deposition in the lower portion of the TSV at depth $d_s$ down the TSV that is consistent with experimental observations (and analogous to model predictions detailed previously with Ni and Co filling).

Figure 53:
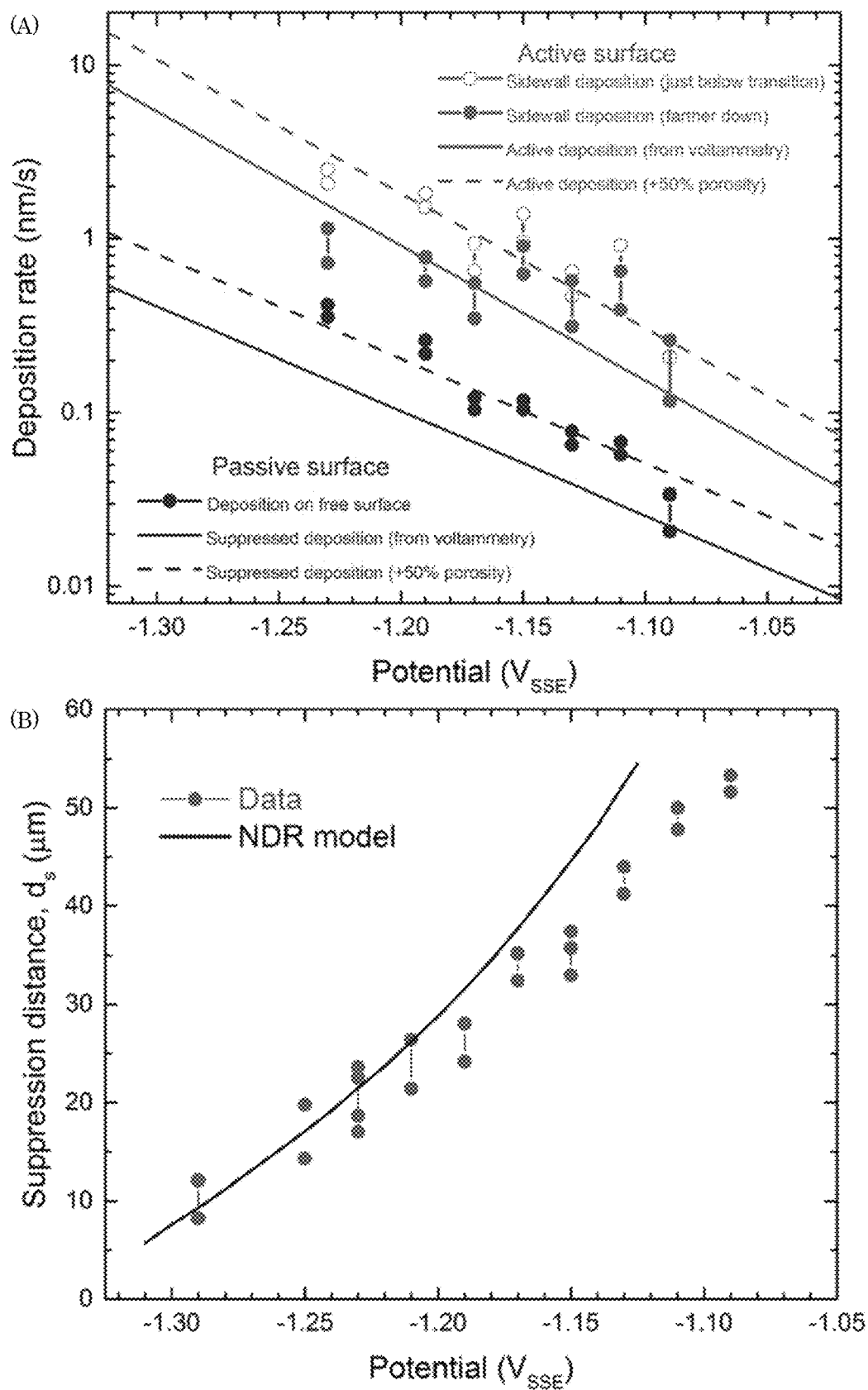
FIG. 53 shows (panel a) passive deposition rate on the field and active deposition rate from deposit thickness just below a passive-to-active transition as well as farther down a TSV. All are nominal rates determined from the deposit thickness and deposition time without consideration of the deposit density. Solid lines are predicted rates based on deposition kinetics obtained from the cyclic voltammetry for a fully dense deposit; dashed lines are rates accounting for the indicated volume fractions of porosity. (panel b) The distance $d_s$ from the field down the TSV to where the maximum deposition rate is achieved. Experimental distances from the field to the depth in the TSV where the maximum deposit thickness is first obtained are plotted versus the applied potential. The bars show maximum and minimum values obtained from all TSVs for each specimen. Predictions are the distance down the TSV to the location where the deposition rate achieves 99% of its unsuppressed value. Simulations are for 20 μmol/L PEI concentration of the filling experiments. Simulations and data are plotted against applied potential.

FIG. 53a compares deposition rates obtained from the specimens shown in FIG. 50 with values predicted using CV-derived kinetics, both as functions of the applied potential. The nominal deposit rate on the passive surface is significantly faster than that predicted from the current density in the voltammetry. However, the data is consistent with predictions assuming 50% volume of incorporated porosity. The thickness of the deposits immediately below the passive-to-active transition indicates deposition faster than that expected from the voltammetry (as seen by favorable comparison to another prediction for 50% porosity). However, just a few micrometers below the bulging deposits (see FIG. 50) that yielded these high rates, thicknesses vary minimally with depth and the measured deposition rates are consistent with expectations.

FIG. 53b compares the experimental and predicted values of the passive-to-active transition depth $d_s$ as functions of the applied potential. The predictions of the simple, 1D, single component model does a good job anticipating the experimental dependence of the transition depth on applied potential. The iR drop across the ≈11Ω cell resistance, based on measured deposition currents on the small patterned substrates, ranges from 2 mV at −1.09 V to less than 7 mV at −1.29 V and is ignored in both figures.

Potential Mediated TSV Filling Processes

Because the applied potential determines the location where suppression fails within the filling feature, metal deposition can be localized toward the bottom of the TSV and run at the transport limit without risk of pinch-off from deposition higher up. As demonstrated previously with Ni and Co, void-free filling can be accomplished by adjusting the applied potential over time in order to progressively actuate deposition higher in the TSV as appropriate for the evolution of filling farther down. As in the ferrous metal studies, both stepped and ramped potentials are examined here.

Figure 54:
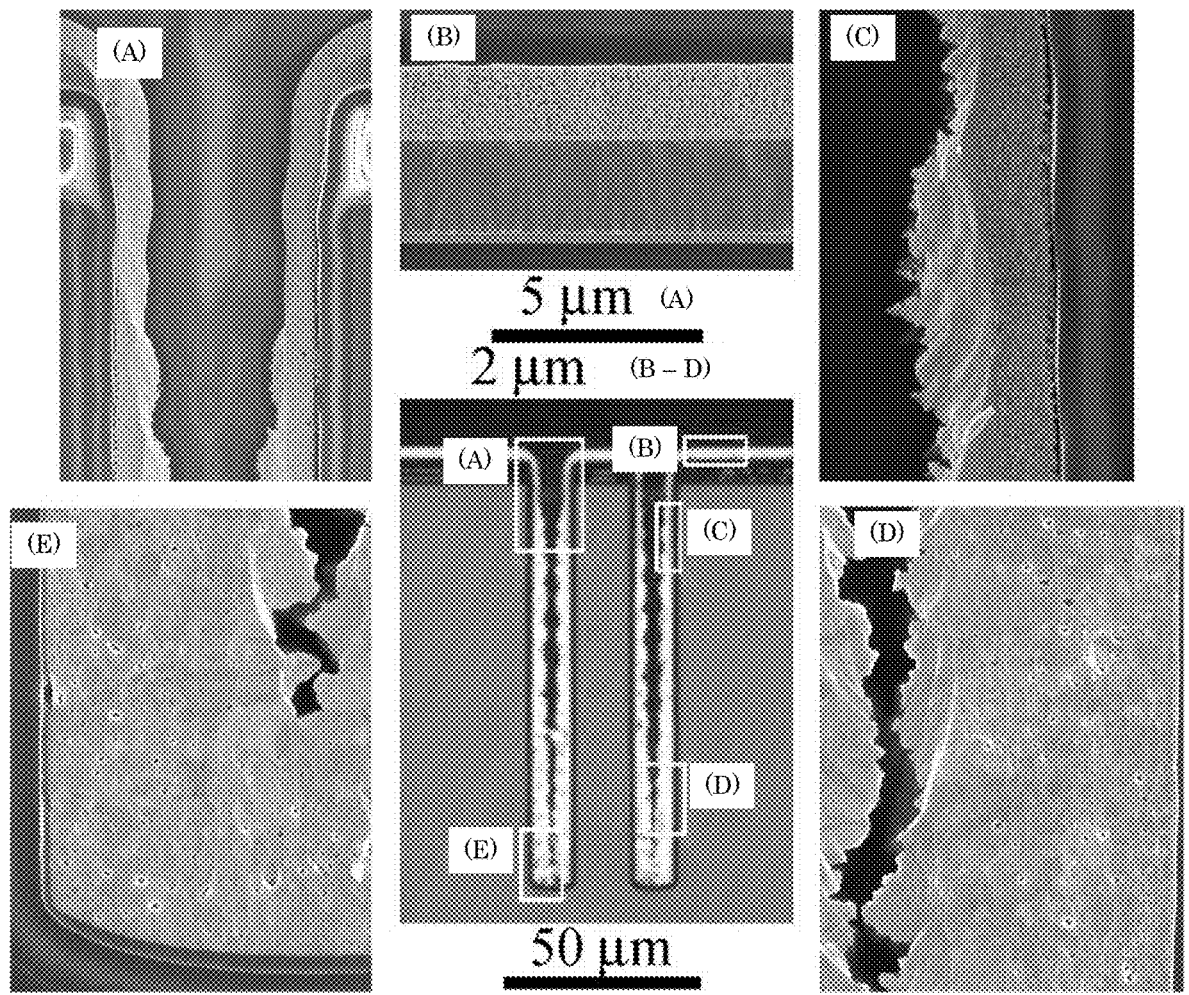
FIG. 54 shows a cross-sectioned annular TSV after Au deposition; the dark spots on the Au in the optical image are diamond particles pulled from the lapping paper by the ductile metal. Deposition was conducted in electrolyte containing 20 μmol/L PEI. The applied potential was stepped in 20 mV increments from −1.09 V to −1.29 V, the deposition times being 10 min at the first three potentials and decreasing by 1 min for each step thereafter to end at −1.31 V for 1 min. Deposition was preceded by a 5 s pulse at −1.5 V to improve nucleation on the Cu seeded surface. Representative regions of the central optical image, its length scale below, were imaged by scanning electron microscope. The length scale above the central image is indexed for these electron micrographs. The patterned substrate was rotating at 100 rpm during deposition.

FIG. 54 shows partial filling obtained using a stepped potential where deposition times were progressively shortened as the potential was stepped to more negative values; deposition currents in feature filling experiments increased with the overpotential but did not exceed 1 mA due to passivation of the field and the small active areas of the vias. While an overall v-shaped profile is evident, the Au deposition differs from that detailed with both Co and Ni in three significant aspects. First, while the surface of the passive deposit is smooth (FIG. 54b), that of the active deposit is quite rough (FIG. 54c). Second, there is an especially pronounced buildup of deposit immediately below the passive-to-active transition (see FIG. 50) that substantially exceeds the thickness only a few micrometers farther down the feature; potential stepping thus yields the observed wavy deposit on the sidewalls. Third, substantial passive deposit on the sidewalls higher in the feature accumulates during sequential filling of the lower regions, similar to that on the field and consistent with the relatively large leakage currents as compared to the active deposition rates (FIG. 49).

These three differences have significant impact on the nature of filling and the deposit itself. The deposit roughness is a source of nanoscale voids within the deposit and where the sidewall deposits impinge (FIG. 54d, e). The waviness serves as a potent source of more substantial voids where impingement of the sidewall deposits occurs. The passive deposit, while not expected to prevent superconformal filling, e.g., through keyhole void entrapment, is highly porous and likely the cause of deposit cracks in the earlier Au TSV filling study. Significantly, analogous porosity and cracking in passive deposits was also detailed in the study of S-NDR Co filling of TSVs. The porosity in both systems suggests suppressor deactivation occurs through incorporation whereby a substantial quantity of organic suppressor is embedded in the slowly growing metal deposit.

Figure 55:
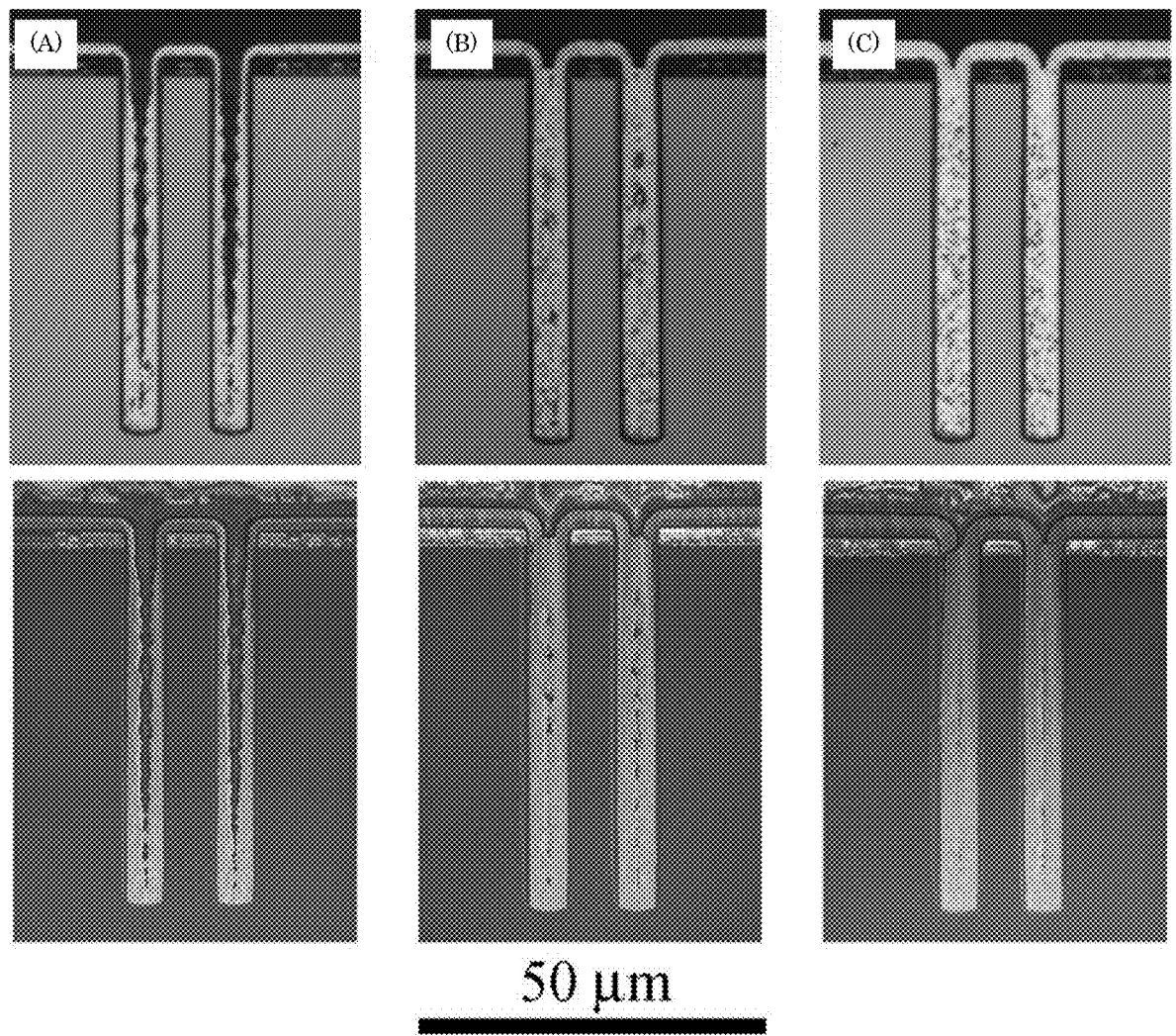
FIG. 55 shows a cross-sectioned annular TSV after Au deposition in electrolyte containing 20 μmol/L PEI concentrations showing superconformal filling for three progressively longer stepped sequences of applied potential. Top row are optical images with the corresponding SEM images shown below. (panel a) Deposition time 75 min total: stepped in 20 mV increments from −1.09 V to −1.31 V with 10 min at each of the first three potentials and decreasing by 1 min at each potential thereafter. (panel b) Deposition time 116 min total: stepped in 20 mV increments from −1.09 V to −1.33 V with 12 min at each of the first seven potentials followed by (10, 8, 5, 4, 3, 2) min at the subsequent potentials. (panel c) Deposition time 161 min total: stepped in 10 mV increments from −1.09 V to −1.33 V with 8 min at each of the first fourteen potentials then 7 min at the next three potentials followed by (5, 4, 3, 2, 1) min each at two sequential potentials. Deposition was preceded by a 5 s pulse at −1.5 V to improve nucleation on the Cu seeded surface. The patterned substrate was rotating at 100 rpm during deposition.

FIG. 55a contrasts the partial filling already shown in FIG. 54 with that obtained using longer deposition times at the potential steps (FIG. 55b). While the TSV is nominally filled in less than 2 hr, voids along the center line are evident.

A more smoothly graded potential step waveform should reduce the incremental region that is activated with each potential step and thus the amplitude and impact of the previously noted undulations of deposit thickness underlying these voids. Indeed, halving the size of the potential steps, as well as using longer deposition time at each step to more fully fill the lower regions prior to activating deposition higher up, yields a center-line seam that can only be seen in the electron microscope (FIG. 55c).

Figure 56:
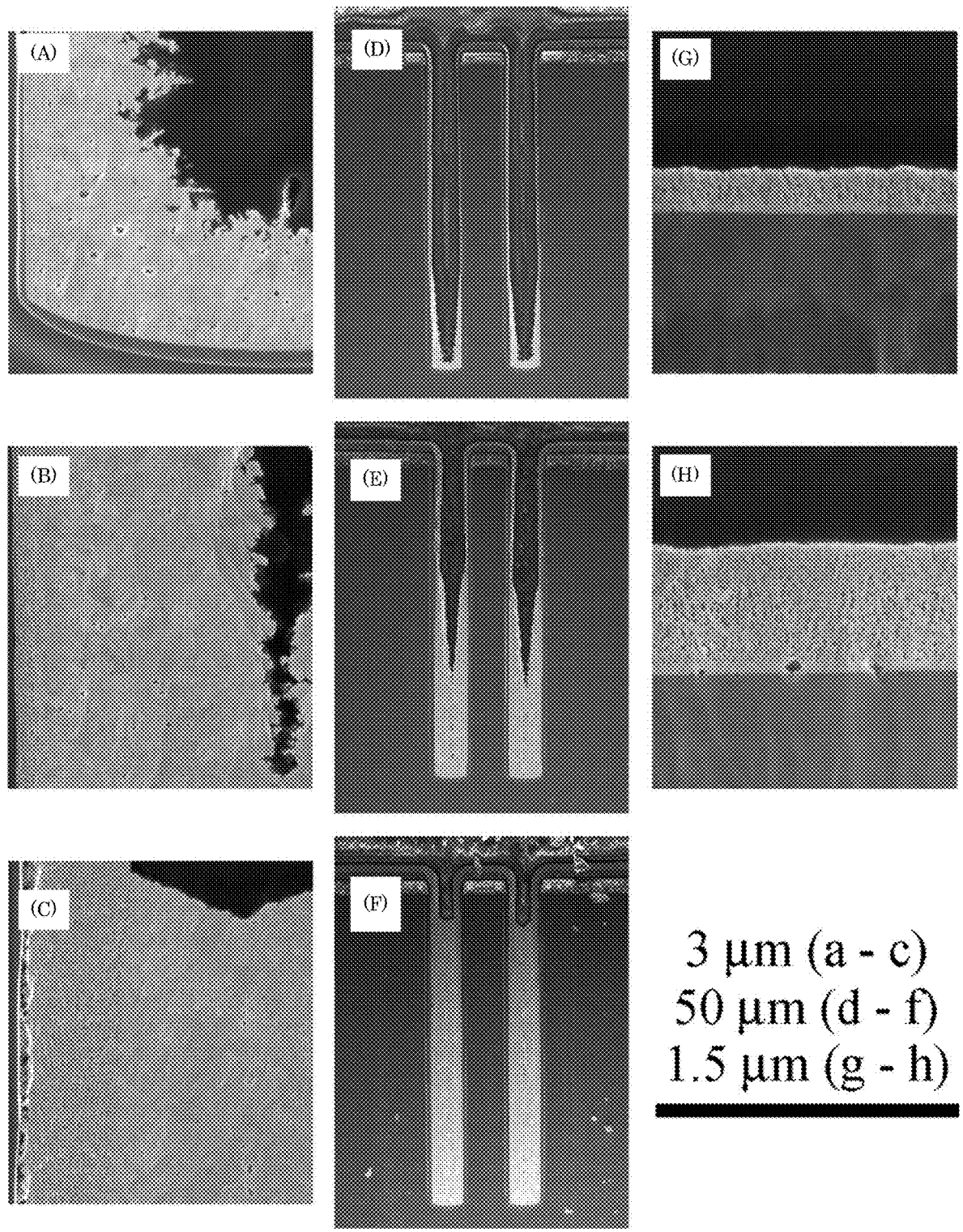
FIG. 56 shows a cross-sectioned annular TSV after Au deposition in electrolyte containing 20 μmol/L PEI concentrations showing the progression of superconformal filling for progressively larger ranges of the ramped applied potential. (panels a, d, g) 50 min total: ramped at 0.02 mV/s from −1.09 V to −1.15 V. (panels b, e, h) 100 min total: ramped at 0.02 mV/s from −1.09 V to −1.21 V. (panels c, f) 127 min total: ramped at 0.02 mV/s from −1.09 V to −1.21 V then at 0.025 mV/s from −1.21 V to −1.25 V. Deposition was preceded by a 5 s pulse at −1.5 V to improve nucleation on the Cu seeded surface. (panels a, b, c) Higher magnification views near the position of the deposit at the via midline. (panels g, h) Passive deposition on the field. The patterned substrate was rotating at 100 rpm during deposition.

FIG. 56 shows the evolution of filling when the applied potential is ramped rather than stepped. The nominally smooth increase of deposit thickness with depth throughout filling (FIG. 56d-f) eliminates the large voids seen along the center line in FIG. 55. The higher magnification images in FIG. 56a-c show micrometer size grains in the regions filled by active deposition, with only a small fraction of nanoscale porosity incorporated during growth due to the dendritic deposit surface. A well-defined layer of darker, highly porous material is evident adjacent to the sidewalls in FIG. 56b,c. The images capture the sharply defined interface between this passive deposit and the overlying active deposit, as well as its increasing thickness toward the TSV top. The passive deposit manifests the significant leakage current (FIG. 49), its variation with position and deposition time reflecting the increasingly long period of (passive) deposition the farther the deposit has moved up from the TSV bottom. Images of the free surface at yet higher magnification in FIG. 56g-h highlight the highly porous passive deposit without overlying active deposits.

The superconformal Au deposition in the PEI-containing sulfite electrolyte shows localized deposition exhibiting a passive-to-active transition within the TSVs. Unsuppressed "active" metal deposition starts at a distance down the filling feature that is defined by the suppressor concentration and applied potential, metal deposition associated with a slower leakage through the suppressor layer occurring at the slower "passive" rate above this location. The geometry is analogous to that previously noted during Au deposition in lower aspect ratio square TSVs as well as Ni and Co deposition in similar annular TSVs, all using a smaller molecular weight version of the PEI suppressor. The S-NDR model previously applied to both the Ni and Co systems once again provides reasonably accurate prediction of the position of the passive-to-active transition as a function of the applied potential. Also as previously demonstrated with those systems, waveforms that progressively move the active region further up the feature enable filling of the TSVs without the keyhole voids that would otherwise result from metal ion depletion effects. It is expected that filling times can be reduced below those shown for both the stepped and ramped cases by further optimization of the waveforms.

Regarding the quality of the Au deposits, growth in the neat sulfite electrolyte is generally rough and dendritic. While potential control of the passive-to-active transition associated with the S-NDR mechanism of superconformal filling prevents pinch-off and macroscale void formation, the intrinsically rough active deposits in the essentially suppressor-free lower portion of the TSV do incorporate nanoscale porosity. Furthermore, as seen previously with the Co S-NDR filling system, the material deposited on passivated surfaces is highly porous. The not insignificant passive deposition rate in the PEI-containing electrolyte yields a significant thickness of porous Au on the sidewalls higher in the TSV. Nonetheless, this work further demonstrates the broad applicability of superconformal S-NDR based feature filling processes, the power of S-NDR based models for predicting the feature filling evolution based on electroanalytical measurements that can be used to assess systems for improved feature filling and deposit quality.

Superconformal Au deposition in annular TSVs has been experimentally demonstrated and predicted using a simple S-NDR model. These results extend previously demonstrated superconformal deposition in the PEI-containing sulfite electrolyte to higher aspect ratio features and demonstrate that the filling can be quantitatively predicted using kinetics acquired from simple electroanalytical measurements using a rotating disk electrode. The cyclic voltammetry, was used to assess the impact of PEI concentration and transport on the suppression breakdown potential. The results were analyzed to obtain kinetics used in an S-NDR based model to simulate superconformal Au deposition in the annular TSVs. The model predicts the experimentally observed passive-to-active transition within the TSVs, including its location as a function of both suppressor concentration and applied potential. Void-free feature filling, not possible for fixed potential deposition, was achieved using potential waveforms that take advantage of the potential-dependent suppression depth and geometric leveling to produce superconformal filling. These results, combined with previously detailed superconformal Cu, Zn, Ni and Au filling of TSVs, demonstrate the broad applicability of the S-NDR based mechanism for superconformal feature filling and S-NDR based models for prediction of feature filling.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. A process for superconformally filling a recessed feature of an article with gold, the process comprising:
   providing the article comprising:
      a substrate;
      a field disposed on the substrate;
      the recessed feature disposed on the substrate and surrounded by the field, the recessed feature comprising:
         a bottom member;
         a sidewall that separates the bottom member from the field,
         the recessed feature having an aspect ratio of a depth to a width from 0.5 to 100 before superconformally filling the recessed feature, the aspect ratio decreasing during superconformally filling the recessed feature; and
      an overlayer disposed on the article such that the field and the recessed feature are fully metallized for contact with a superconformal filling composition;
   contacting the field and the recessed feature with the superconformal filling composition in an absence of cyanide and lead, the superconformal filling composition having a near-neutral pH and comprising:
      a plurality of $Au(SO_3)_2^{3-}$ anions as a source of gold for superconformally depositing gold in the recessed feature;
      a plurality of $SO_3^{2-}$ anions; and
      a plurality of $Bi^{3+}$ cations as a brightener and an accelerator for superconformally depositing gold in the recessed feature;
   convectively transporting the $Au(SO_3)_2^{3-}$ anions and the $Bi^{3+}$ cations to the bottom member by actively moving the substrate relative to the superconformal filling composition;
   subjecting the field and the recessed feature to an electrical current to superconformally deposit gold from the $Au(SO_3)_2^{3-}$ anions on the bottom member relative to the sidewall and the field, the electrical current providing a cathodic voltage ($V_{SSE}$) from –0.66 V to –1.00 V relative to a saturated sulfate electrode (SSE), and a first deposition ratio of a first deposition rate of gold on the bottom member relative to a second deposition rate of gold on the sidewall being from 1.5 to $10^6$; and
   increasing the electrical current subjected to the field and the recessed feature to maintain the $V_{SSE}$ from –0.66 V to –1.00 V relative to the SSE during superconformally depositing gold on the substrate to superconformally fill the recessed feature of the article with gold as a superconformal filling comprising gold, the superconformal filling being void-free and seam-free,
   such that in a presence of the superconformal filling composition: passivation of the field and the recessed feature occurs at the $V_{SSE}$ greater than –0.65 V relative to the SSE, sub-conformal deposition of gold occurs at the $V_{SSE}$ less than –1 V relative to the SSE, and superconformal deposition of gold occurs at the $V_{SSE}$ from –0.66 V to –1.00 V relative to the SSE.

2. The process of claim 1, further comprising changing the $V_{SSE}$ from a first potential to a more negative potential during superconformally depositing gold.

3. The process of claim 1, further comprising catalyzing superconformal deposition of gold with underpotential deposited Bi from the $Bi^{3+}$ cations.

4. The process of claim 1, wherein actively moving the substrate relative to the superconformal filling composition comprising rotating the substrate at a rotation rate from 25 revolutions per minute (rpm) to 2000 rpm.

5. The process of claim 4, further comprising changing the rotation rate from a first rotation rate to a second rotation rate during superconformally depositing gold.

6. The process of claim 1, further comprising:
   maintaining the VSSE from –0.66 V to –1.00 V relative to the SSE until the recessed feature is partially filled with the aspect ratio being less than or equal to 0.5; and
   thereafter changing a deposition condition to fill the recessed feature sub-conformally, conformally, or a combination comprising at least one of the foregoing non-superconformal filling regimes.

7. The process of claim 1, wherein the $V_{SSE}$ is maintained from –0.66 V to –1.00 V relative to the SSE until the recessed feature is completely filled with the superconformal filling.

8. The process of claim 1, wherein the $Au(SO_3)_2^{3-}$ anions are present in the superconformal filling composition in an amount from 50 millimolar (mM) to 350 mM.

9. The process of claim 1, wherein the $SO_3^{2-}$ anions are present in the superconformal filling composition in an amount from 0.1 molar (M) to 1 M.

10. The process of claim 1, wherein $Bi^{3+}$ cations are present in the superconformal filling composition in an amount from 1 micromolar (mmM) to 50 mmM.

11. The process of claim 1, wherein contacting the field and the recessed feature with the superconformal filling composition occurs in an absence of thallium.

12. The process of claim 1, wherein contacting the field and the recessed feature with the superconformal filling composition occurs in an absence of a suppressor.

13. The process of claim 1, wherein the superconformal filling composition consists essentially of the $Au(SO_3)_2^{3-}$ anions, the $SO_3^{2-}$ anions, the $Bi^{3+}$ cations, and an additive in an aqueous liquid in an absence of a suppressor.

14. The process of claim 1, wherein the near-neutral pH of the superconformal filling composition is from 6.5 to 10.

15. The process of claim 1, wherein the superconformal filling is crystalline.

16. The process of claim 1, wherein the superconformal filling is nonporous.

17. The process of claim 1, wherein the superconformal filling further comprises cobalt, and the superconformal filling is a cobalt-gold alloy.

18. The process of claim 13, wherein the cobalt-gold alloy is a single phase.

19. The process of claim 1, wherein the superconformal filling is shiny and planar at an exposed surface of the superconformal filling on a submicron level, a brightness of the superconformal filling occurring in an absence of dendrites on the exposed surface.

20. The process of claim 1, wherein a second deposition ratio of the first deposition rate of gold on the bottom member relative to a third deposition rate of gold on the field is from 1.5 to $10^6$.

21. The process of claim 1, wherein superconformally filling the recessed feature is bottom-up filling.

22. The process of claim 17, wherein the field is passivated during bottom-up filling.

23. The process of claim 1, wherein the bottom-up filling is uniform over the entire bottom member.

24. The process of claim 1, wherein a deposition ratio of a thickness of gold deposited on the field to a thickness of gold deposited on the bottom member is from 1:20 to 1:50.

25. The process of claim 1, wherein depositing the gold on the field and the recessed feature automatically stops before completely filling the recessed feature with gold while the $V_{SSE}$ is from −0.66 V to −1.00 V relative to the SSE.

26. The process of claim 1, wherein the recessed feature comprises a trench, a via, a contact hole, or a combination comprising at least one of the foregoing recessed features.

27. The process of claim 1, wherein the overlayer comprises a gold seed crystal.

* * * * *